(12) United States Patent
Wang et al.

(10) Patent No.: US 12,248,197 B2
(45) Date of Patent: Mar. 11, 2025

(54) GLASSES

(71) Applicant: SHENZHEN SHOKZ CO., LTD., Guangdong (CN)

(72) Inventors: Yueqiang Wang, Shenzhen (CN); Haofeng Zhang, Shenzhen (CN); Yongjian Li, Shenzhen (CN); Yunbin Chen, Shenzhen (CN); Fen You, Shenzhen (CN); Lei Zhang, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 801 days.

(21) Appl. No.: 17/172,059

(22) Filed: Feb. 9, 2021

(65) Prior Publication Data
US 2021/0173232 A1 Jun. 10, 2021

Related U.S. Application Data

(63) Continuation of application No. PCT/CN2019/102390, filed on Aug. 24, 2019.

(30) Foreign Application Priority Data

Aug. 24, 2018 (CN) .......................... 201810975515.1
Jan. 5, 2019 (CN) .......................... 201910009904.3
Jan. 5, 2019 (CN) .......................... 201920031804.6

(51) Int. Cl.
*G02C 11/00* (2006.01)
*G02C 5/14* (2006.01)
(Continued)

(52) U.S. Cl.
CPC ................ *G02C 11/10* (2013.01); *G02C 5/14* (2013.01); *G02C 5/143* (2013.01); *G02C 5/22* (2013.01);
(Continued)

(58) Field of Classification Search
CPC .......... G02C 5/14; G02C 5/001; G02C 5/008; G02C 5/2281; G02C 5/22; G02C 5/2254;
(Continued)

(56) References Cited

U.S. PATENT DOCUMENTS 4,712,244 A    12/1987   Zwicker et al.
4,902,120 A    2/1990   Weyer
(Continued)

FOREIGN PATENT DOCUMENTS

CN         2639920 Y      9/2004
CN       102141688 A      8/2011
(Continued)

OTHER PUBLICATIONS

Decision of Patent Grant in Korean Application No. 10-2021-7008592 mailed on Mar. 27, 2023, 4 pages.
(Continued)

*Primary Examiner* — Travis S Fissel
(74) *Attorney, Agent, or Firm* — METIS IP LLC

(57) ABSTRACT

The present disclosure provides glasses including: a glasses rim; a glasses temple comprising a control circuit or a battery; a rotating shaft configured to connect the glasses rim and the glasses temple, so that the glasses rim and the glasses temple are able to relatively rotate around the rotating shaft, the rotating shaft being disposed with a rotating shaft wiring channel along an axial direction; a connection wire passing through the rotating shaft wiring channel and extending to the glasses rim and the glasses temple, respectively; a speaker comprising an earphone core and being connected to the glasses temple, the control circuit or the battery driving the earphone core to vibrate to generate a sound through the connection wire; and at least two microphones disposed in
(Continued)

the glasses temple or the speaker, the at least two microphones being located at positions with different distances from a mouth of a user.

20 Claims, 22 Drawing Sheets

(51) Int. Cl.
| | |
|---|---|
| G02C 5/22 | (2006.01) |
| G02C 11/06 | (2006.01) |
| H04R 1/02 | (2006.01) |
| H04R 1/04 | (2006.01) |
| H04R 1/06 | (2006.01) |
| H04R 1/10 | (2006.01) |
| H04R 1/28 | (2006.01) |
| H04R 9/02 | (2006.01) |
| H04R 9/06 | (2006.01) |
| H04R 25/00 | (2006.01) |
| H05K 1/02 | (2006.01) |
| H05K 1/18 | (2006.01) |

(52) U.S. Cl.
CPC ............ *G02C 5/2254* (2013.01); *G02C 11/06* (2013.01); *H04R 1/02* (2013.01); *H04R 1/028* (2013.01); *H04R 1/04* (2013.01); *H04R 1/06* (2013.01); *H04R 1/10* (2013.01); *H04R 1/1008* (2013.01); *H04R 1/1033* (2013.01); *H04R 1/1041* (2013.01); *H04R 1/1075* (2013.01); *H04R 1/1083* (2013.01); *H04R 1/28* (2013.01); *H04R 9/02* (2013.01); *H04R 9/025* (2013.01); *H04R 9/06* (2013.01); *H04R 25/65* (2013.01); *H05K 1/028* (2013.01); *H05K 1/189* (2013.01); *H04R 2460/13* (2013.01); *H05K 2201/05* (2013.01)

(58) Field of Classification Search
CPC ........ G02C 5/143; G02C 11/10; G02C 11/06; H04R 1/1066; H04R 1/2884; H04R 1/02; H04R 1/1058; H04R 1/028; H04R 1/04; H04R 1/06; H04R 1/10; H04R 1/1008; H04R 1/1033; H04R 1/1041; H04R 1/1075; H04R 1/1083; H04R 1/28; H04R 1/105; H04R 9/02; H04R 9/025; H04R 9/06; H04R 9/066; H04R 25/65; H04R 2460/13; H04R 2201/107; H05K 1/028; H05K 1/189; H05K 2201/05
USPC ........... 351/41, 111, 112, 117, 120, 178, 158
See application file for complete search history.

(56) References Cited

U.S. PATENT DOCUMENTS

| | | | |
|---|---|---|---|
| 5,606,743 A | 2/1997 | Vogt et al. | |
| 6,010,216 A | 1/2000 | Jesiek | |
| 6,163,926 A * | 12/2000 | Watanabe | G02C 5/22 |
| | | | 351/153 |
| 6,456,720 B1 * | 9/2002 | Brimhall | H04R 25/658 |
| | | | 381/322 |
| 7,289,767 B2 | 10/2007 | Lai | |
| 7,527,374 B2 | 5/2009 | Chou | |
| 10,699,691 B1 * | 6/2020 | Ye | G10K 11/17881 |
| 2002/0159023 A1 * | 10/2002 | Swab | H04W 4/80 |
| | | | 351/158 |
| 2003/0048911 A1 * | 3/2003 | Furst | H04R 11/00 |
| | | | 381/96 |
| 2005/0128431 A1 | 6/2005 | Jannard et al. | |
| 2006/0093178 A1 | 5/2006 | Chen | |
| 2008/0013041 A1 | 1/2008 | Chou | |
| 2008/0074609 A1 | 3/2008 | Ifergan | |
| 2009/0290730 A1 | 11/2009 | Fukuda et al. | |
| 2011/0200204 A1 | 8/2011 | Horigome et al. | |
| 2014/0253867 A1 | 9/2014 | Jiang et al. | |
| 2015/0199950 A1 | 7/2015 | Heiman et al. | |
| 2015/0257662 A1 | 9/2015 | Lee et al. | |
| 2015/0319546 A1 * | 11/2015 | Sprague | H04R 1/1066 |
| | | | 381/312 |
| 2016/0234613 A1 | 8/2016 | Westerkull | |
| 2016/0246076 A1 | 8/2016 | Wei | |
| 2017/0090201 A1 | 3/2017 | Guo | |
| 2020/0336824 A1 | 10/2020 | Zheng et al. | |
| 2020/0344542 A1 | 10/2020 | Liu et al. | |

FOREIGN PATENT DOCUMENTS

| | | |
|---|---|---|
| CN | 201984240 U | 9/2011 |
| CN | 102523546 A | 6/2012 |
| CN | 202306037 U | 7/2012 |
| CN | 202364340 U | 8/2012 |
| CN | 203786416 U | 8/2014 |
| CN | 204374548 U | 6/2015 |
| CN | 105007551 A | 10/2015 |
| CN | 204887455 U | 12/2015 |
| CN | 205103503 U | 3/2016 |
| CN | 205301727 U | 6/2016 |
| CN | 205720956 U | 11/2016 |
| CN | 205793159 U | 12/2016 |
| CN | 205793173 U | 12/2016 |
| CN | 205961389 U | 2/2017 |
| CN | 205987287 U | 2/2017 |
| CN | 206061075 U | 3/2017 |
| CN | 206292473 U | 6/2017 |
| CN | 106937221 A | 7/2017 |
| CN | 106954150 A | 7/2017 |
| CN | 106954151 A | 7/2017 |
| CN | 106954153 A | 7/2017 |
| CN | 106974645 A | 7/2017 |
| CN | 206365029 U | 7/2017 |
| CN | 106997107 A | 8/2017 |
| CN | 206387972 U | 8/2017 |
| CN | 206421112 U | 8/2017 |
| CN | 206563855 U | 10/2017 |
| CN | 206640748 U | 11/2017 |
| CN | 206920741 U | 1/2018 |
| CN | 107942536 A | 4/2018 |
| CN | 107948881 A | 4/2018 |
| CN | 207266241 U | 4/2018 |
| CN | 207424414 U | 5/2018 |
| CN | 207443120 U | 6/2018 |
| CN | 108391188 A | 8/2018 |
| CN | 207718105 U | 8/2018 |
| CN | 207720370 U | 8/2018 |
| CN | 108600920 A | 9/2018 |
| CN | 108776393 A | 11/2018 |
| CN | 108845436 A | 11/2018 |
| CN | 108873372 A | 11/2018 |
| CN | 208079380 U | 11/2018 |
| CN | 109061902 A | 12/2018 |
| CN | 109495809 A | 3/2019 |
| CN | 208780924 U | 4/2019 |
| CN | 208780925 U | 4/2019 |
| CN | 208780926 U | 4/2019 |
| CN | 208780932 U | 4/2019 |
| CN | 208847977 U | 5/2019 |
| CN | 208847981 U | 5/2019 |
| CN | 110022516 A | 7/2019 |
| CN | 209184747 U | 7/2019 |
| CN | 209267805 U | 8/2019 |
| CN | 209358728 U | 9/2019 |
| EP | 2214418 A2 | 8/2010 |
| EP | 1828833 B1 | 8/2015 |
| EP | 3062144 A1 | 8/2016 |
| JP | S59161928 A | 9/1984 |
| JP | 2006157318 A | 6/2006 |
| RU | 172082 U1 | 6/2017 |
| WO | 9623373 A1 | 8/1996 |
| WO | 2006023341 A2 | 3/2006 |
| WO | 2006055884 A2 | 5/2006 |

(56) References Cited

FOREIGN PATENT DOCUMENTS

| WO | 2007070508 A2 | 6/2007 |
|----|---------------|--------|
| WO | 2007133055 A1 | 11/2007 |
| WO | 2015115693 A1 | 8/2015 |

OTHER PUBLICATIONS

Partial Supplementary European Search Report in European Application No. 19852948.9 mailed on Oct. 12, 2021, 11 pages.
First Office Action in Russian Application No. 2021107605 mailed on Aug. 23, 2021, 13 pages.
First Examination Report in Indian Application No. 202117007769 mailed on Aug. 13, 2021, 5 pages.
The Extended European Search Report in European Application No. 19852948.9 mailed on Feb. 11, 2022, 12 pages.
Notice of Reasons for Rejection in Japanese Application No. 2021534422 mailed on May 16, 2022, 9 pages.
International Search Report in PCT/CN2019/102394 mailed on Nov. 28, 2019, 8 pages.
International Search Report in PCT/CN2019/102377 mailed on Dec. 3, 2019, 8 pages.
International Search Report in PCT/CN2019/102378 mailed on Nov. 6, 2019, 7 pages.
International Search Report in PCT/CN2019/102385 mailed on Nov. 18, 2019, 6 pages.
International Search Report in PCT/CN2019/102389 mailed on Nov. 28, 2019, 8 pages.
International Search Report in PCT/CN2019/102396 mailed on Nov. 27, 2019, 8 pages.
International Search Report in PCT/CN2019/102395 mailed on Nov. 27, 2019, 9 pages.
International Search Report in PCT/CN2019/102406 mailed on Nov. 26, 2019, 7 pages.
International Search Report in PCT/CN2019/102407 mailed on Nov. 8, 2019, 6 pages.
International Search Report in PCT/CN2019/102408 mailed on Nov. 6, 2019, 6 pages.
International Search Report in PCT/CN2019/102398 mailed on Oct. 31, 2019, 6 pages.
International Search Report in PCT/CN2019/102386 mailed on Nov. 25, 2019, 7 pages.
International Search Report in PCT/CN2019/102390 mailed on Nov. 22, 2019, 8 pages.
International Search Report in PCT/CN2019/102391 mailed on Nov. 22, 2019, 8 pages.
Written Opinion in PCT/CN2019/102391 mailed on Nov. 22, 2019, 12 pages.
Written Opinion in PCT/CN2019/102390 mailed on Nov. 22, 2019, 10 pages.
Written Opinion in PCT/CN2019/102396 mailed on Nov. 27, 2019, 10 pages.
Written Opinion in PCT/CN2019/102377 mailed on Dec. 3, 2019, 9 pages.
Written Opinion in PCT/CN2019/102378 mailed on Nov. 6, 2019, 13 pages.
Written Opinion in PCT/CN2019/102385 mailed on Nov. 18, 2019, 11 pages.
Written Opinion in PCT/CN2019/102389 mailed on Nov. 28, 2019, 9 pages.
Written Opinion in PCT/CN2019/102395 mailed on Nov. 27, 2019, 10 pages.
Written Opinion in PCT/CN2019/102394 mailed on Nov. 28, 2019, 9 pages.
Written Opinion in PCT/CN2019/102406 mailed on Nov. 26, 2019, 12 pages.
Written Opinion in PCT/CN2019/102407 mailed on Nov. 8, 2019, 10 pages.
Written Opinion in PCT/CN2019/102408 mailed on Nov. 6, 2019, 12 pages.
Written Opinion in PCT/CN2019/102398 mailed on Oct. 31, 2019, 9 pages.
Written Opinion in PCT/CN2019/102386 mailed on Nov. 25, 2019, 12 pages.

\* cited by examiner

GLASSES

CROSS-REFERENCE TO RELATED APPLICATION

This application is a Continuation of International Application No. PCT/CN2019/102390 filed on Aug. 24, 2019, which claims priority of Chinese Patent Application No. 201810975515.1 filed on Aug. 24, 2018, Chinese Patent Application No. 201910009904.3 filed on Jan. 5, 2019, and Chinese Patent Application No. 201920031804.6 filed on Jan. 5, 2019, the contents of each of which are hereby incorporated by reference in its entirety.

TECHNICAL FIELD

The present disclosure relates to the field of glasses, and more specifically relates to glasses having a speaker.

BACKGROUND

With the development of speaker technology, electronic products (e.g., earphones, MP3, etc.) have been widely used. Speakers may have different product forms. For example, a speaker may be integrated on glasses (e.g., sunglasses, swimming glasses, etc.) or fixed inside or close to an ear of a user through a special structure (e.g., an ear hook). As the functions of the products become more diverse, there may be more and more modules and wires inside the speaker, and the wiring may be more and more complicated. The complicated wiring may occupy an internal space of the product greatly, and an unreasonable wiring distribution may cause wires to affect each other, which may lead to an abnormal sound and affect the sound quality of the speaker. Therefore, it may be necessary to provide a more efficient wiring technology, so as to simplify the wiring of the speaker and improve the sound quality of the speaker.

SUMMARY

An embodiment of the present specification may provide a pair of glasses. The glasses may include a glasses rim; a glasses temple, the glasses temple accommodating a control circuit or a battery; a shaft assembly, the shaft assembly being configured to connect the glasses rim and the glasses temple, so that the glasses rim and the glasses temple are able to relatively rotate around the shaft assembly, and the shaft assembly is disposed with a shaft wiring channel along an axial direction; a connection wire, the connection wire passing through the shaft wiring channel and extending to the glasses rim and the glasses temple, respectively; a speaker, the speaker comprising an earphone core, the speaker being connected to the glasses temple, the control circuit or the battery in the glasses temple driving the earphone core to vibrate to generate a sound through the connection wire; and at least two microphones, the at least two microphones being arranged in the glasses temple or the speaker, and the at least two microphones being located at positions with different distances from a mouth of a user.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures, and wherein.

DETAILED DESCRIPTION

Figure 1:
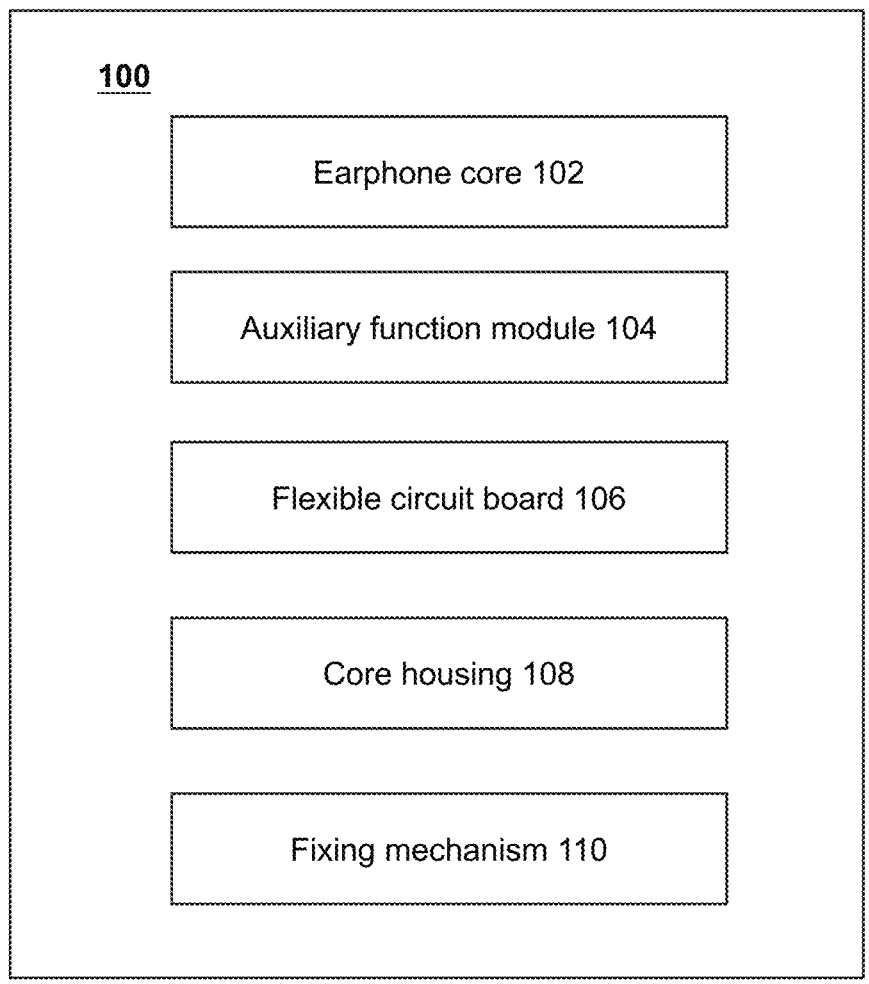
FIG. 1 is a block diagram illustrating a structure of a speaker according to some embodiments of the present disclosure.

In the following detailed description, numerous specific details are set forth by way of examples in order to provide a thorough understanding of the relevant disclosure. Obviously, drawings described below are only some examples or embodiments of the present disclosure. Those skilled in the art, without further creative efforts, may apply the present disclosure to other similar scenarios according to these drawings. It should be understood that the purposes of these illustrated embodiments are only provided to those skilled in the art to practice the application, and not intended to limit the scope of the present disclosure. Unless obviously obtained from the context or the context illustrates otherwise, the same numeral in the drawings refers to the same structure or operation.

As used in the disclosure and the appended claims, the singular forms "a," "an," and "the" may include plural referents unless the content clearly dictates otherwise. In general, the terms "comprise" and "include" merely prompt to include steps and elements that have been clearly identified, and these steps and elements do not constitute an exclusive listing. The methods or devices may also include other steps or elements. The term "based on" is "based at least in part on." The term "one embodiment" means "at least one embodiment;" the term "another embodiment" means "at least one other embodiment." Related definitions of other terms will be given in the description below. In the following, without loss of generality, the "glasses" or "sunglasses" described in the present disclosure means "glasses" or "sunglasses" with a speaker. For those skilled in the art, "glasses" or "sunglasses" may also be replaced with other similar words, such as "eye protection device," "eye wearable device," or the like. "Speaker" may also be replaced with other similar words, such as "loud speaker device," "hearing aid," "player," "playing device," or the like. For those skilled in the art, after understanding the basic principles of glasses, it may be possible to make various modifications and changes in the form and details of the specific methods and operations of implementing glasses without departing from the principles. In particular, an environmental sound collection and processing function may be added to the glasses to enable the glasses to implement the function of a hearing aid. For example, a microphone may collect environmental sounds of a user/wearer, process the sounds using an algorithm and transmit the processed sound (or generated electrical signal) to a speaker of glasses. That is, the glasses may be modified to include the function of collecting the environmental sounds, and after a signal processing, the sound may be transmitted to the user/wearer via the speaker, thereby implementing the function of the hearing aid. As an example, the algorithm mentioned herein may include noise cancellation, automatic gain control, acoustic feedback suppression, wide dynamic range compression, active environment recognition, active noise reduction, directional processing, tinnitus processing, multi-channel wide dynamic range compression, active howling suppression, volume control, or the like, or any combination thereof.

FIG. 1 is a block diagram illustrating a structure of a speaker according to some embodiments of the present disclosure.

A speaker 100 may at least include an earphone core 102, an auxiliary function module 104, and a flexible circuit board 106.

In some embodiments, the earphone core 102 may receive electrical audio signal(s) and convert the audio signal(s) into the sound signal(s). The flexible circuit board 106 may facilitate electrical connection(s) between different modules/components. For example, the flexible circuit board 106 may facilitate an electrical connection between the earphone core 102 and an external control circuit and an electrical connection between the earphone core 102 and the auxiliary function module 104.

In some embodiments, the earphone core 102 may at least include a magnetic circuit component, a vibration component, and a bracket that accommodates the magnetic circuit component and the vibration component. The magnetic circuit component may be used to provide a magnetic field. The vibration component may be used to convert an electrical signal input to the vibration component into a mechanical vibration signal so as to generate a sound. In some embodiments, the vibration component may include at least a coil and an inner lead. In some embodiments, the earphone core 102 may also include an external wire. The external wire may be capable of transmitting an audio current to the coil in the vibration component. One end of the external wire may be connected to the inner lead of the earphone core, and the other end may be connected to the flexible circuit board of the speaker. In some embodiments, the bracket may have a wiring groove. The external wire and/or the inner lead may be partially disposed of the wiring groove described in detail in other parts of the present disclosure.

In some embodiments, the auxiliary function module 104 may be used to receive auxiliary signal(s) and perform auxiliary function(s). The auxiliary function module 104 may be a module different from the earphone core and may be used for receiving the auxiliary signal(s) and performing the auxiliary function(s). In the present disclosure, the conversion of the audio signal into the sound signal may be considered as a main function of the speaker 100, and other functions different from the main function may be considered as the auxiliary function(s) of the speaker 100. For example, the auxiliary function(s) of the speaker 100 may include receiving a user sound and/or an ambient sound through a microphone, controlling a broadcasting process of the sound signal through a key, or the like, and a corresponding auxiliary function module may include a microphone, a key switch, etc., which may be set according to actual needs. The auxiliary signal(s) may be electric signal(s) related to the auxiliary function(s), optical signal(s) related to the auxiliary function(s), acoustic signal(s) related to the auxiliary function(s), vibration signal(s) related to the auxiliary function(s), or the like, or any combination thereof.

The speaker 100 may further include a core housing 108 for accommodating the earphone core 102, the auxiliary function module 104, and the flexible circuit board 106. When the speaker 100 is a bone conduction earphone, an inner wall of the core housing 108 may be directly or indirectly connected to the vibration component in the earphone core. When the user wears the bone conduction earphone, an outer wall of the core housing 108 may be in contact with the user and transmit the mechanical vibration of the vibration component to an auditory nerve through a bone, so that the human body may hear the sound. In some embodiments, the speaker may include the earphone core 102, the auxiliary function module 104, the flexible circuit board 106, and the core housing 108.

In some embodiments, the flexible circuit board 106 may be a flexible printed circuit board (FPC) accommodated in the inner space of the core housing 108. The flexible circuit board 106 may have high flexibility and be adapted to the inner space of the core housing 108. Specifically, in some embodiments, the flexible circuit board 106 may include a first board and a second board. The flexible circuit board 106 may be bent at the first board and the second board so as to adapt to a position of the flexible circuit board in the core housing 108, or the like. More details may refer to descriptions in other parts of the present disclosure.

In some embodiments, the speaker 100 may transmit the sound through a bone conduction approach. An outer surface of the core housing 108 may have a fitting surface. The fitting surface may be an outer surface of the speaker 100 in contact with the human body when the user wears the speaker 100. The speaker 100 may compress the fitting surface against a preset area (e.g., a front end of a tragus, a position of a skull, or a back surface of an auricle), thereby effectively transmitting the vibration signal(s) to the auditory nerve of the user through the bone and improving the sound quality of the speaker 100. In some embodiments, the fitting surface may be abutted on the back surface of the auricle. The mechanical vibration signal(s) may be transmitted from the earphone core to the core housing and transmitted to the back of the auricle through the fitting surface of the core housing. The vibration signal(s) may then be transmitted to the auditory nerve by the bone near the back of the auricle. In this case, the bone near the back of the auricle may be closer to the auditory nerve, which may have a better conduction effect and improve the efficiency of transmitting the sound to the auditory nerve by the speaker 100.

In some embodiments, the speaker 100 may further include a fixing mechanism 110. The fixing mechanism 110 may be externally connected to the core housing 108 and used to support and maintain the position of the core housing 108. In some embodiments, a battery assembly and a control circuit may be disposed in the fixing mechanism 110. The battery assembly may provide electric energy to any electronic component in the speaker 100. The control circuit may control any function component in the speaker 100. The function component may include, but be not limited to, the earphone core, the auxiliary function module, or the like. The control circuit may be connected to the battery and other functional components through the flexible circuit board or the wire.

In some embodiments, the fixing mechanism 110 may be a glasses rim, a hat, a headgear, other headwear accessories, or the like, or any combination thereof. For example, the fixing mechanism 110 may be a glasses rim. A cavity may be formed inside the glasses rim. The cavity may accommodate the battery assembly, the flexible circuit board, and the control circuit. In this case, the earphone core 102 may be located at the end of the glasses temple, which may be located near the ear and provide the sound signal(s) when the user wears the glasses.

Figure 2:
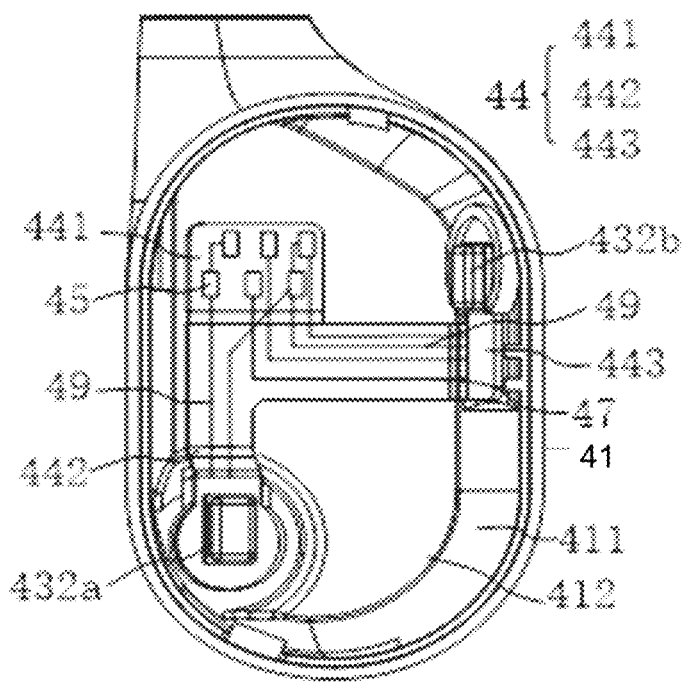
FIG. 2 is a schematic diagram illustrating a structure of a flexible circuit board according to some embodiments of the present disclosure.

FIG. 2 is a schematic diagram illustrating a structure of a flexible circuit board located inside a core housing according to some embodiments of the present disclosure.

Figure 3:
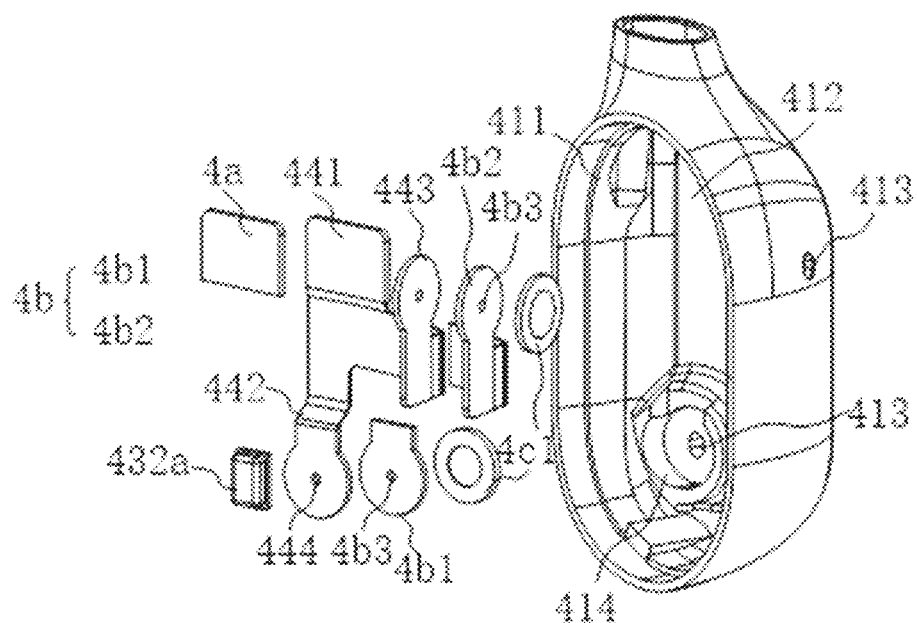
FIG. 3 is an exploded diagram illustrating a partial structure of a speaker according to some embodiments of the present disclosure.

In some embodiments, the flexible circuit board may be disposed with a number of pads. Different signal wires (e.g., audio signal wires, auxiliary signal wires) may be electrically connected to different pads through different flexible leads to avoid numerous and complicated internal wires issues, which may occur when both audio signal wires and auxiliary signal wires need to be connected to the earphone core or the auxiliary function module. FIG. 3 is an exploded diagram illustrating a partial structure of a speaker according to some embodiments of the present disclosure. As shown in FIGS. 2 and 3, a flexible circuit board 44 may at least include a number of first pads 45 and a number of second pads (not shown in the figures). In some embodiments, the flexible circuit board 44 in FIG. 2 may correspond to the flexible circuit board 106 in FIG. 1. At least one of the first pads 45 may be electrically connected to auxiliary function module(s). The at least one of the first pads 45 may be electrically connected to at least one of the second pads through a first flexible lead 47 on the flexible circuit board 44. The at least one of the second pads may be electrically connected to an earphone core (not shown in the figures) through external wire(s) (not shown in the figures). At least another one of the first pads 45 may be electrically connected to auxiliary signal wire(s). The at least another one of first pads 45 and the auxiliary function module(s) may be electrically connected through a second flexible lead 49 on the flexible circuit board 44. In the embodiment, the at least one of the first pads 45 may be electrically connected to the auxiliary function module(s). The at least one of the second pads may be electrically connected to the earphone core through the external wire(s). The one of the at least one of the first pads 45 may be electrically connected to one of the at least one of the second pads through the first flexible lead 47, so that the external audio signal wire(s) and the auxiliary signal wire(s) may be electrically connected to the earphone core and the auxiliary function modules at the same time through the flexible circuit board, which may simplify a layout of the wiring.

In some embodiments, the audio signal wire(s) may be wire(s) electrically connected to the earphone core and transmitting audio signal(s) to the earphone core. The auxiliary signal wire(s) may be wire(s) electrically connected to the auxiliary function modules and performing signal transmission with the auxiliary function modules.

In some embodiments, referring to FIG. 2, specifically, the flexible circuit board 44 may be disposed with the number of pads 45 and two pads (not shown in the figure). The two pads and the number of pads 45 may be located on the same side of the flexible circuit board 44 and spaced apart. The two pads may be connected to two corresponding pads 45 of the number of pads 45 through the flexible lead(s) 47 on the flexible circuit board 44. Further, a core housing 41 may also accommodate two external wires. One end of each of the external wires may be welded to the corresponding pad, and the other end may be connected to the earphone core, so that the earphone core may be connected to the pads through the external wires. The auxiliary function modules may be mounted on the flexible circuit board 44 and connected to other pads of the number of pads 45 through the flexible lead(s) 49 on the flexible circuit board 44.

In some embodiments, wires may be disposed in the fixing mechanism 110 of the speaker 100. The wires may at least include the audio signal wire(s) and the auxiliary signal wire(s). In some embodiments, there may be multiple wires in the fixing mechanism 110. Such wires may include at least two audio signal wires and at least two auxiliary signal wires. For example, the fixing mechanism 110 may be a glasses rim. The glasses rim may be connected to the core housing 41, and the wires may be wires disposed in the glasses rim. One end of each of the wires in the glasses rim may be welded to a control circuit board, and the other end of the wire may enter the core housing 41 and be welded to the pad 45 on the flexible circuit board 44.

As used herein, one end of each of the two audio signal wires of the wires in the glasses rim, which may be located in the core housing 41, may be welded to the two pads 45 by two flexible leads 47, and the other end may be directly or indirectly connected to the control circuit board. The two pads 45 may be further connected to the earphone core through the welding of the flexible lead(s) 49 and the two pad 46 and the welding of the two external wires and the pads, thereby transmitting the audio signal(s) to the earphone core.

One end of each of at least two auxiliary signal wires in the core housing 41 may be welded to the pad 45 by the flexible lead(s) 49, and the other end may be directly or indirectly connected to the control circuit board so as to transmit the auxiliary signal(s) received and transformed by the auxiliary function module(s) to the control circuit (not shown in the figure).

In the approach described above, the flexible circuit board 44 may be disposed in the core housing 41, and the corresponding pads may be further disposed on the flexible circuit board 44. Therefore, the wires (not shown in the figure) may enter the core housing 41 and be welded to the corresponding pads, and further connected to the corresponding auxiliary function module(s) through the flexible leads 47 and the flexible leads 49 on the pads, thereby avoiding a number of wires directly connected to the auxiliary function module(s) to make the wiring in the core housing 41 complicated. Therefore, the arrangement of the wirings may be optimized, and the space occupied by the core housing 41 may be saved. In addition, when a number of wires in the glasses rim are directly connected to the auxiliary function module(s), a middle portion of the wires in the glasses rim may be suspended in the core housing 41 to easily cause vibration, thereby resulting in abnormal sounds to affect the sound quality of the earphone core. According to the approach, the wires in the glasses rim may be welded to the flexible circuit board 44 and further connected to the corresponding auxiliary function module(s), which may reduce a situation that the wires are suspended from affecting the quality of the earphone core, thereby improving the sound quality of the earphone core to a certain extent.

In some embodiments, the flexible circuit board (also referred to as the flexible circuit board 44) may be further divided. The flexible circuit board may be divided into at least two regions. One auxiliary function module may be disposed on one of the at least two regions, so that at least two auxiliary function modules may be disposed on the flexible circuit board. Wiring between the audio signal wire(s) and the auxiliary signal wire(s) and the at least two auxiliary function modules may be implemented through the flexible circuit board. In some embodiments, the flexible circuit board may at least include a main circuit board and a first branch circuit board. The first branch circuit board may be connected to the main circuit board and extend away from the main circuit board along one end of the main circuit board. The auxiliary function module(s) may include at least a first auxiliary function module and a second auxiliary function module. The first auxiliary function module may be disposed on the main circuit board, and the second auxiliary function module may be disposed on the first branch circuit board. The number of first pads may be disposed on the main circuit board, and the second pads may be disposed on the first branch circuit board. In some embodiments, the first auxiliary function module may be a key switch. The key switch may be disposed on the main circuit board, and the first pads may be disposed corresponding to the key switch. The second auxiliary function module may be a microphone. The microphone may be disposed on the first branch circuit board, and the second pads corresponding to the microphone may be disposed on the first branch circuit board. The first pads corresponding to the key switch on the main circuit board may be connected to the second pads corresponding to the microphone on the first branch circuit board through the second flexible lead(s). The key switch may be electrically connected to the microphone, so that the key switch may control or operate the microphone.

In some embodiments, the flexible circuit board may further include a second branch circuit board. The second branch circuit board may be connected to the main circuit board. The second branch circuit board may extend away from the main circuit board along the other end of the main circuit board and be spaced from the first branch circuit board. The auxiliary function module(s) may further include a third auxiliary function module. The third auxiliary function module may be disposed on the second branch circuit board. The number of first pads may be disposed on the main circuit board. At least one of the second pads may be disposed on the first branch circuit board, and the other second pads may be disposed on the second branch circuit. In some embodiments, the third auxiliary function module may be a second microphone. The second branch circuit board may extend perpendicular to the main circuit board. The second microphone may be mounted on the end of the second branch circuit board away from the main circuit board. The number of pads may be disposed at the end of the main circuit board away from the second branch circuit board.

Specifically, as shown in FIG. 2 and FIG. 3, the second auxiliary function module may be the first microphone 432a. The third auxiliary function module may be the second microphone 432b. As used herein, the first microphone 432a and the second microphone 432b may both be MEMS (micro-electromechanical system) microphone 432, which may have a small working current, relatively stable performance, and high voice quality. The two microphones 432 may be disposed at different positions of the flexible circuit board 44 according to actual needs.

As used herein, the flexible circuit board 44 may include a main circuit board 441 (or referred to the main circuit board), and a branch circuit board 442 (or referred to the first branch circuit board) and a branch circuit board 443 (or referred to the second branch circuit board) connected to the main circuit board 441. The branch circuit board 442 may extend in the same direction as the main circuit board 441. The first microphone 432a may be mounted on one end of the branch circuit board 442 away from the main circuit board 441. The branch circuit board 443 may extend perpendicular to the main circuit board 441. The second microphone 432b may be mounted on one end of the branch circuit board 443 away from the main circuit board 441. A number of pads 45 may be disposed on the end of the main circuit board 441 away from the branch circuit board 442 and the branch circuit board 443.

In one embodiment, the core housing 41 may include a peripheral side wall 411 and a bottom end wall 412 connected to one end surface of the peripheral side wall 411, so as to form an accommodation space with an open end. As used herein, an earphone core may be disposed in the accommodation space through the open end. The first microphone 432a may be fixed on the bottom end wall 412. The second microphone 432b may be fixed on the peripheral side wall 411.

In the embodiment, the branch circuit board 442 and/or the branch circuit board 443 may be appropriately bent to suit a position of a sound inlet corresponding to the microphone 432 on the core housing 41. Specifically, the flexible circuit board 44 may be disposed in the core housing 41 in a manner that the main circuit board 441 is parallel to the bottom end wall 412. Therefore, the first microphone 432a may correspond to the bottom end wall 412 without bending the main circuit board 441. Since the second microphone 432b may be fixed on the peripheral side wall 411 of the core housing 41, it may be necessary to bend the second main circuit board 441. Specifically, the branch circuit board 443 may be bent at one end away from the main circuit board 441 so that a board surface of the branch circuit board 443 may be perpendicular to a board surface of the main circuit board 441 and the branch circuit board 442. Further, the second microphone 432b may be fixed at the peripheral side wall 411 of the core housing 41 in a direction facing away from the main circuit board 441 and the branch circuit board 442.

In one embodiment, the first pads 45, the second pads, the first microphone 432a, and the second microphone 432b may be disposed on the same side of the flexible circuit board 44. The second pads may be disposed adjacent to the second microphone 432b.

As used herein, the second pads may be specifically disposed at one end of the branch circuit board 443 away from the main circuit board 441 and have the same direction as the second microphone 432b and disposed at intervals. Therefore, the second pads may be perpendicular to the direction of the first pads 45 as the branch circuit board 443 is bent. It should be noted that the branch circuit board 443 may not be perpendicular to the board surface of the main circuit board 441 after being bent, which may be determined according to the arrangement between the peripheral side wall 411 and the bottom end wall 412.

Further, another side of the flexible circuit board 44 may be disposed with a rigid support plate 4a and a microphone rigid support plate 4b for supporting the first pads 45. The microphone rigid support plate 4b may include a rigid support plate 4b1 for supporting the first microphone 432a and a rigid support plate 4b2 for supporting the second pads and the second microphone 432b together.

As used herein, the rigid support plate 4a, the rigid support plate 4b1, and the rigid support plate 4b2 may be mainly used to support the corresponding pads and the microphone 432, and thus may need to have certain strengths. The materials of the three may be the same or different. The specific material may be polyimide (PI), or other materials that may provide the strengths, such as polycarbonate, polyvinyl chloride, etc. In addition, the thicknesses of the three rigid support plates may be set according to the strengths of the rigid support plates, and actual strengths required by the first pads 45, the second pads, the first microphone 432a, and the second microphone 432b, and be not specifically limited herein.

As used herein, the rigid support plate 4a, the rigid support plate 4b1, and the rigid support plate 4b2 may be three different regions of an entire rigid support plate, or three independent bodies spaced apart from each other, and be not specifically limited herein.

In one embodiment, the first microphone 432a and the second microphone 432b may correspond to two microphone components 4c, respectively (not shown in the figure). In one embodiment, the structures of the two microphone components may be the same. A sound inlet 413 may be disposed on the core housing 41. Further, the loud speaking device may be further disposed with an annular blocking wall 414 integrally formed on the inner surface of the core housing 41 at the core housing 41, and disposed at the periphery of the sound inlet 413, thereby defining an accommodation space (not shown in the figure) connected to the sound inlet 413.

In one embodiment, the flexible circuit board 44 may be disposed between a rigid support plate (e.g., the rigid support plate 4a, the rigid support plate 4b1, and the rigid support plate 4b2) and the microphone 432. A sound input 444 may be disposed at a position corresponding to a sound input 4b3 of the microphone rigid support plate 4b.

Further, the flexible circuit board 44 may further extend away from the microphone 432, so as to be connected to other functional components or wires to implement corresponding functions. Correspondingly, the microphone rigid support plate 4b may also extend out a distance with the flexible circuit board in a direction away from the microphone 432.

Correspondingly, the annular blocking wall 414 may be disposed with a gap matching the shape of the flexible circuit board to allow the flexible circuit board to extend out of the accommodation space 415. In addition, the gap may be further filled with a sealant to further improve the sealing.

Figure 4:
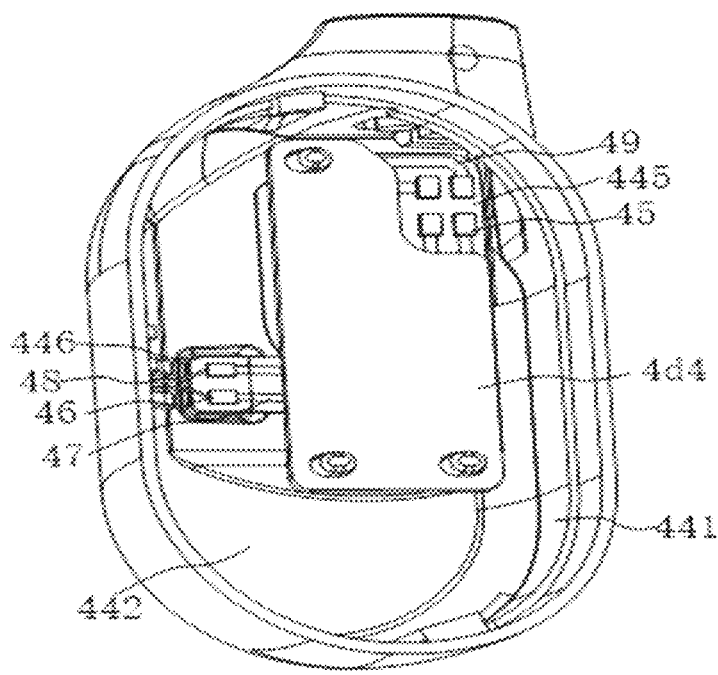
FIG. 4 is a sectional view illustrating a partial structure of a speaker according to some embodiments of the present disclosure.

FIG. 4 is a partial sectional view illustrating a structure of a speaker according to some embodiments of the present disclosure. In some embodiments, as shown in FIG. 4, the flexible circuit board 44 may include a main circuit board 445 and a branch circuit board 446. The branch circuit board 446 may extend along an extending direction perpendicular to the main circuit board 445. As used herein, the number of first pads 45 may be disposed at the end of the main circuit board 445 away from the branch circuit board 446. A key switch may be mounted on the main circuit board 445. The second pads 46 may be disposed at the end of the branch circuit boards 446 away from the main circuit board 445. The first auxiliary function module may be a key switch 431. The second auxiliary function module may be a microphone 432.

In the embodiment, a board surface of the flexible circuit board 44 and the bottom end wall 412 may be disposed in parallel and at intervals, so that the key switch may be disposed towards the bottom end wall 412 of the core housing 41.

As described above, an earphone core (or the earphone core 102) may include a magnetic circuit component, a vibration component, an external wire, and a bracket. As used herein, the vibration component may include a coil and an inner lead. The external wire may transmit an audio current to the coil in the vibration component. One end of the external wire may be connected to the inner lead of the earphone core, and the other end may be connected to the flexible circuit board of a speaker. The bracket may have a wiring groove. At least a portion of the external wire and/or the inner lead may be disposed in the wiring groove. In some embodiments, the inner lead and the outer wire may be welded to each other. A welding position may be located in the wiring groove.

Figure 5:
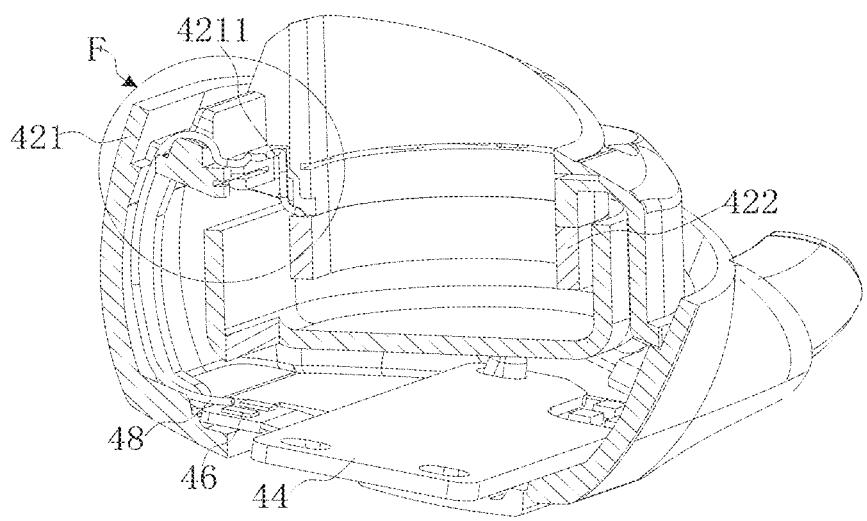
FIG. 5 is a partial sectional diagram illustrating a speaker according to some embodiments of the present disclosure.
Figure 6:
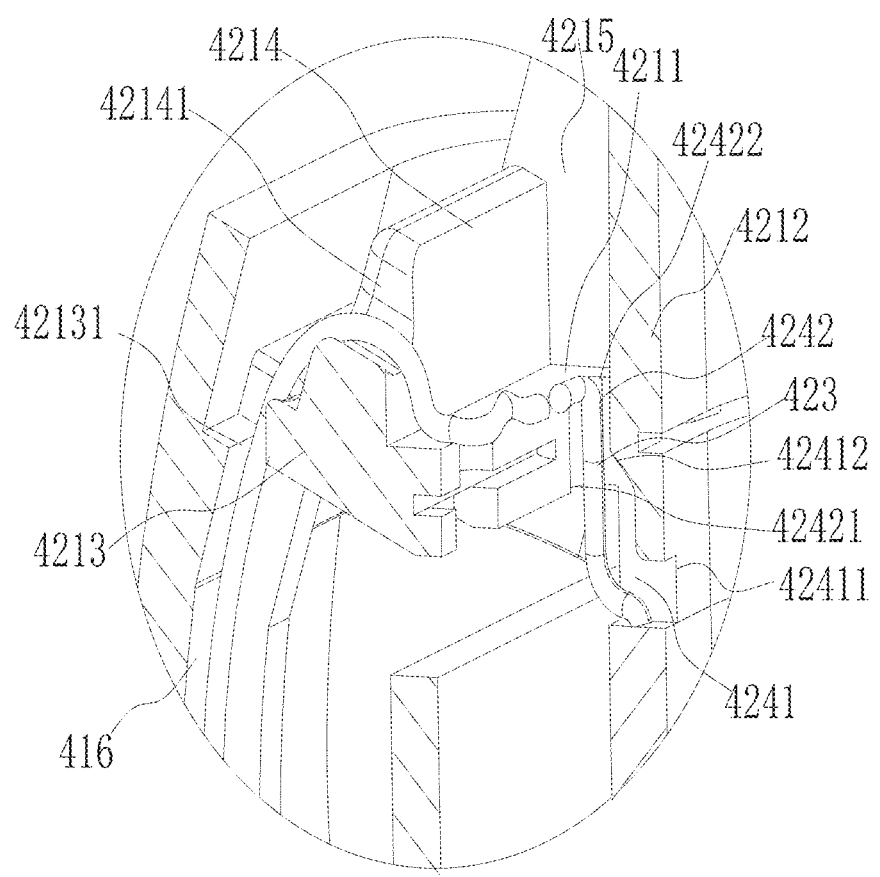
FIG. 6 is a partial enlarged diagram illustrating part F of a speaker in FIG. 5 according to some embodiments of the present disclosure.

FIG. 5 is a partial sectional diagram illustrating a speaker according to some embodiments of the present disclosure. FIG. 6 is a partial enlarged diagram illustrating part F of a speaker in FIG. 5 according to some embodiments of the present disclosure. Specifically, referring to FIG. 5 and FIG. 6, an earphone core may include a bracket 421, a coil 422, and an external wire 48. The bracket 421 may be used to support and protect the entire structure of the earphone core. In the embodiment, the bracket 421 may be disposed with a wiring groove 4211 used to accommodate a circuit of the earphone core.

The coil 422 may be disposed on the bracket 421 and have at least one inner lead 423. One end of the inner lead(s) 423 may be connected to a main circuit in the coil 422 to lead out the main circuit and transmit an audio current to the coil 422 through the inner lead 423.

One end of the external wire 48 may be connected to the inner lead(s) 423. Further, the other end of the external wire 48 may be connected to a control circuit (not shown in the figure) to transmit the audio current through the control circuit to the coil 422 through the inner lead 423.

Specifically, during an assembly stage, the external wire 48 and the inner lead(s) 423 may need to be connected together by means of welding, or the like. Due to structural and other factors, after the welding is completed, a length of the wire may not be exactly the same as a length of a channel, and there may be an excess length part of the wire. And if the excess length part of the wire is not disposed reasonably, it may vibrate with the vibration of the coil 422, thereby making an abnormal sound and affecting the sound quality of the earphone core.

Further, at least one of the external wire 48 and the inner lead 423 may be wound and disposed in the wiring groove 4211. In an application scenario, the welding position between the inner lead 423 and the external wire 48 may be disposed in the wiring groove 4211, so that a portion of the external wire 48 and the inner lead 423 located near the welding position may be wound in the wiring groove 4211. In addition, in order to maintain stability, the wiring groove 4211 may be further filled with a sealant to further fix the wiring in the wiring groove 4211.

In the manner described above, the wiring groove 4211 may be disposed on the bracket 421, so that at least one of the external wire 48 and the inner lead 423 may be wound into the wiring groove 4211 to accommodate the excess length part of the wire, thereby reducing the vibration generated inside the channel, and reducing the influence of the abnormal sound caused by the vibration on the sound quality of the earphone core.

In one embodiment, the bracket 421 may include an annular main body 4212, a support flange 4213, and an outer blocking wall 4214. As used herein, the annular main body 4212, the support flange 4213, and the outer blocking wall 4214 may be integrally formed.

As used herein, the annular main body 4212 may be disposed inside the entire bracket 421 and used to support the coil 422. Specifically, a cross-section of the annular main body 4212 in a direction perpendicular to the radial direction of a ring of the annular main body 4212 may be consistent with the coil 422. The coil 422 may be disposed at an end of the annular main body 4212 facing the core housing. The inner side wall and the outer side wall of the annular main body 4212 may be flush with the inner side wall and the outer side wall of the coil 422, respectively, so that the inner side wall of the coil 422 and the inner side wall of the annular main body 4212 may be coplanar, and the outer side wall of the coil 422 and the outer side wall of the annular main body 4212 may be coplanar.

Further, the support flange 4213 may protrude on the outer side wall of the annular main body 4212 and extend along the outside of the annular main body 4212. Specifically, the support flange 4213 may extend outward in a direction perpendicular to the outer side wall of the annular main body 4212. As used herein, the support flange 4213 may be disposed at a position between two ends of the annular main body 4212. In the embodiment, the support flange 4213 may protrude around the outer side wall of the annular main body 4212 to form an annular support flange 4213. In other embodiments, the support flange 4213 may also be formed by protruding at a portion of the outer side wall of the annular main body 4212 according to needs.

The outer blocking wall 4214 may be connected to the support flange 4213 and spaced apart from the annular main body 4212 along the side of the annular main body 4212. As used herein, the outer blocking wall 4214 may be sleeved on the periphery of the annular main body 4212 and/or the coil 422 at intervals. Specifically, the outer blocking wall 4214 may be partially sleeved around the periphery of the annular main body 4212 and the coil 422 according to actual needs, or partially sleeved around the periphery of the annular main body 4212. It should be noted that, in the embodiment, a portion of the outer blocking wall 4214 close to the wiring groove 4211 may be sleeved on a portion of the periphery of the annular main body 4212. Specifically, the outer blocking wall 4214 may be disposed on a side of the support flange 4213 away from the core housing. As used herein, the outer side wall of the annular main body 4212, the side wall of the support flange 4213 away from the core housing, and the inner side wall of the outer blocking wall 4214 may together define the wiring groove 4211.

In one embodiment, a wiring channel 424 may be disposed on the annular main body 4212 and the support flange 4213. The inner lead(s) 423 may extend inside the wiring groove 4211 via the wiring channel 424.

As used herein, the wiring channel 424 may include a sub-wiring channel 4241 on the annular main body 4212 and a sub-wiring channel 4242 on the support flange 4213. The sub-wiring channel 4241 may be disposed through the inner side wall and the outer side wall of the annular main body 4212. A wiring port 42411 communicating with one end of the sub-wiring channel 4241 may be disposed on a side of the annular main body 4212 near the coil 422. A wiring port 42412 communicating with the other end of the sub-wiring channel 4241 may be disposed on a side of the core housing near the support flange 4213 facing the core housing. The sub-wiring channel 4242 may penetrate the support flange 4213 in a direction towards the outside of the core housing. The wiring port 42421 communicating with the end of the sub-wiring channel 4242 may be disposed on a side of the support flange 4213 facing the core housing. The wiring port 42422 communicating with the other end of the sub-wiring channel 4242 may be disposed on a side away from the core housing. As used herein, the wiring port 42412 and the wiring port 42421 may communicate through a space between the support flange 4213 and the annular main body 4212.

Further, the inner lead(s) 423 may enter the wiring port 42411, extend along the sub-wiring channel 4241, exit from the wiring port 42412 to enter a region between the annular main body 4212 and the support flange 4213, further enter the sub-wiring channel 4242 from the wiring port 42421, and extend into the wiring groove 4211 after passing through the wiring port 42422.

In one embodiment, the top of the outer blocking wall 4214 may be disposed with a slot 42141. The external wire 48 may extend inside the wiring groove 4211 through the slot 42141.

As used herein, one end of the external wire 48 may be disposed on the flexible circuit board 44. The flexible circuit board 44 may be specifically disposed on an inner side of the earphone core facing the core housing.

In the embodiment, the support flange 4213 may be further extended to a side of the outer blocking wall 4214 away from the annular main body 4212 to form an outer edge. Further, the outer edge may surround and abut on the inner side wall of the core housing. Specifically, the outer edge of the support flange 4213 may be disposed with a slot 42131, so that the external wire 48 on the inner side of the earphone core facing the core housing may be extended to the outer side of the support flange 4213 facing the core housing through the slot 42131, and then to the slot 42141, and enter the wiring groove 4211 through the slot 42141.

Further, the inner side wall of the core housing may be disposed with a guide groove 416. One end of the guide groove 416 may be located on one side of the flexible circuit board 44 and the other end may communicate with the slot 42131 and extend in a direction towards the outside of the core housing, so that the external wire 48 extends from the flexible circuit board to a second wiring groove 3331 by passing through the guide groove 416.

In one embodiment, the bracket 421 may further include two side blocking walls 4215 spaced along the circumferential direction of the annular main body 4212 and connected to the annular main body 4212, the supporting flange 4213, and the outer blocking wall 4214, thereby defining the wiring groove 4211 between the two side blocking walls 4215.

Specifically, the two side blocking walls 4215 may be oppositely disposed on the support flange 4213 and protrude towards the outer side of the core housing along the support flange 4213. As used herein, a side of the two side blocking walls 4215 facing the annular main body 4212 may be connected to the outer side wall of the annular main body 4212. A side away from the annular main body 4212 may terminate at the outer side wall of the outer blocking wall 4214. The wiring port 42422 and the slot 42141 may be defined between the two side blocking walls 4215. Therefore, the inner lead(s) 423 exiting from the wiring port 42422 and the external wire 48 entering through the slot 42141 may extend into the wiring groove 4211 defined by the two side blocking walls 4215.

Figure 7:
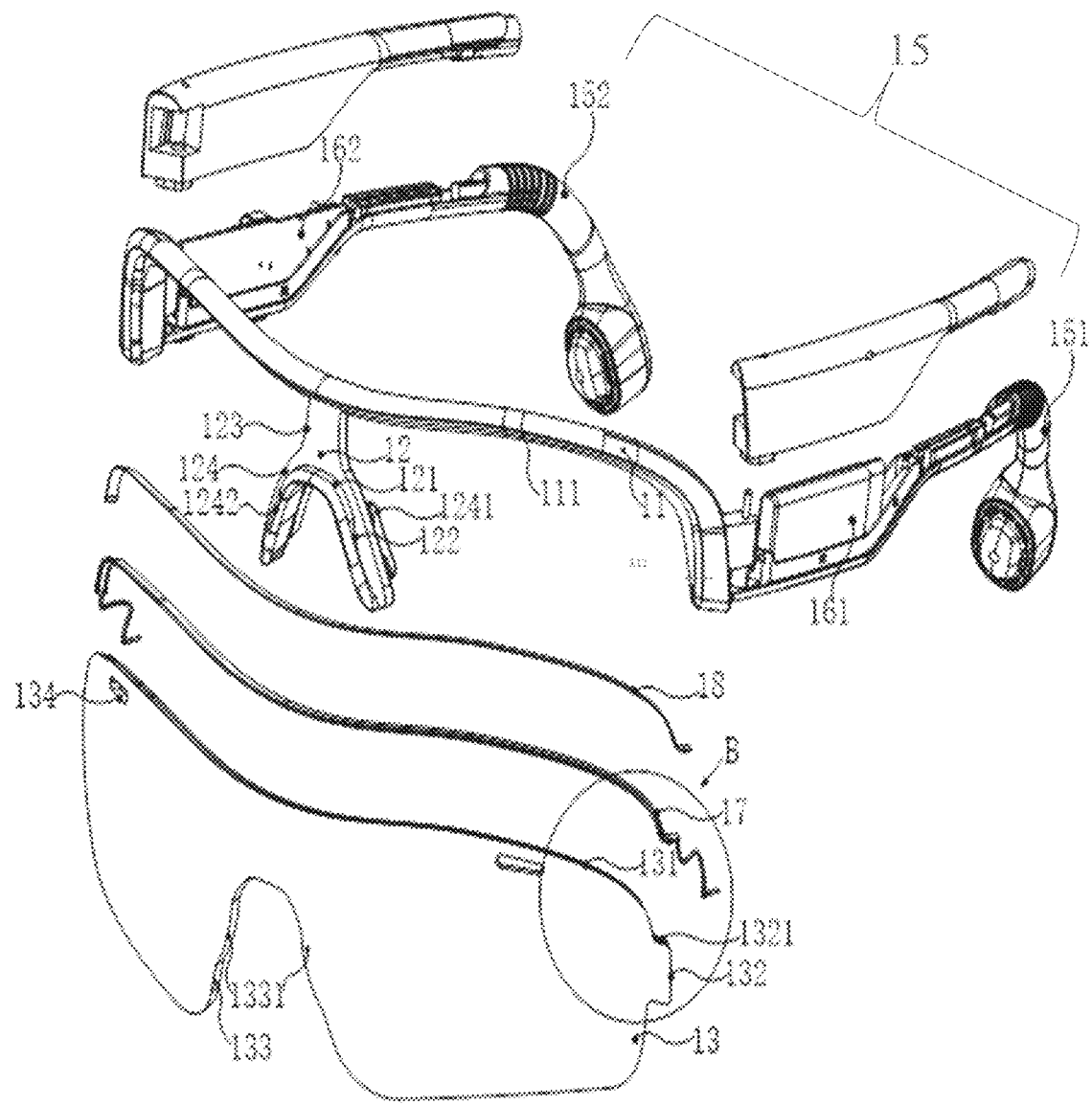
FIG. 7 is an exploded view illustrating a speaker according to some embodiments of the present disclosure.

FIG. 7 is a schematic diagram illustrating a structure of a speaker according to some embodiments of the present disclosure.

In some embodiments, the speaker may be glasses. In some embodiments, a fixing mechanism may be a glasses frame. The fixing mechanism may have at least one shaft assembly. The shaft assembly may be used to connect a glasses rim and a glasses temple. The glasses rim and the glasses temple may rotate around the shaft assembly. The shaft assembly may have a shaft wiring channel disposed along an axis. A connection wire may be disposed in the fixing mechanism. The connection wire may be an electrical connection wire. The connection wire may pass through the shaft wiring channel. Two ends of the connection wire may extend into the glasses rim and the glasses temple, respectively. In some embodiments, the glasses temple at two sides may accommodate a control circuit and a battery component, respectively. The connection wire in the glasses rim may be electrically connect to the control circuit and the battery component. The connection wire may include an audio signal wire and an auxiliary signal wire. The connection wire may be electrically connected to a flexible circuit board (i.e., the flexible circuit board 106) in a core housing (i.e., the core housing 108), and electrically connected to an earphone core (i.e., the earphone core 102) and auxiliary function module(s) (i.e., an auxiliary function module 104) through the flexible circuit board.

In some embodiments, the glasses of the present disclosure may be glasses worn in people's daily life and at work to correct vision and protect eyes, or certain circuit structures and electronic components may be added into the glasses in order to further implement specific functions through the circuit structures and electronic components. Specifically, the glasses in the present disclosure may be smart glasses, virtual reality glasses, holographic glasses, augmented reality glasses, or glasses with other functional structures (e.g., glasses with a bone conduction earphone or an air conduction earphone).

In some embodiments, as shown in FIG. 7, the glasses frame may include a glasses rim 11, a nose pad 12, a glasses lens 13, and a glasses temple 15.

As used herein, the glasses rim 11 may be used to carry at least a portion of the glasses lens 13. The nose pad 12 may be used to support the glasses on the bridge of the nose of a user when the user wears the glasses.

The nose pad 12 may be disposed in the middle of the glasses rim 11 and integrally formed with the glasses rim 11. In the prior art, the glasses rim 11 and the nose pad 12 may be usually formed, respectively. The middle portion of the glasses rim 11 may be disposed with a structure connected to the nose pad 12. After molding, the nose pad 12 may be installed on the connection structure of the glasses rim 11. In the embodiment, the glasses rim 11 and the nose pad 12 may be integrally formed directly. Specifically, a corresponding mold may be used to implement the integral molding, for example, injection molding, or the like. In the embodiment, the glasses rim 11 and the nose pad 12 may not need to be further installed after the molding, thereby simplifying a manufacturing process of glasses.

In addition, the glasses lens 13 may also be integrally designed, and be fixed by the glasses rim 11 and the nose pad 12 in a clamping manner.

Further, the glasses rim 11 and the nose pad 12 may be respectively disposed with a structure for clamping the glasses lens 13. When the glasses are assembled, the integrally designed glasses lens 13 may be directly clamped to the integrally formed glasses rim 11 and nose pad 12 through the corresponding clamping structures.

In the embodiment, the glasses rim 11 and the nose pad 12 may be integrally formed, and the glasses lens 13 may also be integrally designed. Therefore, the entire structure of the glasses may be simple, and the manufacturing process of the glasses may be simplified.

Referring to FIG. 7, FIG. 7 is an exploded view illustrating the glasses according to an embodiment of the present disclosure. In the embodiment, the glasses lens 13 may include a top-side edge 131 and two outer edges 132 connected to both ends of the top-side edge 131 and disposed away from the nose pad 12. Each of the outer edges 132 may be respectively disposed with a first buckle 1321. The glasses rim 11 may be disposed with a first mounting groove 111 for receiving the top-side edge 131 and at least a portion of the outer edges 132, and a first buckle groove 112 for receiving the first buckle 1321 and communicating with the first mounting groove 111.

As used herein, when the glasses are in a wearing state, the top-side edge 131 may be located on the upper side of the glasses lens 13, the outer edge may be located on both sides of the glasses lens 13 near ears of the user, and the top-side edge 131 and the two outer edges 132 may be connected to each other. The first mounting groove 111 may be disposed on a side of the glasses rim 11 facing the glasses lens 13. A size of the first mounting groove 111 may match the top-side edge 131 and the two outer edges 132 of the corresponding glasses lens 13, so that the glasses lens 13 may be mounted on the glasses rim 11 by mounting the top-side edge 131 and at least the portion of the outer edge 132 in the first mounting groove 111.

Further, the first buckle 1321 may be formed by further extending at least a portion of the outer edge 131 of the glasses lens 13 toward two sides away from the nose pad 12. The first buckle groove 112 may be formed by recessing a position of the first mounting groove 111 corresponding to the first buckling 1321 in a direction away from the glasses lens 13. As used herein, the shape and size of the first buckle groove 112 may match the first buckle 1321, so that the glasses lens 13 may be further installed on the glasses rim 11 by clamping the first buckle 1321 into the first buckle groove 112.

It should be noted that at least a portion of the outer edge 132 may be located on the side of the first buckle 1321 away from the top-side edge 131, so that the first buckle 1321 and a portion of the glasses lens 13 near the two sides of the edge of the glasses lens 13 may be accommodated inside the first mounting groove 111. Therefore, the glasses lens 13 may be more firmly fixed on the glasses rim 11.

In one embodiment, the glasses lens 13 may further include an inner edge 133 abutting on the nose pad 12. The nose pad 12 may be disposed with a second mounting groove 121 for receiving the inner edge 133.

It should be noted that the glasses lens 13 may include a left glasses lens and a right glasses lens. The inner edge 133 of the glasses lens 13 may be disposed at a connection between the left glasses lens and the right glasses lens and a vicinity of the connection. Accordingly, the second mounting groove 121 and the first mounting groove 111 may be oppositely disposed so that the opposite sides of the glasses lens 13 may be respectively received and fixed in an accommodation space formed by the glasses rim 11 and the nose pad 12.

In one embodiment, two sides of the inner edge 133 may be respectively disposed with a second buckle 1331. The nose pad 12 may be further disposed with a second buckle groove 122 connected to the second mounting groove 121 and used to receive the second buckle 1331.

As used herein, the inner edge 133 may include two portions connected to each other, which may be respectively disposed on a side of the left glasses lens facing the right glasses lens and a side of the right glasses lens facing the left glasses lens. The nose pad 12 may also be divided into two portions, which may be respectively supported on the left and right nose bridges of the user when worn by the user. Accordingly, in the embodiment, the count of the second buckle groove 122 and the second buckle 1331 may also be two. The shape and size of the second buckle 1331 may match the corresponding second buckle groove 122 to install the second buckle 1331 in the corresponding second buckle groove 122.

In addition, the glasses lens 13 may be disposed with the inner edge 133 near both sides of the second buckle 1331, which may allow the vicinity of both sides of the second buckle 1331 to be installed in the second mounting groove 121. Therefore, the glasses lens 13 may be more firmly fixed on the nose pad 12.

By the approach, the glasses lens 13 may be respectively mounted on the glasses rim 11 and the nose pad 12 through the top-side edge 131, the outer edge 132, the inner edge 133, the first buckle 1321, and the second buckle 1331.

In an application scenario, the glasses lens 13 may be further disposed with vent holes 134. Specifically, the count of the vent holes may be two, and respectively disposed on the left and right sides of the glasses lenses 13 near the top-side edge 131. The arrangement of the vent holes 134 may facilitate air circulation of the inner and outer sides of the glasses lens 13 when the user wears the glasses, thereby reducing a phenomenon of fogging of the glasses lens 13 caused by local overheating due to reasons such as user movement, etc.

Figure 8:
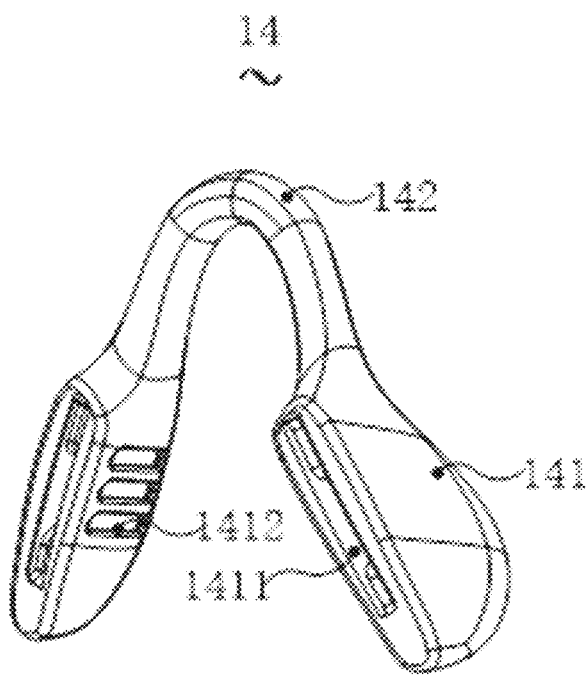
FIG. 8 is a structural diagram illustrating a nose pad cover in a speaker according to some embodiments of the present disclosure.

Specifically, referring to FIG. 7 and FIG. 8 together, FIG. 7 is an exploded view illustrating a speaker according to some embodiments of the present disclosure, and FIG. 8 is a schematic diagram illustrating a structure of a nose pad cover of glasses according to some embodiments of the present disclosure. In one embodiment, the nose pad 12 may include a connection portion 123 connected to the glasses rim 11 on the side of the first mounting groove 111 near the user or away from the user in the wearing state, and two support portions 124 connected to the connection portion 123 in an inverted Y-shaped manner on a side of the connection portion 123 away from the glasses rim 11. The support portions 124 may be used to support the glasses on the nose of the user when wearing.

In an application scenario, the connecting portion 123 may be integrally connected to the glasses rim 11. When the user wears the glasses, the connecting portion 123 may be disposed on a side of the first mounting groove 111 close to the user.

A side of each of the support portions 124 protruding toward the nose bridge of the user may be disposed with I-shaped hook(s) 1241. The glasses may further include nose pad cover(s) 14 detachably sleeved on the hook(s) 1241.

As used herein, the nose pad cover 14 may be made of soft rubber. Specifically, the count of the I-shaped hook(s) 1241 may be two, corresponding to the left and right nose bridges of the user, respectively. The nose pad cover 14 may include two cover bodies 141 and a connecting portion 142 connecting to the two cover bodies 141. As used herein, the connecting portion 142 may be connected with the nose bridge of the user. The cover bodies 141 may be correspondingly disposed with I-shaped accommodation groove(s) 1411 matching the hook(s) 1241. Sides of the cover bodies 141 facing the nose bridge of the user may further be disposed with an anti-slippery portion 1412 including a number of grooves. In the embodiment, the nose pad cover 14 may be detachably disposed, thereby facilitating cleaning and replacement of the nose pad cover 14.

Further, in an embodiment, sides of the two support portions 124 back from the hook(s) 1241 may be protruded with strip shaped ribs 1242. The strip shaped ribs 1242 may cooperate with the two support portions 124 to form the second mounting groove 121 and the second buckle groove 122.

As used herein, the strip shaped ribs 1242 may be protruded along edges of the two support portions 124 away from the glasses lens 13, thereby forming the second mounting groove 121 for receiving the inner edge 133 of the glasses lens 13. At a position corresponding to the second buckle 1331 of the glasses lens 13, the strip shaped ribs 1242 may be further recessed to form the second buckle groove 122.

Referring to FIG. 7 together, in one embodiment, the glasses rim may further include the glasses temple 15, function component(s) 16, and a connection wire 17. As used herein, the glasses temple 15 may include a first glasses temple 151 and a second glasses temple 152. The function component(s) 16 may include a first function component 161 and a second function component 162.

Specifically, the first glasses temple 151 and the second glasses temple 152 may be respectively connected to the glasses rim 11. The first function component 161 and the second function component 162 may be respectively disposed on the first glasses temple 151 and the second glasses temple 152. At least one cavity may be disposed on the two glasses temples 15 to accommodate the corresponding function components 16.

The connection wire 17 may be disposed inside the first mounting groove 111 and between the bottom of the first mounting groove 111 and the top-side edge 131 of the glasses lens 13, and further extend to the first glasses temple 151 and the second glasses temple 152 to be electrically connected to the first function component 161 and the second function component 162.

In the embodiment, the function component(s) 16 respectively disposed in the two glasses temples 15 may need to be electrically connected through the connection wire 17 so that the glasses may implement a specific function. Specifically, in an application scenario, the first function component 161 may be a battery component, and the second function component 162 may be a control circuit component. The control circuit component may be connected to the battery component through the connection wire 17, so that the battery component may provide power to the control circuit component. Therefore, the control circuit component may implement the specific function.

In order to meet requirements of beauty and lightness of the glasses, the connection wire 17 may be disposed in the first mounting groove 111 along the top-side edge 131 of the glasses lens 13 and accommodated inside a space formed by the first mounting groove 111 and the top-side edge 131 of the glasses lens 13, so that the connection wire 17 may be neither exposed on the outer surface of the glasses nor occupy extra space. In an application scenario, the connection wire 17 may further extend along the outer edge 132 of the glasses lens 13 inside the first mounting groove 111.

Specifically, the glasses rim 11, the first glasses temple 151, and the second glasses temple 152 may be respectively disposed with a wiring channel communicated with each other, so that the connection wire 17 may enter the first glasses temple 151 and the second glasses temple 152 from the first mounting groove 111 of the glasses rim 11 through the corresponding wiring channels, thereby connecting the first function component 161 and the second function component 162.

In the embodiment, the connection wire 17 may have an electrical connection function. In other embodiments, the connection wire 17 may also have a mechanical connection function.

In the embodiment, the first function component 161 and the second function component 162 may be respectively disposed on the first glasses temple 151 and the second glasses temple 152. The connection wire 17 electrically connecting the first function component 161 and the second function component 162 may be disposed inside the first mounting groove 111 on the glasses rim 11 to receive the top-side edge 131 of the glasses lens 13, so that the connection wire 17 may be disposed between the bottom of the first mounting groove 111 and the top-side edge 131 of the glasses lens, and further extend to the first glasses temple 151 and the second glasses temple 152. Therefore, the connection wire 17 may not be exposed, and extra space may not need for the arrangement of the connection wire 17, so that the beauty and lightness of the glasses may be maintained.

Figure 9:
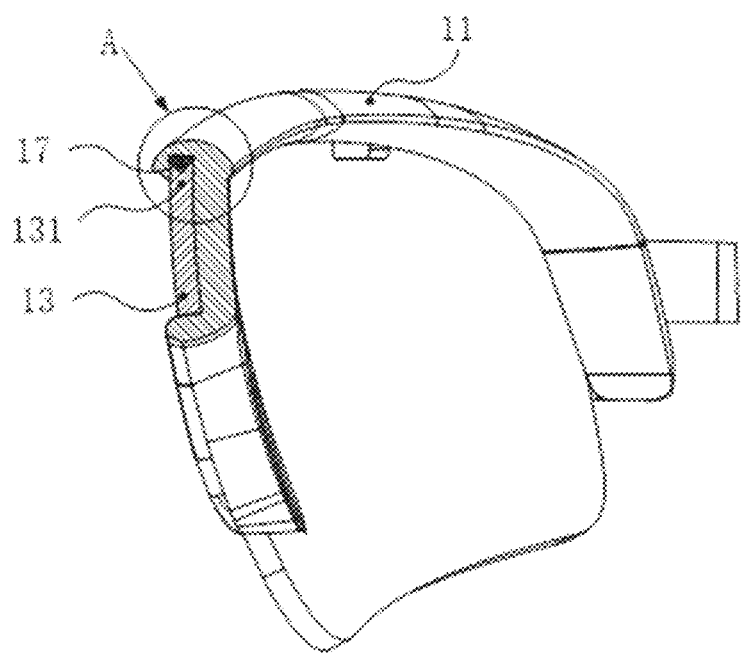
FIG. 9 is a partial sectional view illustrating a glasses rim and a glasses lens in a speaker according to some embodiments of the present disclosure.
Figure 10:
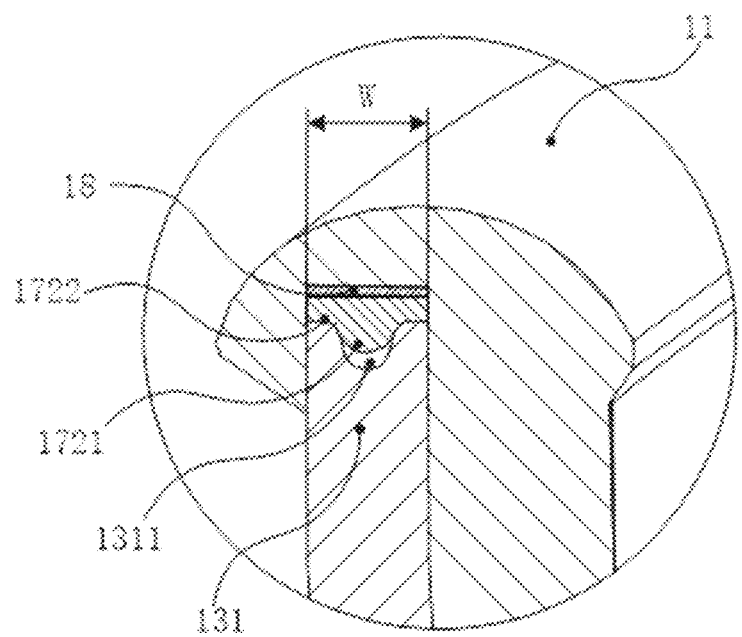
FIG. 10 is an enlarged view illustrating part A of a speaker in FIG. 9 according to some embodiments of the present disclosure.
Figure 11:
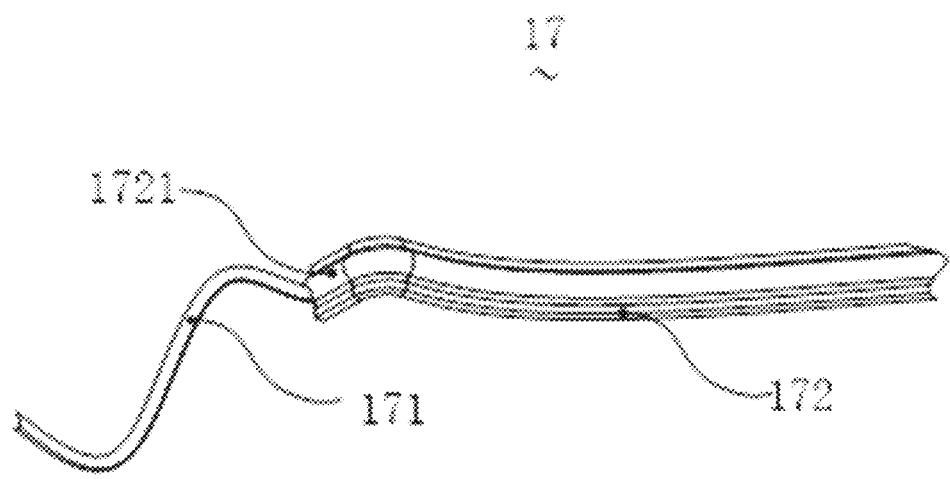
FIG. 11 is a partial structural diagram illustrating a connection wire in a speaker according to some embodiments of the present disclosure.

Referring to FIG. 9, FIG. 10, and FIG. 11 together, FIG. 9 is a partial sectional view illustrating a glasses rim and a glasses lens according to an embodiment of the present disclosure, FIG. 10 is an enlarged view illustrating part A in FIG. 9, and FIG. 11 is a partial structural diagram illustrating a connection wire according to an embodiment of the present disclosure. In the embodiment, the connection wire 17 may include a wire body 171 and a wire protection cover 172 wrapped around the periphery of the wire body 171. A sectional shape of the wire protection cover 172 may match a sectional shape of the first mounting groove 111, so that the wire protection cover 172 may be held in the first mounting groove 111 in a surface contact manner.

As used herein, the wire protection cover 172 may be made of soft rubber, so that the connection wire 17 may be bent to match the shape of the first mounting groove 111. It may be easy to understand that the wire body 171 may be thin. If the wire body 171 is directly installed in the first mounting groove 111, a contact area with the bottom of the first mounting groove 111 may be small, and it is difficult to be firmly fixed therein. In the embodiment, the wire protection cover 172 may be further wrapped around the periphery of the wire body 171, which, on the one hand, may play a role of protecting the wire body 171, and, on the other hand, increase the contact area between the connection wire 17 and the first mounting groove 111 by adjusting the surface area of the wire protection cover 172 to reliably fix the wire body 171 inside the first mounting groove 111.

Further, the sectional shape of the first mounting groove 111 may be a shape to allow the wire protection cover 172 to be held in the first mounting groove 111 with a large area of surface contact. For example, the shape may be U-shaped, rectangular, or wavy, and be not specifically limited herein. Correspondingly, the shape of a side of the wire protection cover 172 facing the bottom of the first mounting groove 111 may correspond to the shape, so that the wire protection cover 172 may be directly or indirectly fitted to the bottom of the first mounting groove 111.

In an application scenario, further referring to FIG. 7, an adhesive layer 18 may be disposed between the wire protection cover 172 and the glasses rim 11, so that the wire protection cover 172 may be fixed in the first mounting groove 111 through the adhesive layer 18.

As used herein, the adhesive layer 18 may be disposed on the bottom of the first mounting groove 111, or further extended to both sides and disposed on a side wall near the bottom of the first mounting groove 111, thereby making the adhesive layer 18 to wrap around the wire protection cover 172 to more firmly fix the connection wire 17 inside the first mounting groove 111.

Specifically, in the application scenario, a section of the first mounting groove 111 may be rectangular. The bottom of the first mounting groove 111 and a side of the wire protection cover 172 facing the bottom of the first mounting groove 111 may be both flat, and the adhesive layer 18 may be a double-sided adhesive layer disposed therebetween.

Further, in one embodiment, a side of the wire protection cover 172 facing the top-side edge 131 of the glasses lens 13 may be disposed with a protruding portion 1721 corresponding to the wire body 171. The top-side edge 131 of the glasses lens 13 may be disposed with a clearance slot 1311 for receiving the protruding portion 1721.

Specifically, the section of the wire body 171 may be circular. The wire protection cover 172 may be flush with the wire body 171 on the side of the wire body 171 facing the bottom of the first mounting groove 111. The side of the wire body 171 facing away from the bottom of the first mounting groove 111 may still present the shape of the wire body 171, thereby forming the corresponding protruding portion 1721.

Further, the top-side edge 131 of the glasses lens 13 may need to be further disposed inside the first mounting groove 111. In the embodiment, the top-side edge 131 may be further disposed with the clearance slot 1311 for receiving the protruding portion 1721, so that the connection wire 17 installed inside the first mounting groove 111 may be at least partially accommodated in the clearance slot 1311 corresponding to the top-side edge 131.

Further, the protruding portion 1721 may be located in a middle region of the wire protection cover 172 along a width direction of the wire protection cover 172 to form abutting portions 1722 on two sides of the protruding portion 1721. The two abutting portions 1722 may abut on the top-side edges 131 on two sides of the clearance slot 1311, respectively. As used herein, the width direction of the wire protection cover 172 may refer to a direction perpendicular to a direction of the wire protection cover 172 along the first mounting groove 111, specifically a direction indicated by W in FIG. 10.

It may be easy to understand that the depth of the first mounting groove 111 may be limited. If the top-side edge 131 of the glasses lens 13 is flush with the protruding portion 1721 of the connection wire 17, or a side of the wire protection cover 172 and the wire body 171 facing away from the bottom of the first mounting groove 111 is flush with the wire body 171, an insertion depth of the top-side edge 131 of the glasses lens 13 in the first mounting groove 111 may be reduced, which may disadvantage the stable installation of the glasses lens 13 in the glasses rim 11. In the embodiment, the top-side edge 131 of the glasses lens 13 may avoid a portion of the connection wire 17 through the clearance slot 1311, so that the top-side edge 131 may further extend towards the bottom of the first mounting groove 111 relative to the clearance slot 1311 and abut on the abutting portions 1722 on the two sides of the protruding portion 1721. Therefore, the space occupied by the connection wire 17 in the first mounting groove 111 may be reduced to a certain extent, so that the glasses lens 13 may be installed deeper inside the first mounting groove 111, thereby improving the stability of the glasses lens 13 in the glasses rim 11.

In an application scenario, the glasses rim 11 may be thin, and at least a portion of the protruding portion 1721 may be exposed outside the first mounting groove 111 to reduce the space of the glasses rim occupied by the connection wire 17, thereby reducing the depth of the first mounting groove 111 and improving the stability of the glasses rim 11.

Figure 12:
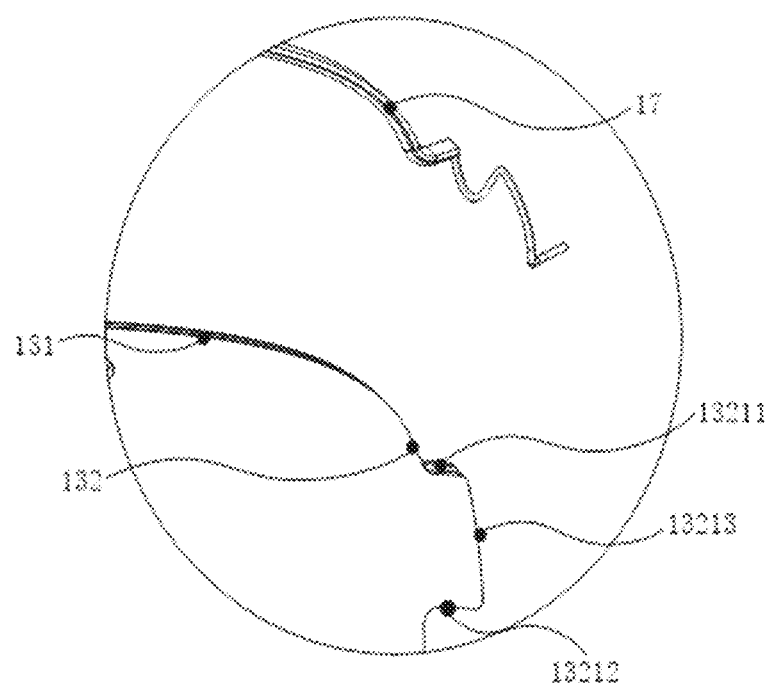
FIG. 12 is a partial structural schematic diagram illustrating part B of a speaker in FIG. 7 according to some embodiments of the present disclosure.

As used herein, further referring to FIG. 2 and FIG. 12, FIG. 12 is a partial structural diagram illustrating part B in FIG. 7 according to some embodiments of the present disclosure. In one embodiment, the first buckle 1321 may include a first sub-edge 13211, a second sub-edge 13212, and a third sub-edge 13213.

As used herein, the first sub-edge 13211 may be disposed adjacent to the top-side edge 131. The second sub-edge 13212 may be disposed away from the top-side edge 131 and opposite to the first sub-edge 13211. The third sub-edge 13213 may be connected to the first sub-edge 13211 and the second sub-edge 13212 on a side of the first sub-edge 13211 and the second sub-edge 13212 away from the glasses lens 13.

In the embodiment, the wire protection cover 172 may further extend to the first buckle groove 112 along the first sub-edge 13211.

In the way, the wire protection cover 172 may be held in the first mounting groove 111 and extend to the first buckle groove 112 to be hidden in the glasses rim 11. Therefore, when a user disassembles the glasses lens 13 during use, the wire protection cover 172 may not be exposed after the glasses lens 13 is disassembled to maintain the beauty of the glasses.

Further, when extending towards the first buckle groove 112, the wire protection cover 172 may end at a connection between the first sub-edge 13211 and the third sub-edge 13213. Certainly, the wire protection cover 172 may also not end and continue to extend along the wire body 171, as long as the wire protection cover 172 is not exposed when the glasses lens 13 is disassembled.

Figure 13:
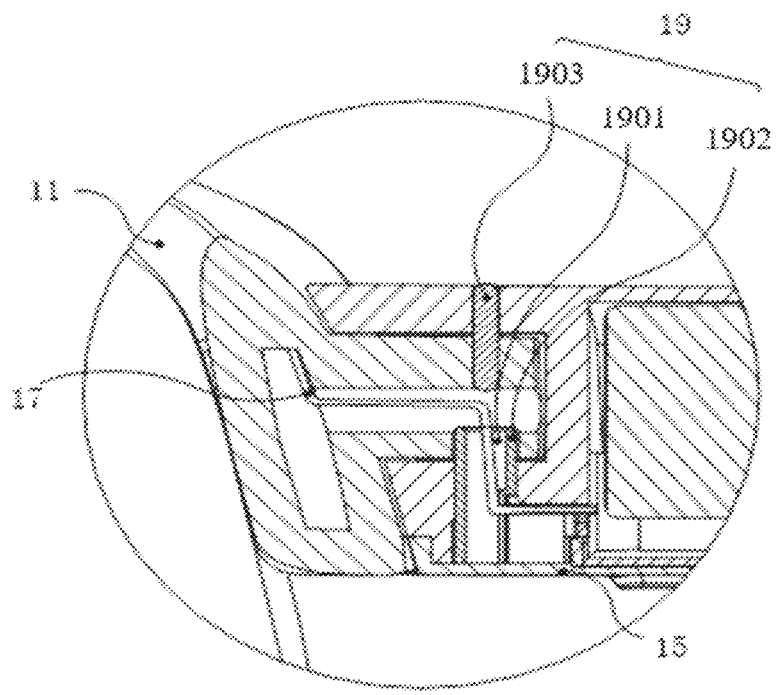
FIG. 13 is an enlarged sectional view illustrating a partial structure of glasses in a speaker according to some embodiments of the present disclosure.

Referring to FIG. 13 together, FIG. 13 is an enlarged sectional view illustrating a partial structure of glasses according to an embodiment of the present disclosure. In the embodiment, the glasses may further include shaft assembly 19.

As used herein, the count of the shaft assembly 19 may be two, and be respectively used to connect the glasses rim 11 and the two glasses temples 15 so that the glasses rim 11 and the glasses temples 15 may rotate relative to the shaft assembly 19. As used herein, the shaft assembly 19 may be disposed with a shaft wiring channel 1901 in an axial direction. The connection wire 17 may be disposed inside the shaft wiring channel 1901 and extend to the glasses rim 11 and the glasses temples 15, respectively.

Specifically, in the embodiment, after the connection wire 17 passes through the shaft wiring channel 1901, one end of the connection wire 17 may extend directly to one of the glasses temples 15, and the other end of the connection wire 17 may enter the glasses rim 11 and further extend to another one of the glasses temples 15 along the first mounting groove 111, thereby electrically connecting the two function components 16 located inside the two glasses temples 15, respectively.

In the embodiment, the connection wire 17 near the shaft wiring channel may not include the wire protection cover 172. The shaft wiring channel 1901 may pass through the shaft assembly 19.

It may be easy to understand that relative positions of structures near the shaft assembly 19 may change when the glasses rim 11 and the glasses temple 15 are folded. At this time, if the connection wire 17 located at the connection between the glasses rim 11 and the glasses temple 15 is directly disposed around the periphery of the shaft assembly 19, the connection wire 17 herein may be compressed or pulled, even deformed or broken with the folding of glasses rim 11 or glasses temples 15, which may affect the stability of the connection wire 17 and shorten the service life of the connection wire 17.

In the embodiment, the shaft assembly 19 may be disposed with the shaft wiring channel 1901 along the axial direction. The connection wire 17 located at the connection between the glasses rim 11 and the glasses temple 15 may pass through the shaft wiring channel 1901. Therefore, when the glasses rim 11 and the glasses temple 15 are folded, the connection wire 17 located inside the shaft wiring channel 1901 may only generate a certain amount of rotation with the rotation of the shaft assembly 19 to reduce the folding, compressing or pulling of the connection wire 17, thereby protecting the connection wire 17 to a certain extent, improving the stability of the connection wire 17, and extending the service life of the connection wire 17.

As used herein, in the embodiment, an inner diameter of the rotation shaft wiring channel 1901 may be larger than an outer diameter of the connection wire 17. For example, the inner diameter of the shaft wiring channel 1901 may be twice the outer diameter of the connection wire 17. Accordingly, a binding effect of the inner side wall of the axis wiring channel 1901 on the connection wire 17 may be reduced, thereby reducing the rotation of the connection wire 17 when the glasses rim 11 and the glasses temple 15 are folded.

Figure 14:
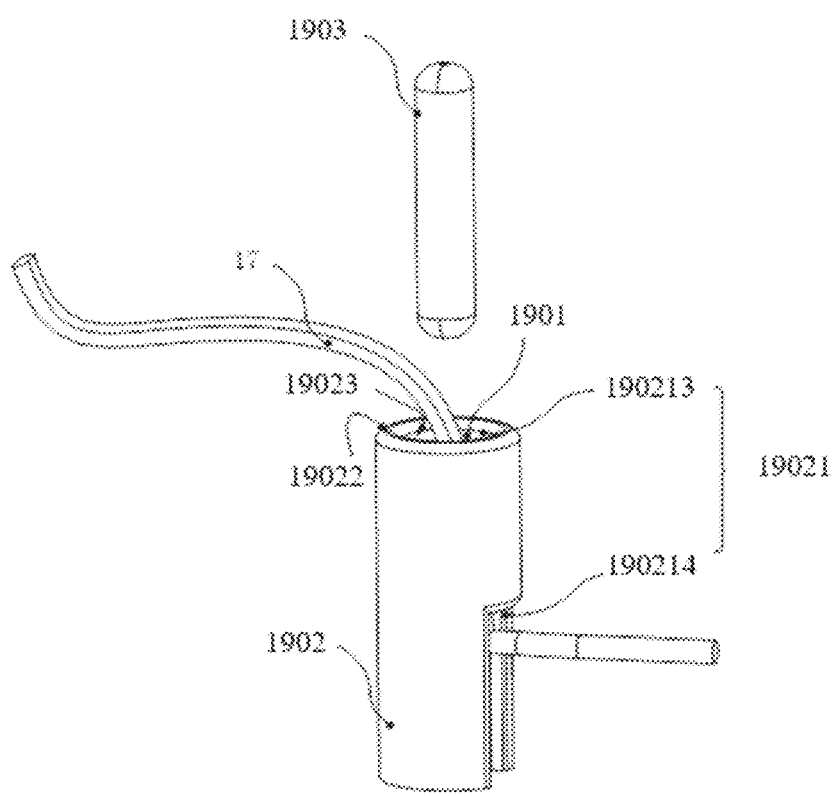
FIG. 14 is a schematic structural diagram illustrating a shaft assembly and a connection wire in a speaker according to some embodiments of the present disclosure.

Referring to FIG. 13 and FIG. 14 together, FIG. 14 is a schematic structural diagram illustrating a shaft assembly and a connection wire of glasses according to an embodiment of the present disclosure. In the embodiment, the shaft assembly 19 may include a first shaft 1902. Two ends of the first shaft 1902 may be respectively connected to the glasses rim 11 and the glasses temple 15. The shaft wiring channel 1901 may be disposed along an axial direction of the first shaft 1902. The shaft wiring channel 1901 may communicate with the outside through a wiring port 19021 disposed on at least one end surface of the first shaft 1902. The connection wire 17 may extend to the glasses rim 11 or the glasses temples 15 through the wiring port 19021.

It should be noted that, in the embodiment, the first shaft 1902 may be rotatably connected to one of the glasses rim 11 and the glasses temples 15, and fixedly connected to another, so that the glasses rim 11 and the glasses temples 15 may be rotatably connected around the first shaft 1902.

Specifically, in the embodiment, the shaft wiring channel 1901 may be disposed inside the first shaft 1902, and further communicate with the outside through the wiring port 19021.

Specifically, the shaft wiring channel 1901 may penetrate at least one end surface of the first shaft 1902 to form the wiring port 19021 of the shaft wiring channel 1901. Therefore, the connection wire 17 may extend from the shaft wiring channel 1901 through the at least one end surface of the first shaft 1902, and then extend to the glasses rim 11 or the glasses temples 15. It may be easy to understand that the periphery of the end surface of the first shaft 1902 may have a relatively large movement space. The connection wire 17 extending from the end surface of the first shaft 1902 may be accommodated inside the movement space. And if the first shaft 1902 at the end face is rotatably connected to the corresponding glasses rim 11 or glasses temple 15, when the glasses rim 11 and the glasses temple 15 fold and rotate, the movement space may be appropriately buffered a twist of the connection wire 17 near the wiring port 19021 on the end surface with the rotation of the first shaft 1902, thereby further reducing the twisting degree of the connection wire 17 and improving the stability of connection wire 17.

Figure 15:
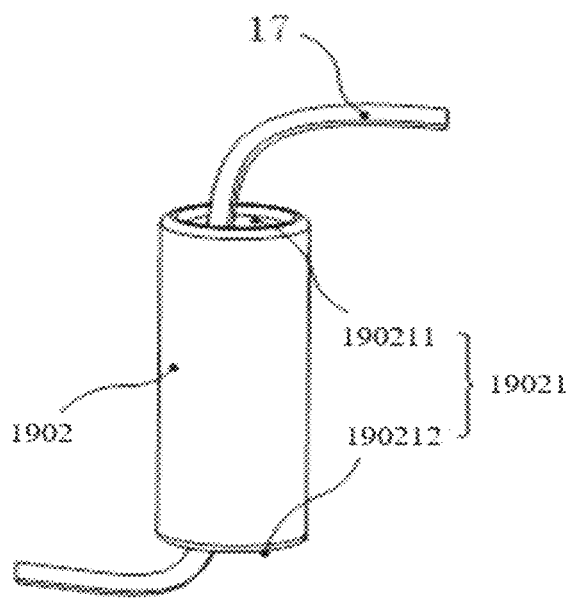
FIG. 15 is a schematic structural diagram illustrating a first shaft in a speaker according to some embodiments of the present disclosure.

Referring to FIG. 15, FIG. 15 is a schematic structural diagram illustrating a first shaft of glasses according to an embodiment of the present disclosure. In the embodiment, the wiring port 19021 may include a first wiring port 190211 and a second wiring port 190212 respectively disposed on two ends of the first shaft 1902. The shaft wiring channel 1901 may communicate with the outside through the two wiring ports 19021, so that the connection wire 17 may pass through the two ends of the first shaft 1902 and extend to the glasses rim 11 and the glasses temple 15 through the first wiring port 190211 and the second wiring port 190212, respectively.

In other words, in the application scenario, the connection wire 17 at the connection between the glasses rim 11 and the glasses temple 15 may be disposed inside the shaft wiring channel 1901 in the first shaft 1902, and extend from the shaft wiring channel 1901 through the two ends of the first shaft 1902, respectively. At this time, since large movement spaces exist on the periphery of two end surfaces of the first shaft 1902, the connection wire 17 extending from the two end surfaces of the first shaft 1902 may only move or twist slightly without compressing or deforming when the relative rotation occurs between the glasses rim 11 and the glasses temple 15.

Referring to FIG. 14, in the embodiment, the wiring port 19021 may include a first wiring port 190213 and a second wiring port 190214. As used herein, the first wiring port 190213 may be disposed on an end surface of the first shaft 1902, and the second wiring port 190214 may be disposed on a side wall of the first shaft 1902. Therefore, one end of the shaft wiring channel 1901 may penetrate the end surface of the first shaft 1902 in the axial direction through the first wiring port 190213, and the other end may penetrate the side wall of the first shaft 1902 through the second wiring port 190214, and then communicate with the outside. The connection wire 17 may extend to the glasses rim 11 and the glasses temple 15 through the first wiring port 190213 and the second wiring port 190214, respectively.

Similarly, a large movement space may be disposed near the end face of the first shaft 1902 of the first wiring port 190213. When a relative movement occurs between the glasses rim 11 and the glasses temple 15, the connection wire 17 near the first wiring port 190213 may only undergo a relative shift, or a small twist.

In an application scenario, the first shaft 1902 may be fixedly connected to one of the glasses rim 11 and the glasses temple 15 disposed near the second wiring port 190214, and rotatably connected to another of the glasses rim 11 and the glasses temple 15 disposed near the first wiring port 190213. That is, the first shaft 1902 may be rotatably connected to one of the glasses rim 11 or the glasses temple 15 at the wiring port 19021 disposed on the end surface. The first shaft 1902 may be fixedly connected to another of the glasses rim 11 or the glasses temple 15 at the wiring port 19021 disposed on the side wall.

In an application scenario, the first shaft 1902 may be closed to the glasses rim 11 at the first wiring port 190213, and rotatably connected to the glasses rim 11. The first shaft 1902 may be closed to the glasses temple 15 at the second wiring port 190214, and fixedly connected to the glasses temple 15.

It should be noted that, in this application scenario, the first shaft 1902 is rotatably connected to the glasses rim 11, and the relative rotation between the glasses rim 11 and the glasses temple 15 may cause the relative movement of the connection wire 17 at the first wiring 190213. However, since the first wiring port 190213 is disposed on the end surface of the first shaft 1902, similar to the embodiment described above, the end surface of the first shaft 1902 may have a large movement space. When the glasses rim 11 and the glasses temple 15 are folded and rotated, and the connection wire 17 near the wiring port 19021 on the end surface is twisted to a certain extent with the rotation of the first shaft 1902, the movement space may be appropriately buffered, and the twist may be turned into a shift or a small twist, without compressing or pulling the connection wire, thereby improving the stability of the connection wire and extending the service life of the connection wire.

In addition, the first shaft 1902 may be fixedly connected to the glasses temple 15 at the second wiring port 190214. It may be easy to understand that the glasses temple 11 and the first shaft 1902 may be synchronized when the relative rotation occurs between the glasses rim 11 and the glasses temple 15. Hence, the connection wire 17 in the shaft wiring channel 1901 may extend through the second wiring port 190214 into the connection wire 17 of the glasses temple 11 without twisting, compressing, or pulling. Therefore, at this time, the second wiring port 190214 may be disposed on the end surface of the first shaft 1902 or on the side wall of the first shaft 1902. The relative rotation between glasses rim 11 and glasses temple 15 may not cause the twisting, compressing, pulling, etc., of the connection wire 17 herein.

In other embodiments, if the first shaft 1902 and the glasses temple 15 are rotatably connected at the second wiring port 190214, the relative rotation between thereof may allow the connection wire 17 to move, which may be constrained by the side wall of the first shaft at the second wiring port 190214, so that the connection wire 17 may be compressed between the side wall of the first shaft and the glasses temple 15.

If the first shaft 1902 is near the glasses temple 15 at the first wiring port 190213 and rotatably connected to the glasses temple 15, the first shaft 1902 may be near the glasses rim 11 at the second wiring port 190214 and fixedly connected to the glasses rim 11. For the same reason, when the glasses rim 11 and the glasses temple 15 are folded, the connection wire 17 inside the shaft wiring channel 1901 and near the first wiring port 190213 and the second wiring port 190214 may be still only slightly twisted or moved.

Referring to FIG. 14, in one embodiment, the shaft assembly 19 may further include a second shaft 1903 coaxial with and spaced from the first shaft 1902.

In the embodiment, the second shaft 1903 may be disposed on a side of the first shaft 1902 near the first wiring port 190213. Certainly, in other embodiments, the second shaft 1903 may also be disposed on a side of the first shaft 1902 closed to the second wiring port 190214.

Figure 16:
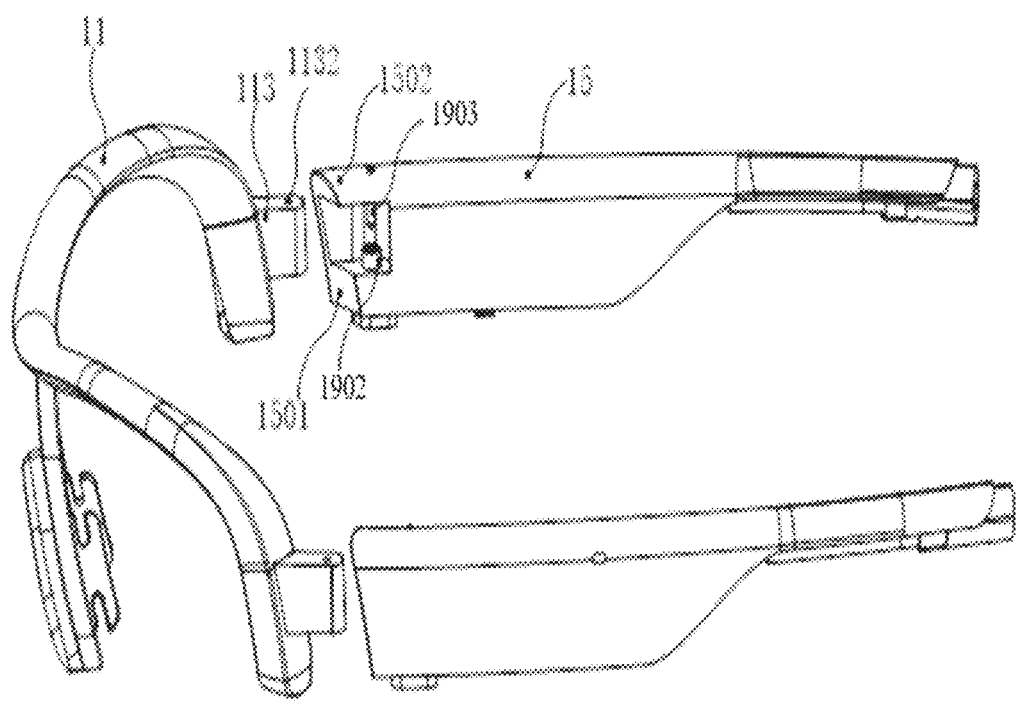
FIG. 16 is a partial exploded view illustrating a speaker according to some embodiments of the present disclosure.

Referring to FIG. 16, FIG. 16 is a partial exploded view illustrating glasses according to an embodiment of the present disclosure. In the embodiment, the glasses rim 11 may include first lug(s) 113. Specifically, the count of the first lug(s) 113 may be two, and be respectively disposed at two ends of the glasses rim 11 connecting to the two glasses temples 15 and protrude towards the corresponding glasses temples 15.

The glasses temple 15 may include a second lug 1501 and a third lug 1502 disposed at intervals. As used herein, the second lug 1501 and the third lug 1502 may face ends of the glasses rim 11 connected to the glasses temple 15 at which the lugs are located. In addition, when the user wears the glasses, the second lug 1501 and the third lug 1502 may be connected to a side away from the head of the user, thereby making the glasses more overall and more beautiful in appearance. In an application scenario, the second lug 1501 and the third lug 1502 disposed at intervals may be formed by disposing a groove in the middle of an end of the glasses temple 15 facing the glasses rim 11.

Further, ends of the first shaft 1902 and the second shaft 1903 closed to each other may be connected to the first lug 113. Ends of the first shaft 1902 and the second shaft 1903 away from each other may be connected to the second lug 1501 and the third lug 1502, respectively, so as to maintain the first lug 113 between the second lug 1501 and the third lug 1502.

As used herein, referring to FIG. 14 continuously, in one embodiment, the first wiring port 190213 may be disposed on an end surface of the first shaft 1902 near the second shaft 1903. The second wiring port 190214 may be disposed on a side wall of the first shaft near the second lug 1501. The first shaft may be rotatably connected to the first lug 113 and fixedly connected to the second lug 1501.

Specifically, in the embodiment, one end of the connection wire 17 inside the shaft wiring channel 1901 may extend from the first wiring port 190213 and pass through an interval between the first shaft 1902 and the second shaft 1903. Further, in an application scenario, the first lug 113 may be disposed with a wiring channel connected to the first wiring port 190213, so that the connection wire 17 may further enter the glasses rim 11 from the first lug 113.

In addition, the other end of the connection wire 17 inside the shaft wiring channel 1901 may extend from the second wiring port 190214. Further, in an application scenario, the third lug 1502 may be disposed with a wiring channel communicating with the second wiring port 190214, so that the connection wire 17 may further enter the glasses temple 15 through the wiring channel of the third lug 1502.

As used herein, the second wiring port 190214 may be a through-hole disposed on a side wall of the first shaft 1902, and communicated with the shaft wiring channel 1901 without penetrating an end of the first shaft 1902. In the embodiment, the second wiring port 190214 may be further penetrated along the side wall of the first shaft 1902 to an end of the first shaft 1902 away from the first wiring port 190213. It may be easy to understand that, in the embodiment, the second wiring port 190214 may have a larger space. Therefore, when the connection wire 17 is moved for some reason, the restriction on the connection wire 17 may be further reduced, and the damage to the side wall of the first shaft 1902 may be further reduced.

Figure 17:
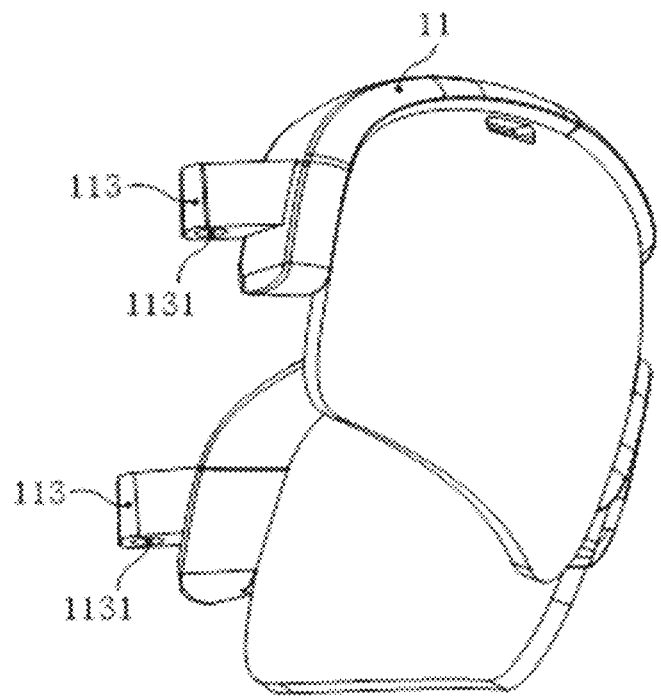
FIG. 17 is a schematic structural diagram illustrating a glasses rim and a glasses lens in a speaker according to some embodiments of the present disclosure.
Figure 18:
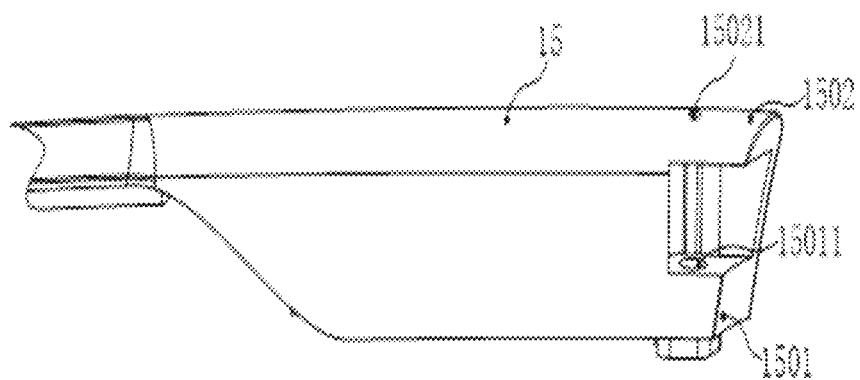
FIG. 18 is a schematic diagram illustrating a partial structure of a glasses temple in a speaker according to some embodiments of the present disclosure.

Referring to FIG. 16, FIG. 17, and FIG. 18 together, FIG. 17 is a schematic structural diagram illustrating a glasses rim and a glasses lens of glasses according to an embodiment of the present disclosure, and FIG. 18 is a partial structural schematic diagram illustrating a glasses temple of glasses according to an embodiment of the present disclosures. In the embodiment, the first lug 113 and the second lug 1501 may be coaxially disposed with a first accommodating hole 1131 and a second accommodating hole 15011, respectively. Sizes of the first accommodating hole 1131 and the second accommodating hole 15011 may be set to allow the first shaft 1902 to be inserted into the first accommodating hole 1131 from the outside of the glasses temple 15 through the second accommodating hole 15011, such that the first shaft 1902 may be in an interference fit with the second accommodating hole 15011 and in a clearance fit with the first accommodating hole 1131.

Specifically, the second accommodating hole 15011 may be a through-hole penetrating the second lug 1501. The first accommodating hole 1131 may correspond to the second accommodating hole 15011 and penetrate at least a portion of the first lug 113. As used herein, an inner diameter of the first accommodating hole 1131 may be larger than the second accommodating hole 15011. An outer diameter of the first shaft 1902 may be between the first accommodating hole 1131 and the second accommodating hole 15011. Therefore, the first shaft 1902 may be fixedly connected to the glasses temple 15 and rotatably connected to the glasses rim 11 so that the glasses rim 11 and the glasses temple 15 may be rotated around the first shaft 1902 to be folded or unfolded.

Further, in an embodiment, the first lug 113 and the third lug 1502 may be coaxially disposed with a third accommodating hole 1132 and a fourth accommodating hole 15021, respectively. Sizes of the third accommodating hole 1132 and the fourth accommodating hole 15021 may be set to allow the second shaft 1903 to be inserted into the third accommodating hole 1132 from the outside of the glasses temple 15 via the fourth accommodating hole 15021, such that the second shaft 1903 may be in an interference fit with the third accommodating hole 1132 and in a clearance fit with the fourth accommodating hole 15021, or the second shaft 1903 may be in a clearance fit with the third accommodating hole 1132 and in an interference fit with the fourth accommodating hole 15021.

In the embodiment, the third accommodating hole 1132 and the fourth accommodating hole 15021 may be coaxial with both the first accommodating hole 1131 and the second accommodating hole 15011. As used herein, the third accommodating hole 1132 may penetrate at least a portion of the first lug 113. In one application scenario, the first accommodating hole 1131 and the third accommodating hole 1132 may be coaxially penetrated. Specifically, as described in the above embodiment, the first lug 113 of the glasses rim 11 may be disposed with a wiring channel connected to the first wiring port 190213. The first accommodating hole 1131 and the third accommodating hole 1132 may be respectively disposed on both sides of the wiring channel located inside the first lug 113 and both pass through the wiring channel. The fourth accommodating hole 15021 may penetrate the third lug 1502. As used herein, the outer diameter of the second shaft 1903 may be between the inner diameter of the third accommodating hole 1132 and the inner diameter of the fourth accommodating hole 15021. The inner diameter of the third accommodating hole 1132 may be larger than the fourth accommodating hole 15021. Alternatively, the inner diameter of the fourth accommodating hole 15021 may be larger than the third accommodating hole 1132. Therefore, the second shaft 1903 may be fixedly connected to the glasses temple 15 and rotatably connected to the glasses rim 11, or the second shaft 1903 may be fixedly connected to the glasses rim 11 and rotatably connected to the glasses temple 15, so that the glasses rim 11 and the glasses temple 15 may be rotated around the first shaft 1902 to be folded or unfolded.

In one embodiment, the second shaft 1903 may be a solid shaft, and the diameter may be less than that of the first shaft 1902. In the wearing state, the second shaft 1903 may be located on the upper side of glasses temple 15, and the first shaft may be located on the lower side of glasses temple 15.

It should be noted that, since the shaft wiring channel 1901 may be disposed inside the first shaft 1902, the outer diameter of the first shaft 1902 may be larger, which may adversely satisfy aesthetic needs of the user. Therefore, in the embodiment, the second shaft 1903 having a smaller outer diameter may be further disposed. Hence, when the user wears the glasses, the second shaft 1903 may be disposed on an upper portion that is easily found, and the first shaft 1902 may be disposed on a lower portion that is not easily observed. Since the outer diameter of the second shaft 1903 is smaller, the overall aesthetic effect of the glasses may be improved to a certain extent.

Certainly, in other embodiments, the first shaft 1902 and the second shaft 1903 may also be other cases. For example, the second shaft 1903 may also be a hollow shaft, and the diameter of the second shaft 1903 may be larger than the diameter of the first shaft 1902. Alternatively, in the wearing state, the second shaft 1903 may be disposed on a lower side of the glasses temple 15, and the first shaft 1902 may be disposed on an upper side of the glasses temple 15, or the like, and be not limited herein.

In addition, referring to FIG. 14, a connection between an end surface 19022 of the first shaft 1902 for disposing the first wiring port 190213 and an inner wall surface 19023 of the first shaft 1902 for defining the shaft wiring channel 1901 may be arc-shaped. It may be easy to understand that, when the rotation between the glasses rim 11 and the glasses temple 15 through the shaft assembly 19 occurs, since the first shaft 1902 and the glasses rim 11 are rotatably connected, the connection wire 17 at the first wiring port 190213 may be moved. In the embodiment, the connection between the end surface 19022 of the first shaft 1902 and the inner wall surface 19023 may be arc-shaped. Therefore, when the connection wire 17 at the first wiring port 190213 moves and contacts with the first shaft 1902, the connection wire 17 may be avoided to be cut if the connection is too sharp, thereby further protecting the connection wire 17.

In an application scenario, a connection between the end surface of the first shaft 1902 for disposing the second wiring port 190214 and the inner wall surface 19023 of the first shaft 1902 for defining the shaft wiring channel 1901 may also be arc-shaped. Similarly, in this way, the connection wire 17 may be further protected.

It should be noted that the above description of the shaft assembly and wiring in the glasses may be only specific examples, and should be not considered as the only feasible implementation. Obviously, for those skilled in the art, after understanding the basic principle of the shaft assembly and wiring in the glasses, it may be possible to make various modifications and changes in the form and details of the specific manner and operation of implementing the shaft assembly and wiring in the glasses without departing from these principles, but these modifications and changes are still within the scope described above. For example, the branch circuit board may also include a third pad and a third flexible circuit board. All such variations may be within the protection scope of the present disclosure.

Figure 19:
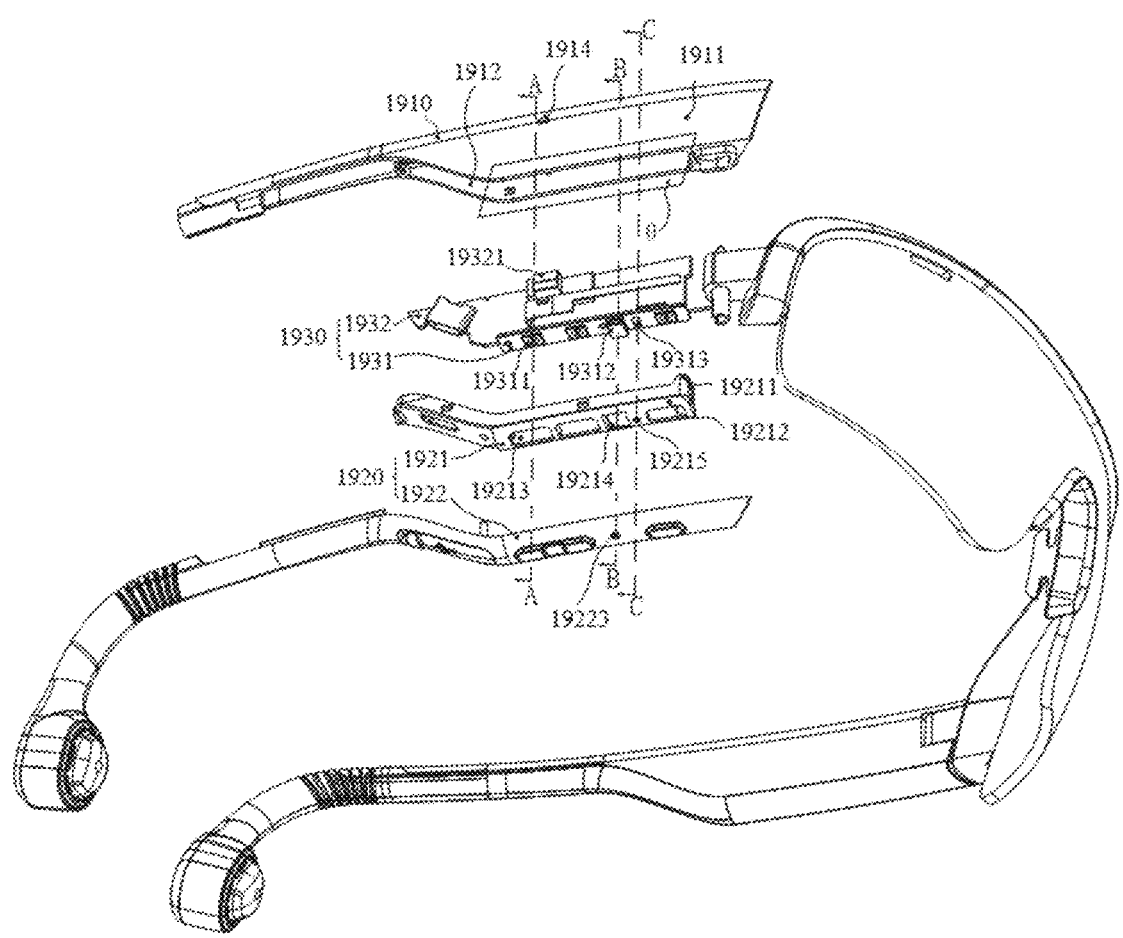
FIG. 19 is an exploded diagram illustrating a structure of a speaker according to some embodiments of the present disclosure.
Figure 20:
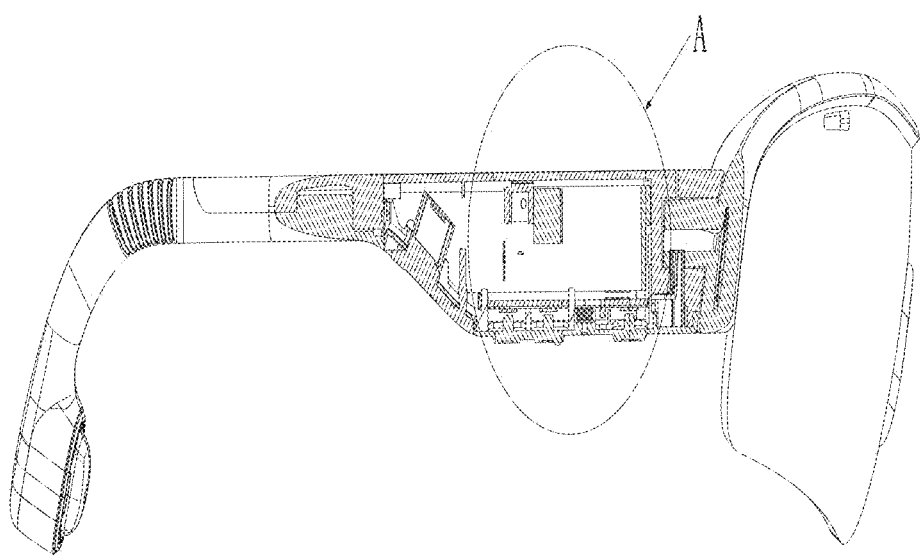
FIG. 20 is a partial sectional view illustrating a pair of glasses according to some embodiments of the present disclosure.
Figure 21:
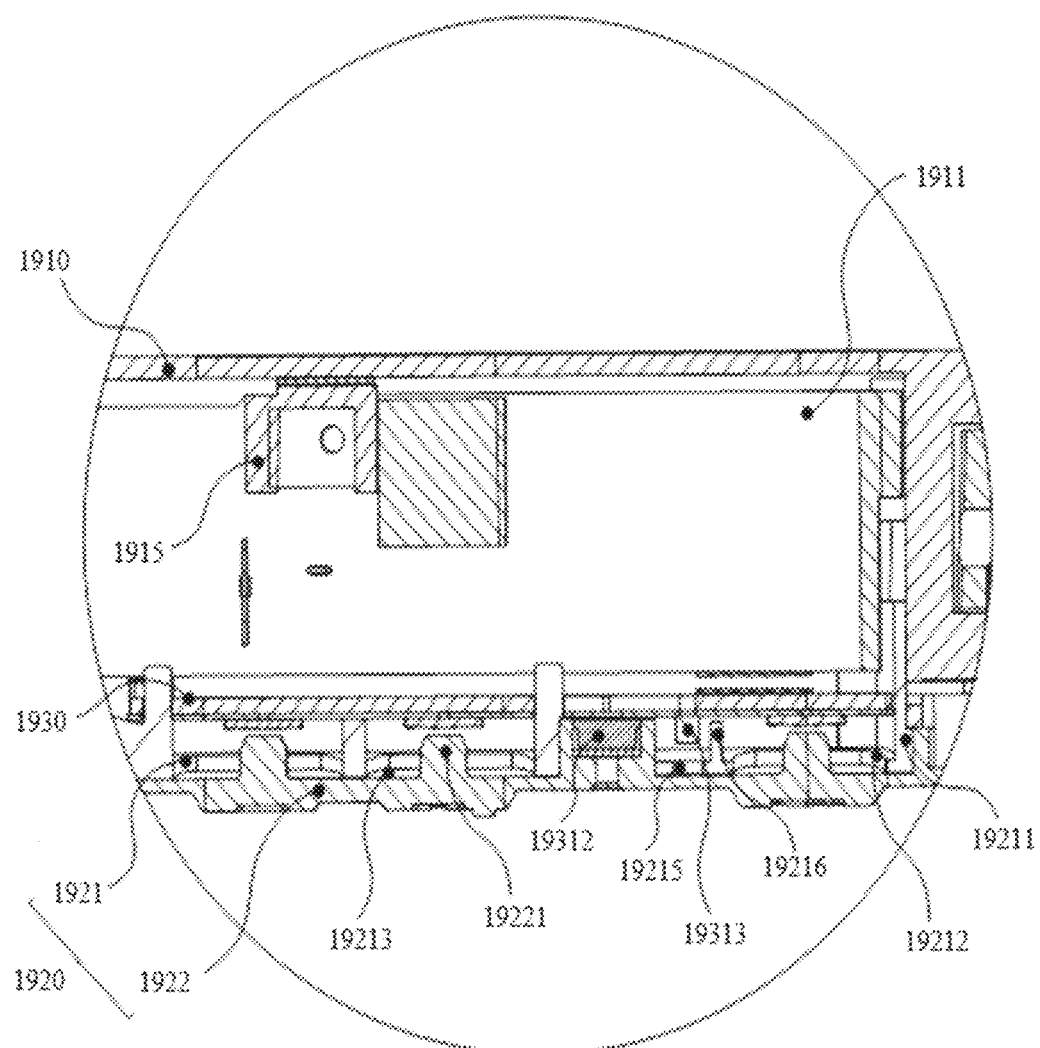
FIG. 21 is an enlarged view illustrating part A in the FIG. 20 according to some embodiments of the present disclosure.

FIG. 19 is an exploded diagram illustrating a structure of a speaker according to some embodiments of the present disclosure. FIG. 20 is a partial sectional view illustrating a speaker according to some embodiments of the present disclosure. FIG. 21 is an enlarged view illustrating part A in FIG. 20 according to some embodiments of the present disclosure. As shown in FIGS. 19-21, in some embodiments, the speaker may include a component body. A chamber 1911 may be formed inside the component body. It should be noted that the component body may be located in the glasses temple 15 (in FIG. 7) in the above embodiments. In some embodiments, at least two dual microphones may also be disposed in the glasses temple 15.

It should be noted that the auxiliary function module 104 may be located in the core housing 108 or in the fixing mechanism 110, e.g., in the glasses temple 15 (in FIG. 7).

The component body may be a structure including at least two portions. The component body may also be a structure formed by integrally molding, e.g., a structure integrally formed by injection molding. A spatial shape of the component body may include, but not be limited to, a rectangular parallelepiped, a cube, an ellipsoid, a sphere, a cone, and other irregular spatial shapes. A material of the component body may include, but not be limited to, a plastic, a silica gel, a rubber, a glass, a ceramic, an alloy, a stainless steel, or the like, or any combination thereof.

In some embodiments, the component body may include an accommodation body 1910 and a cover 1920. The accommodation body 1920 may be hollow to form the chamber 1911. The accommodation body 1910 may include an opening 1912 communicated with the chamber 1911. The cover 1920 may be disposed on the opening 1912 to seal the chamber 1911. The chamber 1911 may be an internal chamber formed by two or more components when assembled. Alternatively, the chamber 1911 may also be an internal chamber formed according to a shape of a forming mold during the integral molding process of the component. The chamber 1911 may be used to accommodate multiple electronic elements and circuit structures of the speaker. The component body may be used to seal the chamber 1911. The chamber 1911 may be completely sealed by the component body, or be jointly sealed by the component body and other accessories on the component body.

As used herein, the accommodation body 1910 may be at least a portion of the speaker. Specifically, the accommodation body 1910 in this embodiment may be a structure for holding, e.g., a circuit board, a battery 52, or an electronic component in the speaker. For example, the accommodation body 1910 may be a whole or a portion of the housing of the speaker.

In addition, the accommodation body 1910 may be disposed with a chamber 1911 having an opening 1912 for accommodating the circuit board, the battery, the electronic component, etc. The opening 1912 may communicate with the chamber 1911 and used as a channel for loading and/or unloading the circuit board, the battery, the electronic component, etc. For example, a count of the opening 112 may be one, or multiple, which is not limited herein.

Further, the shape of the cover 1920 may at least partially match the opening 1912. Therefore, the cover 1920 may be placed on the opening 1912 to seal the chamber 1911. As used herein, the material of the cover 1920 may be different from or partially the same as the accommodation body 1910.

In some embodiments, the cover 1920 may include a rigid bracket 1921 and a soft cover layer 1922. As used herein, the rigid bracket 1921 may be used to mechanically connect to the accommodation body 1910. The soft cover layer 1922 may integrally form on the surface of the rigid bracket 1921 by injection molding to provide a seal for the chamber 1911 after the rigid bracket 1921 is connected to the accommodation body 1910.

In some embodiments, the material of the rigid bracket 1921 may include hard plastic. The material of the soft cover layer 1922 may include soft silicone or rubber. As used herein, the shape of one side of the rigid bracket 1921 towards the accommodation body 1910 may match the opening 1912. The rigid bracket 1921 may be fixed to the opening 1912 of the chamber 1911 by means of plugging, buckling, etc., to be mechanically connected to the accommodation body 1910. A gap may easily form at a connection of the rigid bracket 1921 and the accommodation body 1910 and reduce the sealing of the chamber 1911. Further, the soft cover layer 1922 may integrally form on an outer surface of the bracket 1921 away from the accommodation body 1910 by injection molding. Further the connection between the bracket 1921 and the accommodation body 1910 may be covered, thereby implementing the sealing of the chamber 1911.

In the embodiment, the cover 1920 may include the rigid bracket 1921 and the soft cover layer 1922 integrally forming on the surface of the rigid bracket 1921 by injection molding. The rigid bracket 1921 may be mechanically connected to the accommodation body 1910. The soft cover layer 1922 may further provide sealing for the chamber 1911 after the rigid bracket 1921 is connected to the accommodation body 1910. The soft cover layer 1922 may facilitate to fit the gap between the rigid bracket 1921 and the accommodation body 1910, thereby further improving the sealing performance of the electronic component, and improving the waterproof effect of the electronic component. At the same time, the rigid bracket 1921 and the soft cover layer 1922 may integrally form by injection molding, which may simplify the assembly process of the electronic component.

In an embodiment, the rigid bracket 1921 may include an inserting portion 19211 and a covering portion 19212. The covering portion 19212 may be covered in the opening 1912. The inserting portion 19211 may be disposed on one side of the covering portion 19212, and extend into the chamber 1911 along an inner wall of the chamber 1911 to fix the covering portion 19212 on the opening 1912.

In an application scenario, the inserting portion 19211 may be inserted without through the inner wall of the chamber 1911. For example, an insertion portion matching the shape of the inserting portion 19211 of the rigid bracket 1921 may be further disposed inside the chamber 1911 so that the inserting portion 19211 may be inserted with the insertion portion to fix the insertion portion inside the chamber 1911. For example, the shape of the inserting portion 19211 may be a cylinder. The insertion portion may be a cylindrical ring surrounding the insertion portion of the cylinder. As used herein, an inner diameter of the insertion portion of the cylindrical ring may be appropriately less than the outer diameter of the insertion portion of the cylindrical body. Therefore, when the inserting portion 19211 is inserted into the insertion portion, the inserting portion 19211 and the insertion portion may be in the interference fit to allow the bracket 1921 to be stably connected to the chamber 1911. Of course, other insertion manners may also be used as long as the inserting portion 19211 is inserted into the chamber 1911 and fixed to the chamber 1911.

The covering portion 19212 may be disposed on one side of the inserting portion 19211 facing away from the chamber 1911, and cover the opening 1912 after the inserting portion 19211 is inserted into the chamber 1911. As used herein, the covering portion 19212 may be an integral structure, or may be further disposed with some holes according to requirements to implement a function.

Figure 22:
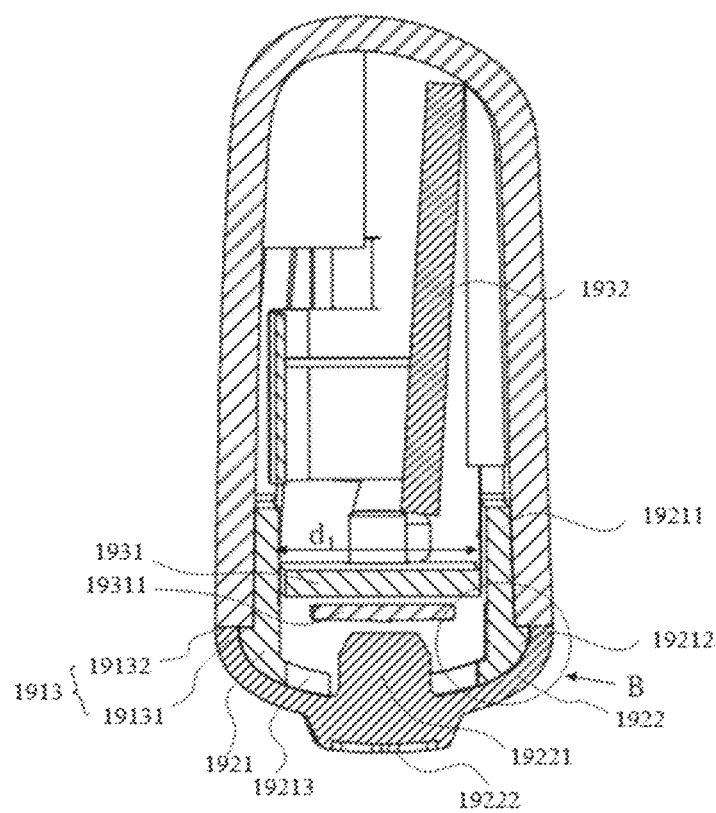
FIG. 22 is a sectional view illustrating an electronic component of a pair of glasses along an A-A axis in FIG. 19 in a combined state according to some embodiments of the present disclosure.

Referring to FIG. 22, FIG. 22 is a sectional view illustrating a speaker along an A-A axis in FIG. 19 in a combined state according to some embodiments of the present disclosure. In an embodiment, the accommodation body 1910 may include an opening edge 1913 for defining the opening 1912. The covering portion 19212 may be pressed on an inner region 19131 of the opening edge 1913 near the opening 1912. The soft cover layer 1922 may cover an outer surface of the covering portion 19212 away from the accommodation body 1910 and be pressed on an outer region 19132 at the outer side of the inner region 19131 of the opening edge 1913 to seal with the opening edge 1913.

As used herein, the inner region 19131 and the outer region 19132 of the opening edge 1913 may both belong to the opening edge 1913, and may not be other regions external to the opening edge 1913. As used herein, the inner region 19131 of the opening edge 1913 may be a region of the opening edge 1913 near the opening 1912. The outer region 19132 of the opening edge 1913 may be a region of the opening edge 1913 away from the opening 1912.

In the embodiment, the covering portion 19212 of the rigid bracket 1921 may be pressed on the inner region 19131 of the opening edge 1913 near the opening 1912. Therefore, the covering portion 19212 may initially seal the opening edge 1913 at first. However, since the accommodation body 1910 and the rigid bracket 1921 are hard materials, the connection between the two and the further coverage of the covering portion 19212 may not have a good sealing effect. A gap may easily form between an end where the covering portion 19212 is pressed on the opening edge 1913 and far from the opening 1912 and the opening edge 1913. The chamber 1911 may further be penetrated via the gap, thereby reducing the sealing performance.

Therefore, in the embodiment of the present disclosure, the soft cover layer 1922 may cover the outer surface of the covering portion 19212 away from the accommodation body 1910, and be further pressed on the outer region 19132 of the periphery of the inner region 19131 of the opening edge 1913. Therefore, the gap forming between the covering portion 19212 and the opening edge 1913 of the rigid bracket 1921 may be further covered. Since the soft cover layer 1922 may be a soft material, the sealing effect of the electronic component may be further improved and the electronic component may have better water resistance.

Figure 23:
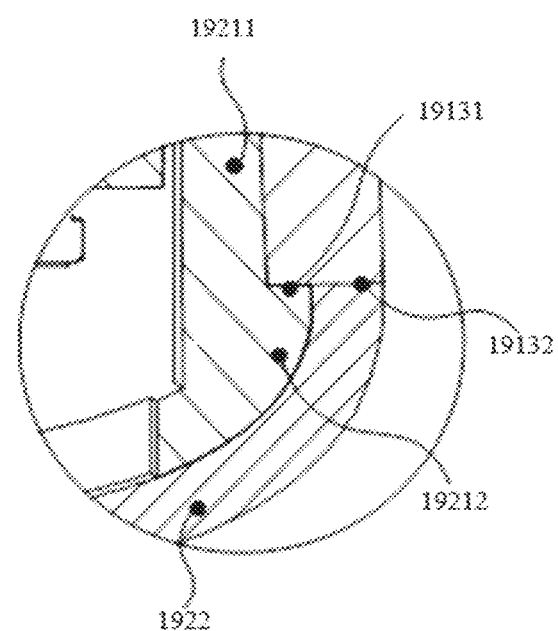
FIG. 23 is an enlarged view illustrating part B in FIG. 22 according to some embodiments of the present disclosure.

Referring to FIG. 23, FIG. 23 is an enlarged view illustrating part B in FIG. 22. In an application scenario, in a covered state of the cover 1920, the periphery of the covering portion 19212 may cover the inner region 19131 of the opening edge 1913 and touch the inner region 19131 of the opening edge 1913. The soft cover layer 1922 may be disposed on the side of the covering portion 19212 away from the accommodation body 1910. Therefore, the covering portion 19212 located at the inner region 19131 of the opening edge 1913 may be sandwiched between the inner region 19131 of the opening edge 1913 and the soft cover layer 1922. The soft cover layer 1922 may further extend in a direction away from the opening 1912 of the covering portion 19212 and a direction towards the opening edge 1913 until it contacts the outer region 19132 of the opening edge 1913. Therefore, a contact end surface of the covering portion 19212 and the opening edge 1913 and a contact end surface of the cover layer 1922 and the opening edge 1913 may be arranged flush with each other. A structure of "opening edge 1913-covering portion 19212-covering layer 1922" may form on the inner region 19131 of the opening edge 1913.

Figure 24:
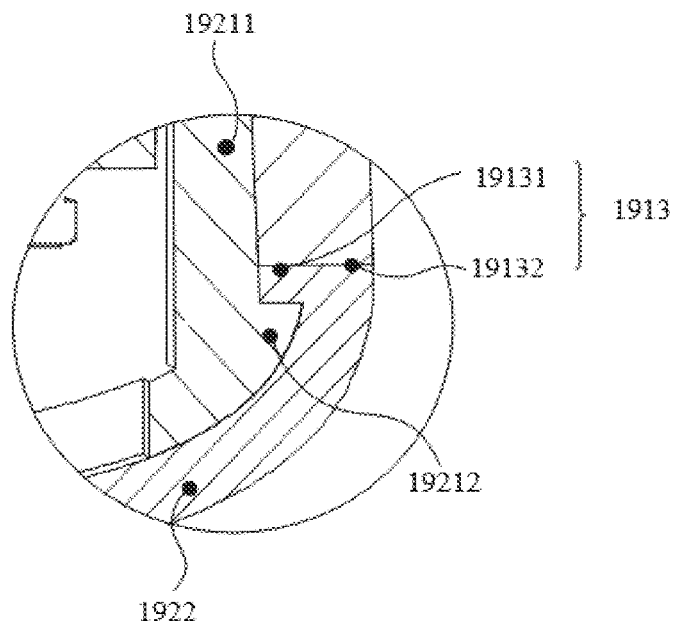
FIG. 24 is a partial sectional view according to some embodiments of the present disclosure.

In another application scenario, referring to FIG. 24, FIG. 24 is a partial sectional view illustrating a speaker according to some embodiments of the present disclosure. In the application scenario, after extending to contact the outer region 19132 of the opening edge 1913, the soft cover layer 1922 may further extend along the region between the covering portion 19212 and the opening edge 1913 to the inner region 19131 of the opening edge 1913. It may be further assumed, between the inner region 19131 of the opening edge 1913 and the covering portion 19212, the covering portion 19212 may be pressed onto the inner region 19131 of the opening edge 1913 to form the structure of "opening edge 1913-soft covering layer 1922-covering portion 19212-soft covering layer 1922". In the application scenario, the soft cover layer 1922 may be further extended between the rigid bracket 1921 and the opening edge 1913 on the basis of the covering portion 19212 covering the rigid bracket 1921, thereby further improving the sealing between the chamber 1911 and cover 1920, and further improving the waterproof effect of the electronic component.

In an embodiment, referring to FIG. 19 to FIG. 24, the speaker may further include a circuit component 1930 disposed inside the chamber 1911. The circuit component 1930 may be disposed with a switch 19311.

In some embodiments, the circuit component 1930 may include a first circuit board 1931. The switch 19311 may be disposed on an outer side of the first circuit board 1931 towards the opening 1912 of the chamber 1911. A count of the switch 19311 may be one or multiple. If the count of the switch 19311 is multiple, the switch 19311 may be disposed on the first circuit board 1931 at intervals. It should be noted that, the first circuit board 1931 may correspond to the first branch circuit board in the above embodiments.

Correspondingly, the rigid bracket 1921 may be disposed with a switch hole 19213 corresponding to the switch 19311. The soft cover layer 1922 may further cover the switch hole 19213. A pressing portion 19221 may be disposed at a position corresponding to the switch hole 19213. The pressing portion 19221 may extend towards the inside of the chamber 1911 through the switch hole 19213. When the corresponding position of the soft cover layer 1922 is pressed, the pressing portion 19221 may press the switch 19311 of the circuit component 1930, thereby triggering the circuit component 1930 to perform a preset function.

As used herein, the pressing portion 19221 disposed on the cover layer 1922 may form when the side of the soft cover layer 1922 towards the rigid bracket 1921 protrudes in a direction facing the switch hole 19213 and the switch 19311. The shape of the pressing portion 19221 may match the switch hole 19213. Therefore, when the corresponding position of the soft cover layer 1922 is pressed, the pressing portion 19221 may pass through the switch hole 19213 and reach the corresponding switch 19311 of the first circuit board 1931. At the same time, the length of the pressing portion 19221 in the direction towards the switch 19311 may be set so that the switch 19311 may not be pressed when the position corresponding to the soft cover layer 1922 is not pressed, and the corresponding switch 19311 may be pressed when the position corresponding to the soft cover layer 1922 is pressed.

In an application scenario, a position of the soft cover layer 1922 corresponding to the pressing portion 19221 may further protrude towards a side facing away from the rigid bracket 1921 to form a convex pressing portion 19222.

Therefore, the user may clarify the position of the switch 19311 and trigger the circuit component 1930 to perform a corresponding function by pressing the corresponding pressing portion 19222.

In some embodiments, the auxiliary function module 204 may be used to receive auxiliary signal(s) and perform auxiliary function(s). The auxiliary function module 204 may be a module different from the earphone core and may be used for receiving the auxiliary signal(s) and performing the auxiliary function(s). Further, the auxiliary function module 204 may be configured to implement one or more functions of an image function, a voice function, an auxiliary control function, and a switch control function. In the present disclosure, the conversion of the audio signal into the sound signal may be considered as a main function of the speaker, and other functions different from the main function may be considered as the auxiliary function(s) of the speaker. For example, the auxiliary function(s) of the speaker 100 may include receiving a user sound and/or an ambient sound through a microphone, controlling a broadcasting process of the sound signal through a key, or the like.

Further, the auxiliary function module(s) may at least include a first auxiliary function module and a second auxiliary function module. The first auxiliary function module may be disposed on the main circuit board 445, and the second auxiliary function module may be disposed on the first branch circuit board 442.

Further, the auxiliary function module(s) may also include a third auxiliary function module. The third auxiliary function module may be disposed on the second branch circuit board.

Specifically, the second auxiliary function module may be a first microphone element 19312. The third auxiliary function module may be a second microphone element 19321. As used herein, the first microphone element 19312 and the second microphone element 19321 may both be MEMS (micro-electromechanical system) microphones, which may have a small working current, a relatively stable performance, and high voice quality.

It should be noted that, the first microphone element 19312 and the second microphone element 19321 may correspond to the microphone 432 in the above embodiments.

In some embodiments, the first microphone and the second microphone may be distributed in the speaker in a specific manner, so that a main sound source (e.g., a human mouth) may be located at a direction that the second microphone element 19321 points to the first microphone element 19312.

Specifically, the first microphone element 19312 may be disposed on one side of the first circuit board 1931 facing the cover 1920, and the second microphone element 19321 may be disposed on one side of a second circuit board 1932 facing the accommodation body.

When the user wears the speaker, distances from the mouth (the main sound source) to the first microphone element 19312 and the second microphone element 19321 may be less than distances from other sound sources (e.g., a noise source) in the environment to the first microphone element 19312 and the second microphone element 19321. The mouth may be considered as a near-field sound source of the first microphone element 19312 and the second microphone element 19321. For near-field sound sources, magnitudes of the sound received by the two sets of microphone elements may be related to the distances between the sound source and the two sets of microphone elements. Since the first microphone element 19312 is closer to the main sound source, the first microphone element 19312 may receive a larger audio signal $V_{J1}$. Since, the second microphone element 19321 is far from the main sound source, the second microphone element 19321 may receive a smaller audio signal $V_{J2}$. That is, $V_{J1}$ may be larger than $V_{J2}$.

Since the noise source in the environment is far away from the first microphone element 19312 and the second microphone element 19321, the noise source in the environment may be considered as a far-field sound source of the first microphone element 19312 and the second microphone element 19321. For far-field sound sources, magnitudes of the noise signals received by the two sets of microphone elements may be similar. That is, $V_{Y1}$ may be equal to $V_{Y2}$.

Therefore, a total sound signal received by the first microphone element 19312 may be:

$$V_1 = V_{J1} + V_{Y1} \qquad (1)$$

A total sound signal received by the second microphone element 19321 may be:

$$V_2 = V_{J2} + V_{Y2} \qquad (2)$$

In order to eliminate the noise in the received sound signal, a differential operation may be performed on the total sound signal of the first microphone element 19312 and the total sound signal of the second microphone element 19321. The differential operation may be as follows:

$$V = V_1 - V_2 = (V_{J1} - V_{J2}) + (V_{Y1} - V_{Y2}) \approx V_{J1} - V_{J2} \qquad (3)$$

Further, according to a differential result of the signals obtained according to formula (3), combining with the distances of the first microphone element 19312 and the second microphone element 19321 relative to the main sound source, actual audio signals obtained by the first microphone element 19312 and/or the second microphone element 19321 from the main sound source may be further obtained. The actual audio signal may be $V_{J1}$ or $V_{J2}$.

Therefore, in order to improve the quality of the finally obtained audio signals, the differential result of the signals obtained according to formula (3) may be as large as possible. That is, $V_{J1}$ may be much larger than $V_{J2}$. In some embodiments of the present disclosure, the effect may be achieved according to the following manners: an installation position of the first microphone element 19312 being as close as possible to the main sound source (e.g., the human mouth); an installation position of the second microphone element 19321 being as far away as possible from the main sound source (e.g., the human mouth); isolating the two microphone elements; disposing a sound barrier between the two microphone elements. It should be noted that all the above manners may achieve the effect of improving the quality of the audio signal, and these manners may be used alone or in combination.

In some embodiments, to make the installation position of the first microphone element 19312 as close as possible to the main sound source (e.g., the human mouth), the first circuit board 1931 and the first microphone element 19312 installed thereon may be disposed to be inclined. In some embodiments, in order to make the installation position of the second microphone element 19321 as far away as possible from the main sound source (e.g., the human mouth), the second circuit board 1932 and the second microphone element 19321 installed thereon may be disposed to be inclined to flexibly adjust an installation distance. At the same time, a corresponding sound guide channel and a sound barrier may be disposed in each installation region of the microphone elements. The specific installation manners may refer to FIGS. 25-29 and the descriptions thereof.

It should be noted that the second circuit board 1932 may be equivalent to the second branch circuit board in the above embodiments.

Figure 25:
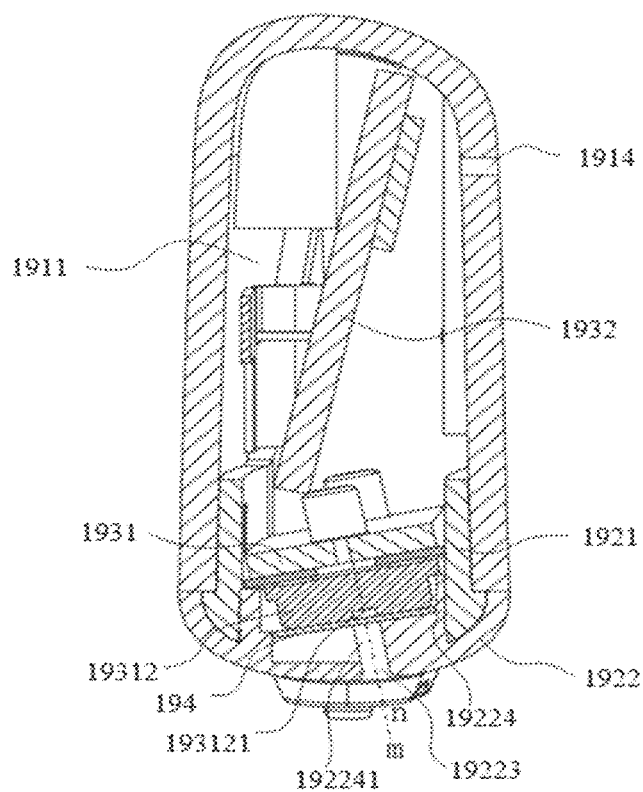
FIG. 25 is a sectional view illustrating an electronic component of a pair of glasses along a B-B axis in FIG. 19 in a combined state according to some embodiments of the present disclosure.
Figure 26:
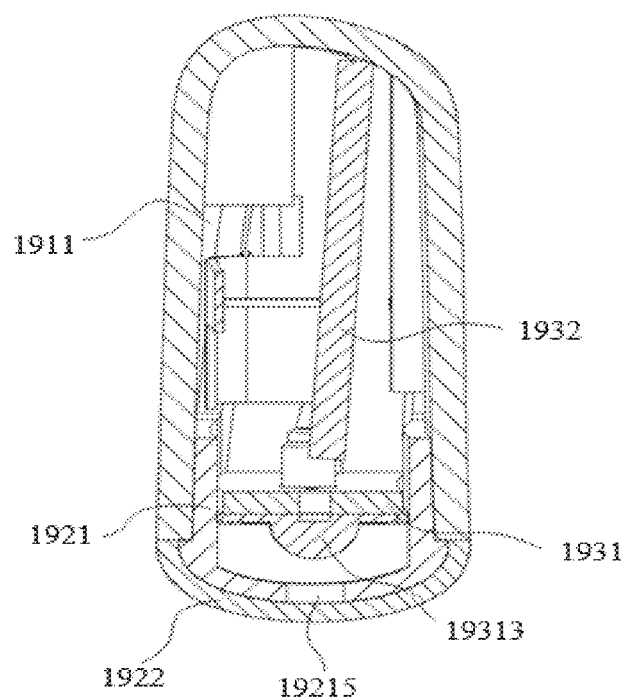
FIG. 26 is a schematic diagram illustrating a first circuit board and a second circuit board having a different included angel from that in FIG. 25 according to some embodiments in the present disclosure.
Figure 27:
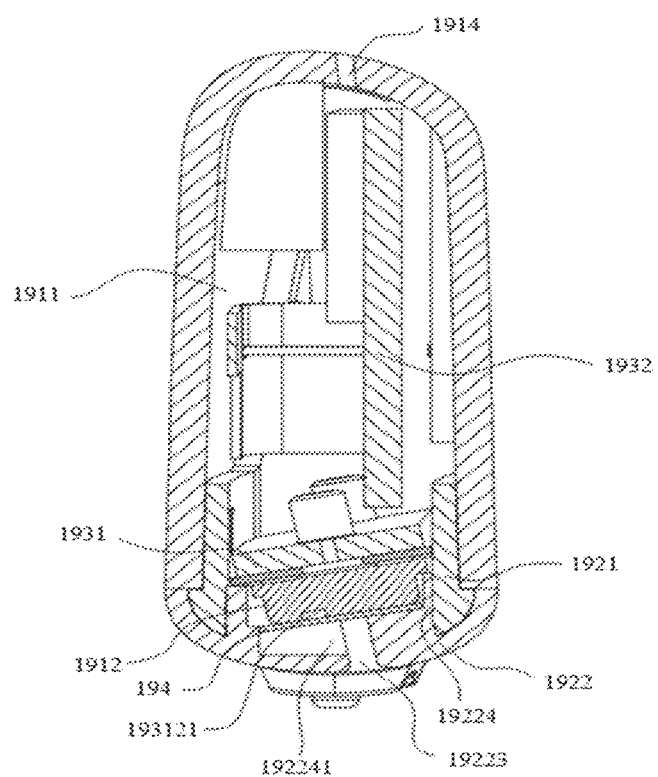
FIG. 27 is a sectional view illustrating an electronic component of a pair of glasses along a C-C axis in FIG. 19 in a combined state according to some embodiments of the present disclosure.

In some embodiments, referring to FIGS. 25 and 26. FIG. 25 is a sectional view illustrating an electronic component in a combined state along a B-B axis in FIG. 19 according to some embodiments in the present disclosure. FIG. 26 is a schematic diagram illustrating a first circuit board and a second circuit board having a different included angel from that in FIG. 25 according to some embodiments in the present disclosure. The first circuit board 1931 may include the first microphone element 19312. Specifically, the first circuit board 1931 may be disposed facing the cover 1920. The first microphone element 19312 may be disposed on one side of the first circuit board 1931 facing the cover 1920. For example, the first microphone element 19312 may be disposed on the first circuit board 1931 spaced from the switch 19311 in the above embodiment. The first microphone element 19312 may be used to receive a sound signal from the outside of the electronic component, and convert the sound signal into an electrical signal for analysis and processing.

Correspondingly, the bracket 1921 may be disposed with a first microphone hole 19214 corresponding to the first microphone element 19312. The soft cover layer 1922 may be disposed with a first sound guiding hole 19223 corresponding to the first microphone hole 19214. The first sound guiding hole 19223 may be disposed corresponding to the first microphone element 19312.

Specifically, the first sound guiding hole 19223 may be disposed on the cover 1920. One end of the first sound guiding hole 19223 may be connected to the first microphone hole 19214 on the cover 1920, and the other end of the first sound guiding hole 19223 may face to the first microphone element 19312, which may shorten a sound guiding distance and improve a sound guiding effect.

Specifically, the first circuit board 1931 may face the cover 1920 in a manner parallel to or inclined to the cover 1920. The first sound guiding hole 19223 may be perpendicular or inclined to a surface of the cover 1920.

In some embodiments, a depth direction of the opening 1912 may be vertical or inclined relative to a bottom of the accommodation body 1910. When the opening 1912 is vertical, the cover 1920 may be horizontal relative to the accommodation body 1910 after being covered. When the opening 1912 is inclined, the cover 1920 may be inclined relative to the accommodation body 1910. The inclination may be inclined toward a side of the mouth of the human body. In this way, the first sound guiding hole 19223 may face the mouth or face of the human more directly, and improve effect of the sound from the main sound source acquired by the microphone element.

Further, when the opening 1912 is inclined, an included angle between a plane of the opening 1912 and a plane of a width direction of the accommodation body may be in a range of 10 to 30 degrees, so that the first sound guiding hole 19223 may further face an area of the human mouth. Specifically, when the opening 1912 is inclined, the included angle between the plane of the opening 1912 and the plane of the width direction of the accommodation body may be any angle within the above range, such as, 10 degrees, 15 degrees, 20 degrees, 23 degrees, 27 degrees, 30 degrees, etc., which may not be specific limitation herein.

Specifically, the first sound guiding hole 19223 may be disposed through the soft cover layer 1922. When the opening 1912 is vertical and the first circuit board 1931 is parallel to the cover 1920, the first sound guiding hole 19223 may be disposed perpendicular to the cover 1920. That is, the first sound guiding hole 19223 may be vertical. When the opening 1912 is vertical and the first circuit board 1931 is inclined to the cover 1920, the first sound guiding hole 19223 may be disposed inclined to the cover 1920. When the opening 1912 is inclined and the first circuit board 1931 is parallel to the cover 1920, the first sound guiding hole 19223 may be disposed perpendicular to the cover 1920. That is, the first sound guiding hole 19223 may be inclined. When the opening 1912 is inclined and the first circuit board 1931 is inclined to the cover 1920, the first sound guiding hole 19223 may also be disposed inclined to the cover 1920. That is, the first sound guiding hole 19223 may be vertical or inclined.

Further, when the first circuit board 131 faces the cover 1920 in a manner inclined to the cover 1920, the included angle between a plane of the first circuit board 1931 and a plane of the cover 1920 may be in a range of 5 to 20 degrees. Specifically, when the first circuit board 1931 faces the cover 1920 in a manner inclined to the cover 1920, the included angle between the plane of the first circuit board 1931 and the plane of the cover 1920 may be any angel within the included angle range, such as, 5 degrees, 8 degrees, 10 degrees, 15 degrees, 20 degrees, etc., which may not be specifically limited herein.

Specifically, the first sound guiding hole 19223 may correspond to the first microphone hole 19214 on the bracket 1921. The first microphone element 19312 may be further communicated with the outside of the speaker. Therefore, the sound outside the speaker may pass through the first sound guiding hole 19223 and the first microphone hole 19214. The sound may be received by the first microphone element 19312.

In order to further improve the effect of the sound guiding, a central axis of the first sound guiding hole 19223 may coincide with a main axis of a sound receiving region 193121 of the first microphone element 19312. The sound receiving region 193121 of the first microphone element 19312 refers to a region (e.g., a diaphragm) on the first microphone element 19312 that receives sound waves. When the central axis of the first sound guiding hole 19223 coincides with the main axis of the sound-receiving area 193121 of the first microphone element 19312, the sound of the main sound source may be acquired by the first microphone hole 19214. The sound may be directly guided to the sound receiving region 193121 of the first microphone element 19312 through the first sound guiding hole 19223. The sound propagation path may be further reduced, which may prevent the main sound source from repeatedly propagating in the chamber to cause loss and echo, and also prevent the main sound source from being transmitted to a region of the second microphone element 1321 through a channel in the chamber. Therefore, the sound effect may be improved.

As used herein, in one embodiment, the cover 1920 may be arranged in a stripe shape. As used herein, a main axis of the first sound guiding hole 19223 and a main axis of the sound receiving region 193121 of the first microphone element 19312 may be coincided with each other in the width direction of the cover 1920. As used herein, the main axis of the sound receiving region 193121 of the first microphone element 19312 refers to a main axis of the sound receiving region 193121 of the first microphone element 19312 in the width direction of the cover 1920, such as an axis n in FIG. 25. The main axis of the first sound guiding hole 19223 may be an axis m in FIG. 25. The axis n may be coincided with the axis m.

Further, the shape of the first sound guiding hole 19223 may be any shape as long as the sound from the outside of the speaker is able to be received by the speaker. In some embodiments, the first sound guiding hole 19223 may be a circular hole having a relatively small size, and disposed in a region of the cover layer 1922 corresponding to the microphone hole 19214. The first sound guiding hole 19223 with the small size may reduce the communication between the first microphone element 19312 or the like in the speaker and the outside, thereby improving the sealing of the speaker.

Further, in order to guide the sound signal entered from the first sound guiding hole 19223 to the first microphone element 19312, the sound guiding channel 192241 may be disposed with a curved shape.

Specifically, in an application scenario, the main axis of the first sound guiding hole 19223 may be disposed in the middle of the cover 1920 in the width direction of the cover 1920.

At the same time, the soft cover 1922 of the cover 1920 may also be disposed with a first sound blocking member 1224 corresponding to first sound guiding hole 19223. The first sound blocking member 1224 may extend towards the inside of the chamber 1911 via the microphone hole 1214 to restrict the sound to be transmitted along a transmission direction to the first microphone element 19312. A sound guiding channel 12241 may be defined. One end of the sound guiding channel 192241 may be in communication with the first sound guiding hole 19223 of the soft cover layer 1922. The first microphone element 19312 may be inserted into the sound guiding channel 192241 from another end of the sound guiding channel 192241.

As used herein, when the speaker further includes the switch 19311 in the above embodiment, the switch hole 19213 and the first microphone hole 19214 may be arranged on the rigid bracket 1921 at intervals.

Further, an interval distance between the switch hole 19213 and the first microphone hole 19214 may be in a range of 10 to 20 millimeters, and specifically may also be 10 millimeters, 15 millimeters, 20 millimeters, etc.

Correspondingly, the first sound blocking member 19224 may extend to the periphery of the first microphone element 19312 from the soft cover layer 1922, through the periphery of the first sound guiding hole 19223, the microphone hole 19214, and the inside of the chamber 1911 to form the sound guiding channel 192241 from the first sound guiding hole 19223 to the first microphone element 19312. Therefore, the sound signal of the electronic component entering the sound guiding hole may directly reach the first microphone element 19312 through the sound guiding channel 192241.

Specifically, a shape of the sound guiding channel 192241 in a section perpendicular to the length direction may be the same as or different from the shape of the microphone hole 19214 or the first microphone element 19312. In an application scenario, the sectional shapes of the microphone hole 19214 and the first microphone element 19312 in a direction perpendicular to the bracket 1921 towards the chamber 1911 may be square. The size of the microphone hole 19214 may be slightly larger than the outer size of the sound guiding channel 192241. The inner size of the sound guiding channel 192241 may not be less than the outer size of the first microphone element 19312. Therefore, the sound guiding channel 192241 may pass through the first sound guiding hole 19223 to reach the first microphone element 19312 and be wrapped around the periphery of the first microphone element 19312.

Through the way described above, the soft cover layer 1922 of the speaker may be disposed with the first sound guiding hole 19223 and the sound guiding channel 192241 passing from the periphery of the first sound guiding hole 19223 through the microphone hole 19214 to reach the first microphone element 19312 and wrapped around the periphery of the first microphone element 19312. The sound guiding channel 192241 may be disposed so that the sound signal entering through the first sound guiding hole 19223 may reach the first microphone element 19312 via the first sound guiding hole 19223 and be received by the first microphone element 19312. Therefore, the leakage of the sound signal in the transmission process may be reduced, thereby improving the efficiency of receiving the electronic signal by the speaker.

In an application scenario, the speaker may also include a waterproof mesh cloth 194 disposed inside the sound guiding channel 192241. The waterproof mesh cloth 194 may be held against the side of the soft cover layer 1922 towards the microphone element by the first microphone element 19312 and cover the first sound guiding hole 19223.

Specifically, the bracket 1921 may protrude at a position of the bracket 1921 close to the first microphone element 19312 in the sound guiding channel 192241 to form a convex surface opposite to the first microphone element 19312. Therefore, the waterproof mesh 194 may be sandwiched between the first microphone element 19312 and the convex surface, or directly adhered to the periphery of the first microphone element 19312, and the specific setting manner may not be limited herein.

In addition to the waterproof function for the first microphone element 19312, the waterproof mesh cloth 194 in the embodiment may also have a function of sound transmission, etc., to avoid adversely affecting the sound receiving effect of a sound receiving region 193121 of the first microphone element 19312.

It should be noted that, due to the setting requirements of the circuit component 1930, the first microphone element 19312 may be disposed at a first position of the first circuit board 1931. When the first sound guiding hole 19223 is disposed, the first sound guiding hole 19223 may be disposed at a second position of the cover 1920 due to the aesthetic and convenient requirements. In the embodiment, the first position and the second position may not correspond in the width direction of the cover 1920. Therefore, the main axis of the first sound guiding hole 19223 and the main axis of the sound receiving region 193121 of the first microphone element 19312 may be spaced from each other in the width direction of the cover 1920. Therefore, the sound input via the first sound guiding hole 19223 may not reach the sound receiving region 193121 of the first microphone element 19312 along a straight line.

In some embodiments, the cover 1920 may be a portion of the outer housing of the speaker. In order to meet the overall aesthetic requirements of the speaker, the first sound guiding hole 19223 may be disposed in the middle in the width direction of the cover 1920. Therefore, the first sound guiding hole 19223 may look more symmetrical and meet the visual requirements of people.

In some scenarios, the corresponding sound guiding channel 192241 may be disposed with a stepped shape in a section along the B-B axis in FIG. 19. Therefore, the sound signal introduced by the first sound guiding hole 19223 may be transmitted to the first microphone element 19312 through the stepped sound guiding channel 192241 and received by the first microphone element 19312.

Further, referring to FIG. 23, FIG. 23 is a sectional view illustrating an electronic component in a combined state along a C-C axis in FIG. 19 according to the present disclosure. In some embodiments, the speaker may further include a light emitting element 19313. Specifically, the light emitting element 19313 may be disposed on the first circuit board 1931 of the circuit component 1930 to be accommodated inside the chamber 1911. For example, the light emitting element 19313 may be disposed on the first circuit board 1931 in an arrangement together with the switch 19311 and the first microphone element 19312 in the embodiment. It should be noted that the circuit component 1930 may be equivalent to the control circuit in the above embodiments.

Correspondingly, the rigid bracket 1921 may be disposed with a light emitting hole 19215 corresponding to the light emitting element 19313. The soft cover layer 1922 may cover the light emitting hole 19215. The thickness of a region of the soft cover layer 1922 corresponding to the light emitting hole 19215 may be set to allow a light emitted by the light emitting element 19313 to be transmitted through the soft cover layer 1922.

As used herein, the light emitting element 19313 may include a light emitting diode, etc. A count of the light emitting element 19313 may be one or multiple. A count of the light emitting holes 19215 on the rigid bracket 1921 may be the same as that of the light emitting elements 19313. When the count of the light emitting elements 19313 is multiple, the light emitting elements 19313 may correspond to different light emitting holes 19215. Therefore, different signals may be transmitted through the different light emitting elements 19313.

In the embodiment, the soft cover layer 1922 may still transmit the light emitted from the light emitting element 19313 to the outside of the speaker in a manner under a condition that the cover layer 1922 covers the light emitting hole 19215.

Specifically, in an application scenario, the thickness of the soft cover layer 1922 corresponding to the entire region or a portion of the region of the light emitting hole 19215 may be set to be less than the thickness of the soft cover layer 1922 corresponding to a region of the periphery of the light emitting hole 19215. Therefore, the light emitted by the light-emitting element 19313 may pass through the light emitting hole 19215 and be transmitted through the soft cover layer 1922. Of course, other manners may be also adopted to make a region where the soft cover layer 1922 covers the light emitting hole 19215 may transmit the light through the soft cover layer 1922, and be not specifically limited herein. For example, a window may be disposed on the soft cover layer 1922 corresponding to the entire region or a portion of the region of the light emitting hole 19215. The window may be covered with a layer of transparent or light transmitting material (e.g., thin film, quartz, etc.), so that light emitted by the light emitting element 19313 may pass through the light emitting hole 19215 and be further transmitted through the window.

In some embodiments, on the basis of covering the light emitting hole 19215 corresponding to the light emitting element 19313, the soft cover layer 1922 may be further disposed to enable to transmit the light emitted by the light emitting element 19313 through the cover layer 1922 to the outside of the electronic component. Therefore, the light emitting element 19313 may be sealed by the soft cover layer 1922 without affecting the light emitting function of the electronic component, so as to improve the sealing and waterproof performance of the electronic component.

Specifically, in an embodiment, the rigid bracket 1921 may further include a light blocking member 19216 extending toward the inside of the chamber 1911 and disposed on the periphery of the light emitting hole 19215. The light blocking member 19216 may limit the transmission direction of the light generated by the light emitting element 19313.

As used herein, a shape of the light emitting hole 19215 may be any shape that may transmit the light emitted by the light emitting element 19313, such as, a circle, a square, a triangle, etc. In this embodiment, the shape of the light emitting hole 19215 may be a circle.

Since there is still a certain distance between the light emitting element 19313 and the light emitting hole 19215, a portion of the light emitted by the light emitting element 19313 may leak out before the light reaches the light emitting hole 19215 if without a restriction. Therefore, the light may not be transmitted to the light emitting hole 19215 effectively, which may reduce a brightness of the light that may be seen from the outside of the speaker, thereby making it inconvenient for the user to receive signals. The arrangement of the light blocking member 19216 in this embodiment may limit the transmission direction of the light generated by the light emitting element 19313 so as to reduce light leakage, thereby increasing the brightness of the light transmitted through the light emitting hole 19215.

Specifically, the light blocking member 19216 in this embodiment may be partially or entirely formed by the rigid bracket 1921. For example, the rigid bracket 1921 may extend along the periphery of the light emitting hole 19215 toward the inside of the chamber 1911 and surround the light emitting element 19313. In such cases, a light channel for light propagation may be formed. Through the light channel, the light generated by the light emitting element 19313 may propagate directly to the light emitting hole 19215 along a direction of the light channel. Alternatively, the rigid bracket 1921 may not include the light channel. The propagation of light may be limited from one direction or several directions by the rigid bracket 1921. For example, the rigid bracket 1921 may extend into the chamber 1911 from one side of the light emitting hole 19215 to form the light blocking member 19216 that blocks the light emitting element 19313 on one side. In some embodiments, the rigid bracket 1921 may further cooperate with other components to limit the propagation of light. For example, the rigid bracket 1921 may extends into the chamber 1911 from one side of the light emitting hole 19215 to form the light blocking member 19216 that blocks the light emitting element 19313 on one side, and the light blocking member 19216 may further cooperate with the inner wall of the chamber 1911 or other structures of the rigid bracket 1921 to limit the transmission direction of the light generated by the light emitting element 19313 from multiple directions.

In an application scenario, the light emitting element 19313 and the first microphone element 19312 may be adjacently disposed on the first circuit board 1931, and the corresponding light emitting holes 19215 and the first microphone holes 19214 may be disposed on the rigid bracket 1921 at intervals. As described in the above embodiments, the first sound blocking member 19224 formed by the soft cover layer 1922 that defines the sound guide channel 192241 may be disposed on the periphery of the first microphone element 19312. The first sound blocking member 19224 may be disposed through the first microphone hole 19214. Then the first microphone element 19312 and the light emitting element 19313 may be arranged at intervals, and the first microphone hole 19214 and the light emitting hole 19215 may be arranged at intervals.

Specifically, in this application scenario, the light blocking member 19216 formed by the rigid bracket 1921 may cooperate with one side wall of the first sound blocking member 19224 close to the light emitting element 19313, which may jointly limit the transmission direction of the light generated by the light emitting element 19313.

In another application scenario, the chamber 1911 may be arranged in a stripe shape on a cross section in a direction perpendicular to the opening 1912. Correspondingly, the rigid bracket 1921 may also be arranged in a stripe shape and inserted into the chamber 1911 through the opening 1912 via the inserting portion 19211, thereby forming a mechanical connection with the chamber 1911. The inserting portions 19211 may be disposed on both sides of the length direction of the rigid bracket 1921, so that the light emitting element 19313 may include the corresponding inserting portions 19211 of the rigid bracket 1921 on both sides of the length direction of the rigid bracket 1921. In such cases, the light on both sides of the light emitting element 19313 may be limited. Further, in this application scenario, the light blocking member 19216 may be further disposed on one side of the light emitting element 19313 perpendicular to the length direction of the rigid bracket 1921, and a side wall of the first sound blocking member 19224 may be disposed on another side of the light emitting element 19313 perpendicular to the length direction of the rigid bracket 1921. The light blocking member 19216 and the first sound blocking member 19224 may be plates parallel to each other, and further cooperate with the inserting portions 19211 on both sides of the light emitting element 19313 to limit the transmission direction of the light generated by the light emitting element 19313.

In an embodiment, the circuit component 1930 in the speaker may include the first circuit board 1931 of the speaker in the above embodiments. The circuit component 1930 may further include the second circuit board 1932. See, e.g., FIG. 19, FIG. 22, FIG. 25, and FIG. 26.

It should be noted that the second circuit board 1932 may be equivalent to the second branch circuit board in the above embodiment.

Specifically, the second circuit board 1932 may be disposed facing the accommodation body 1910. The second circuit board 1932 may be disposed in the chamber 1911 inclined to the first circuit board 1931. The second microphone element 19321 may be disposed on one side of the second circuit board 1932 facing the accommodation body 1910.

The second microphone element 19321 may be disposed facing the side wall of the accommodation body 1910, so that there is a large space near the second microphone element 19321, which may be convenient for providing functional components corresponding to the second microphone element 19321 on the accommodation body 1910. In addition, the second circuit board 1932 may be disposed inclined to the first circuit board 1931. The functional components on the two circuit boards may be disposed in a staggered manner, which may also reduce a distance between the functional components, thereby saving and compressing an internal space of the speaker.

As used herein, a second sound guiding hole 1914 may be further disposed on a side wall of the accommodation body 1910 opposite to the cover 1920 or the first sound guiding hole 19223.

The second sound guiding hole 1914 may be correspondingly disposed on the side wall of the accommodation body 1910. The second sound guiding hole 1914 and the first sound guiding hole 19223 may be away from each other. In some embodiments, the opening 1912 of the accommodation body 1910 may be an inclined opening. The cover 1920 may be inclined relative to the accommodation body 1910. The side wall of the accommodation body 1910 opposite to the first sound guiding hole 19223 may be a side surface on one side of the chamber 1911. The second sound guiding hole 1914 may be disposed on a side surface on one side wall of the accommodation body 1910. Further, the second sound guiding hole 1914 may be disposed on the side surface on one side of the accommodation body 1910, a distance between the second sound guiding hole 1914 and a top of the accommodation body 1910 may be in a range of 3 millimeters to 6 millimeters. Specifically, the distance may be 3 millimeters, 4 millimeters, 5 millimeters, 6 millimeters, etc.

In some embodiments, when a depth direction of the opening 1912 of the accommodation body 1910 is vertical relative to a bottom of the accommodation body, the cover 1920 may be horizontally disposed relative to the accommodation body 1910. The side wall of the accommodation body 1910 opposite to the first sound guiding hole 19223 may be a top of the chamber 1911. The second sound guiding hole 1914 may be disposed on the top of the accommodation body 1910. Further, the second sound guiding hole 1914 may be disposed at a middle position of the top of the accommodation body 1910.

According to the above manners, the second sound guiding hole 1914 may be disposed away from the main sound source, which may reduce the sound received by the second sound guiding hole 1914 from the main sound source, thereby increasing a ratio of environmental noise received by the second sound guiding hole 1914, and improving a noise reduction effect.

As described in the above embodiments of the speaker of the present disclosure, the cover 1920 may include the first sound guiding hole 19223 corresponding to the first microphone element 19312 and the first microphone hole 19214. As used herein, the first microphone element 19312 may be configured to receive sound input through the first sound guiding hole 19223. The second microphone element 19321 may be configured to receive sound input through the second sound guiding hole 1914.

Further, a central axis of the second sound guiding hole 1914 may coincide with a main axis of a sound receiving region of the second microphone element 19321.

When the central axis of the second sound guiding hole 1914 coincides with the main axis of the sound receiving region of the second microphone element 19321, noises may be directly guided to the sound receiving region of the second microphone element 19321 through the second sound guiding hole 1914, thereby reducing noise propagation inside the chamber 1911. At the same time, the noises may be directly guided to the sound receiving region 193121 of the first microphone element 19312 through the first sound guiding hole 19223. Noises received by the first microphone element 19312 may be approximately the same as that received by the second microphone element 19321, which may be beneficial to eliminate noises in a subsequent processing and improve the quality of the main sound source.

In some embodiments, the central axis of the second sound guiding hole 1914 may coincide with or be parallel to a central axis of the first sound guiding hole 19223.

The second sound guiding hole 1914 and the first sound guiding hole 19223 may have a same central axis direction. That is, their central axes may coincide or be parallel. In addition, a sound entrance of the second sound guiding hole

1914 and a sound entrance of the first sound guiding hole 19223 may face opposite directions. Therefore, the sound from the main sound source received by the second sound guiding hole 1914 may be reduced, which may be beneficial to eliminate the noises in the subsequent processing and improve the quality of the main sound source.

In some embodiments, the main axis of the sound receiving region of the second microphone element 19321 may coincide with or be parallel to the main axis of the sound receiving region 193121 of the first microphone element 19312. The sound receiving region of the second microphone element 19321 may receive the sound signal through the second sound guiding hole 1914. The sound receiving region 193121 of the first microphone element 19312 may receive the sound signal through the first sound guiding hole 19223. Since the main sound source signal through the second sound guiding hole 1914 is small, the main sound source signal received by the sound receiving region of the second microphone element 19321 may be small, which may improve the quality of the sound signal.

In some embodiments, the first circuit board 1931 may be disposed parallel to an opening plane of the opening 1912 and close to the opening 1912. Optionally, the first circuit board 1931 may also be disposed inclined to the opening plane of the opening 1912 and close to the opening 1912. Further, the switch 19311, the light emitting element 19313, etc. as described above may be further disposed on the first circuit board 1931. The switch 19311, the light emitting element 19313, the first microphone element 19312, etc. may be disposed on the first circuit board 1931 in a certain manner. Correspondingly, the switch hole 19213, the light emitting hole 19215, the first microphone hole 19214, etc. may be separately disposed on the cover 1920, so as to transmit signals to the outside of the speaker through the corresponding holes.

Further, the first microphone hole 19214 may be disposed at a center of the cover 1920. The switch hole 19213 and the light emitting hole 19215 may be disposed on both sides of the first microphone hole 19214 in a length direction of the cover 1920, respectively. A distance between the switch hole 19213 and the first microphone hole 19214 and a distance between the light emitting hole 19215 and the first microphone hole 19214 may be in a range of 5 to 10 millimeters. Specifically, the distance may be 5 millimeters, 6 millimeters, 7 millimeters, 8 millimeters, 9 millimeters, 10 millimeters, etc. The distance between the switch hole 19213 and the first microphone hole 19214 and the distance between the light emitting hole 19215 and the first microphone hole 19214 may be the same or different.

In some embodiments, the accommodation body 1910 may extend from the opening 1912 in a direction perpendicular to the opening plane to form a chamber 1911 having a certain width. The second circuit board 1932 may be disposed parallel to the width direction of the chamber 1911 and perpendicular to the opening plane. Alternatively, the second circuit board 1932 may also be disposed inclined to the width direction of the chamber 1911 and inclined to the plane of the opening 1912. The second circuit board 1932 may be disposed in the chamber 1911 inclined to the first circuit board 1931. As used herein, the second circuit board 1932 may be further disposed with a main control chip, an antenna, etc.

In some embodiments, the second circuit board 1932 may be inclined to the width direction of the chamber 1911 and inclined to the opening plane of the opening 1912. An included angle between the second circuit board 1932 and a width direction of the chamber 1911 may be in a range of 5 to 20 degrees. Specifically, the included angle between the second circuit board 1932 and the width direction of the chamber 1911 may be any angle within the range, such as, 5 degrees, 10 degrees, 15 degrees, 20 degrees, etc., which may not be specifically limited herein.

In an application scenario, when the user uses the speaker, the main axis of the sound receiving region of the second microphone element 19321 may coincide with the main axis of the sound receiving region 193121 of the first microphone element 19312. The first microphone element 19312 and the second microphone element 19321 may be in line with the mouth of the user.

In this embodiment, the first microphone element 19312 and the second microphone element 19321 may be respectively disposed on the two circuit boards. The two microphone elements may receive sound signals through the first sound guiding hole 19223 and the second sound guiding hole 1914, respectively. One of the microphone elements may be used to receive main sounds, such as, human voices. The other microphone element may have a function of collecting background noises, which may facilitate a collection of ambient noises. The two microphone elements may cooperate to analyze and process the received sound signals, which may reduce noises in the received sound signals, thereby improving the quality of sound signal.

Further, as shown in FIG. 25 and FIG. 26, FIG. 26 is a schematic diagram illustrating a structure of a speaker in a combined state with a different included angle from FIG. 25 according to some embodiments of the present disclosure. The first circuit board 1931 and the second circuit board 1932 may be disposed inclined to each other in the same chamber 1911, which may make installation manners of the two circuit boards more flexible. The included angle between the two circuit boards may be adjusted according to sizes and positions of the electronic components on the two circuit boards. Therefore, a space utilization of the speaker may be improved. When the arrangement is applied in the speaker, the space in the speaker may be saved so as to achieve a thinner speaker.

Further, the included angle between the first circuit board 1931 and the second circuit board 1932 may be in a range of 50 to 150 degrees. The specific included angle between the first circuit board 1931 and the second circuit board 1932 may be any angle within the range, such as, 70 degrees, 80 degrees, 90 degrees, 100 degrees, 110 degrees, etc.

Specifically, in an application scenario, the opening 1912 and the cover 1920 may be disposed in corresponding stripe shapes. A shape of the first circuit board 1931 may match a shape of the opening 1912. A width di of the first circuit board 1931 may be not greater than a size of the opening plane along the width direction of the opening 1912, so that the first circuit board 1931 (parallel or inclined to the opening plane) may be accommodated in a position near the opening 1912 in the chamber 1911. That is, the first circuit board 1931 may also be disposed in a stripe shape. Correspondingly, the switch 19311, the light emitting element 19313, and the first microphone element 19312 may be disposed on the first circuit board 1931 at intervals along the length direction of the first circuit board 1931 (e.g., the length direction of the cover 1920).

In some embodiments, the second microphone element 13921 may be a bone conduction microphone. The bone conduction microphone may extend out of the accommodation body 1910 through the second sound guiding hole 1914. The bone conduction microphone may be installed on a side wall on one side of the accommodation body 1910. The side wall may fit a body of the user when the user wears the speaker, so that the bone conduction microphone may better receive the vibration signal of the main sound source. When the user wears the speaker for voice input, the second microphone element 19321 may mainly collect the vibration signals of the main sound source. The vibration signals may be compared with the sound signals (including audio signals and noise) collected by the first microphone element 19312 (air conduction). In some embodiments, the sound signals collected by the first microphone element 19312 may be optimized based on the comparison result to obtain high-quality audio signals.

In some embodiments, the component body may include the second sound guiding hole 1914 through the side wall of the chamber 1911. A second sound blocking member 1915 may be disposed at a position corresponding to the second sound guiding hole 1914. The second sound blocking member 1915 may extend toward the inside of the chamber 1911 through the second sound guiding hole 1914 to limit the transmission direction of sound to the second microphone element 19321.

Specifically, in this embodiment, the second sound guiding hole 1914 corresponding to the second microphone element 19321 may be disposed on the component body and penetrate the chamber 1911 such that the second microphone element 19321 may communicate with the outside. Then the second microphone element 19321 may receive external sound signals.

As used herein, the second sound blocking member 1915 may be made of a hard material or a soft material. For example, the accommodation body 1910 may extend from an inner side of the chamber 1911 to the inside of the chamber 1911 along the periphery of the second sound guiding hole 1914 to from the second sound blocking member 1915. In this embodiment, the second sound blocking member 1914 may be formed by a soft rubber that is integrally injected with the accommodation body 1910. The soft rubber may extend from the inner side of the chamber 1911 to the inside of the chamber 1911 along the periphery of the second sound guiding hole 1914. In an application scenario, the second sound blocking member 1915 may extend into the inside of the chamber 1911 along the periphery of the second sound guiding hole 1914, extend to the second microphone element 19321, and then surround the sound receiving region of the second microphone element 19321. Then a channel connecting the second sound guiding hole 1914 and the second microphone element 19321 may be formed, so that the external sound signal input to the second sound guiding hole 1914 may be directly received by the sound receiving region of the second microphone element 19321 through the channel. In another application scenario, the second sound blocking member 1915 may not completely surround the periphery of the second sound guiding hole 1914, but only extend into the inside of the chamber 1911 along one or two sides of the second sound guiding hole 1914 and extend to the second microphone element 19321. The sound input from the second sound guiding hole 1914 may be guided and propagate to the second microphone element 19321, and be received by the sound receiving region of the second microphone element 19321.

It should be noted that the above description of the dual microphone module of the speaker may be only specific examples and should not be considered as the only feasible implementation. Obviously, for those skilled in the art, after understanding the basic principles of the dual microphone module of the speaker, it may be possible to make various modifications and changes in the form and details of the specific method and operation of implementing the dual microphone module of the speaker without departing from these principles, but these modifications and changes may still be within the scope described above. For example, the dual microphone module may also include an audio signal processing component. The audio signal processing component may compare the vibration signals of the main sound source collected by the second microphone element 1321 with the sound signals (including audio signals and noises) collected by the first microphone element 1312 (air conduction). Based on the comparison result, the sound signals collected by the first microphone element 1312 may be optimized to obtain high-quality audio signals. All such modifications may be within the protection scope of the present disclosure.

Referring to FIGS. 19-21, in some embodiments, the electronic component (also referred to as "circuit housing" or "component body") may include the accommodation body 1910 and the cover 1920. As used herein, the accommodation body 1920 may include the chamber 1911 having at least one opening 1912. The cover 1920 may cover the opening 1912 of the chamber 1911 and seal the chamber 1911. The electronic component in this embodiment may be consistent with the component body in the above embodiments.

The electronic component in the present disclosure may be applied to an electronic device. As used herein, the electronic device may be any electronic device that requires to seal an inner structure, such as earphones, MP3 players, hearing aids, mobile phones, tablet computers, or glasses with circuit components or electronic devices, etc., and be not specifically limited herein. In some embodiments, the electronic component may be disposed on the glasses temple 15 in FIG. 7. In some embodiments, the electronic component may also be referred to as a circuit housing.

In some embodiments, the accommodation body 1910 may be at least a portion of the electronic device (e.g., the speaker).

In some embodiments, the circuit component may correspond to the control circuit in FIG. 2.

Figure 28:
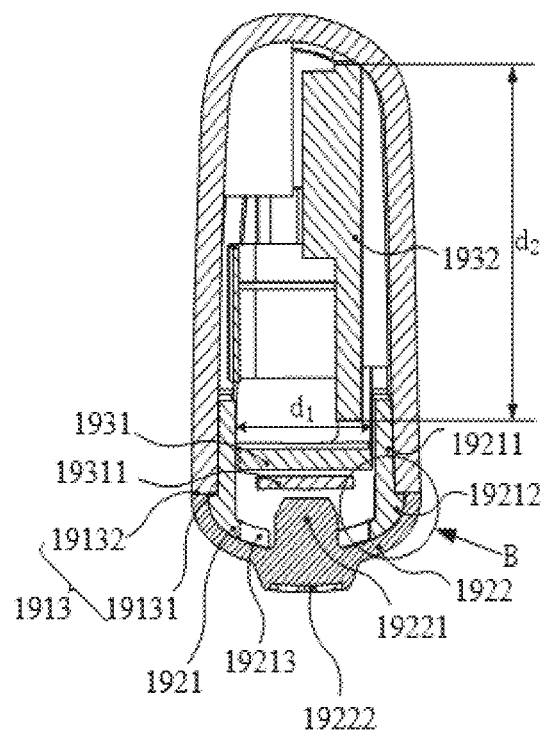
FIG. 28 is a sectional view illustrating an electronic component of a pair of glasses along an A-A axis in FIG. 19 in a combined state according to some embodiments of the present disclosure.

FIG. 28 is a sectional view illustrating an electronic component of electronic component along an A-A axis in FIG. 19 in a combined state according to some embodiments of the present disclosure. As shown in FIG. 28, in some embodiments, the accommodation body 1910 may include an opening edge 1913 for defining the opening 1912. The covering portion 19212 may be pressed on an inner region 19131 of the opening edge 1913 near the opening 1912. The cover layer 1922 may cover an outer surface of the covering portion 19212 away from the accommodation body 1910 and be pressed on an outer region 19132 at the outer side of the inner region 19131 of the opening edge 113 to seal with the opening edge 1913.

Figure 29:
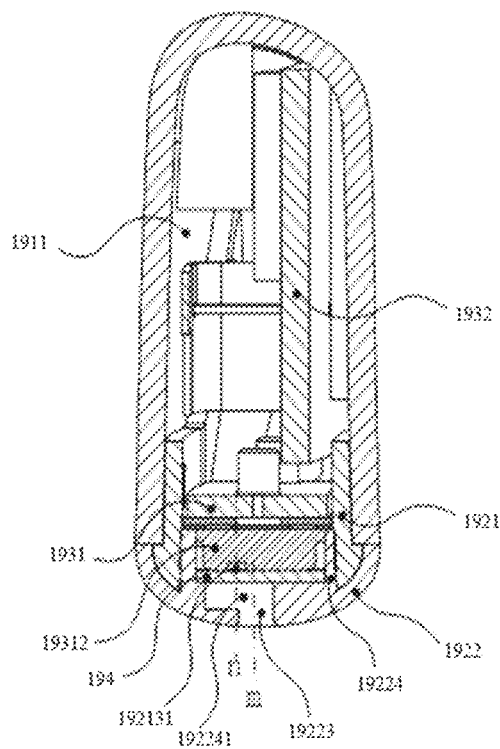
FIG. 29 is a sectional view illustrating an electronic component of a pair of glasses along a B-B axis in FIG. 19 in a combined state according to some embodiments of the present disclosure.

FIG. 29 is a sectional view illustrating an electronic component in a combined state along a B-B axis in FIG. 19 according to the present disclosure. As shown in FIG. 29, the electronic component may include a first microphone element 19312. In some embodiments, the first microphone element 19312 may also be disposed on the first circuit board 1931 of the circuit component 1930 to be accommodated inside the chamber 1911. For example, the first microphone element 19312 may be disposed on the first circuit board 1931 spaced from the switch 19311 in the embodiment. The first microphone element 19312 may be used to receive a sound signal from the outside of the electronic component, and convert the sound signal into an electrical signal for analysis and processing.

In some embodiments, the bracket 1921 may be disposed with the microphone hole 19214 corresponding to the first microphone element 19312. The cover layer 1922 may be disposed with the first sound guiding hole 19223 corresponding to the microphone hole 19214. The first sound blocking member 19224 may be disposed at a position corresponding to the microphone hole 19214. The first sound blocking member 19224 may extend towards the inside of the chamber 1911 via the microphone hole 19214 and define the sound guiding channel 192241.

In some embodiments, the first sound guiding hole 19223 may be disposed through the cover layer 1922 and correspond to the position of the first microphone element 19312. The first sound guiding hole 19223 may correspond to the microphone hole 19214 of the bracket 1921, and further communicate the first microphone element 19312 with the outside of the electronic component. Therefore, a sound from the outside of the electronic component may be received by the first microphone element 19312 via the first sound guiding hole 19223 and the microphone hole 19214.

It should be noted that the above description of the glasses may be only specific examples and should not be considered as the only feasible implementation. Obviously, for those skilled in the art, after understanding the basic principles of glasses, it may be possible to make various modifications and changes in the form and details of the specific method and operation of implementing the glasses without departing from these principles, but these modifications and changes may still be within the scope described above. For example, the count of the at least one opening 1912 may be one, or multiple, and be not limited herein. As another example, in some embodiments, the count of the switches 19311 may be one or multiple. If the count of the switches 19311 is multiple, the switches 19311 may be disposed on the first circuit board 1931 at intervals. All such modifications may be within the protection scope of the present disclosure.

Figure 30:
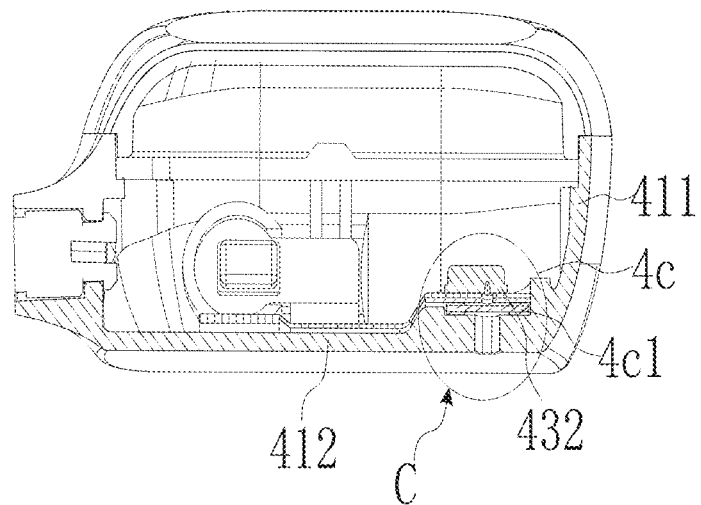
FIG. 30 is a sectional view illustrating a partial structure of a speaker of a pair of glasses according to some embodiments of the present disclosure.

FIG. 2 is a partial structural diagram illustrating a speaker according to an embodiment of the present disclosure. FIG. 3 is an exploded diagram illustrating a partial structure of a speaker according to an embodiment of the present disclosure. FIG. 30 is a sectional view illustrating a partial structure of a speaker according to an embodiment of the present disclosure.

Referring to FIG. 2 and FIG. 3, in some embodiments, an auxiliary function module may include a microphone 432. The count of the microphones 432 may include two, i.e., a first microphone 432*a* and a second microphone 432*b*. As used herein, the first microphone 432*a* and the second microphone 432*b* may both be MEMS (micro-electromechanical system) microphone 432 which may have a small working current, relatively stable performance, and high voice quality. The two microphones 432 may be disposed at different positions of a flexible circuit board 44 according to actual requirements.

In some embodiments, the flexible circuit board 44 may be disposed in the speaker in FIG. 1. The flexible circuit board 44 may correspond to, such as, the flexible circuit board 106 in FIG. 1. The flexible circuit board 44 may include a main circuit board 441, and a branch circuit board 442 and a branch circuit board 443 connected to the main circuit board 441. The branch circuit board 442 may extend in the same direction as the main circuit board 441. The first microphone 432*a* may be disposed on one end of the branch circuit board 442 away from the main circuit board 441. The branch circuit board 443 may extend perpendicular to the main circuit board 441. The second microphone 432*b* may be disposed on one end of the branch circuit board 443 away from the main circuit board 441. A plurality of pads 45 may be disposed on the end of the main circuit board 441 away from the branch circuit board 442 and the branch circuit board 443.

In some embodiments, a core housing 41 may include a peripheral side wall 411 and a bottom end wall 412 connected to one end surface of the peripheral side wall 411 to form an accommodation space with an open end. As used herein, an earphone core 42 may be placed in the accommodation space through the open end. The first microphone 432*a* may be fixed on the bottom end wall 412. The second microphone 432*b* may be fixed on the peripheral side wall 411.

In some embodiments, the branch circuit board 442 and/or the branch circuit board 443 may be appropriately bent to suit a position of a sound inlet corresponding to the microphone 432 at the core housing 41. Specifically, the flexible circuit board 44 may be disposed in the core housing 41 in a manner that the main circuit board 441 is parallel to the bottom end wall 412. Therefore, the first microphone 432*a* may correspond to the bottom end wall 412 without bending the main circuit board 441. Since the second microphone 432*b* may be fixed to the peripheral side wall 411 of the core housing 41, it may be necessary to bend the second main circuit board 441. Specifically, the branch circuit board 443 may be bent at one end away from the main circuit board 441 so that a board surface of the branch circuit board 443 may be perpendicular to a board surface of the main circuit board 441 and the branch circuit board 442. Further, the second microphone 432*b* may be fixed at the peripheral side wall 411 of the core housing 41 in a direction facing away from the main circuit board 441 and the branch circuit board 442.

In some embodiments, the pad 45, a pad 46, the first microphone 432*a*, and the second microphone 432*b* may be disposed on the same side of the flexible circuit board 44. The pad 46 may be disposed adjacent to the second microphone 432*b*.

In some embodiments, the pad 46 may be specifically disposed at one end of the branch circuit board 443 away from the main circuit board 441, and have the same orientation as the second microphone 432*b* and disposed at intervals. Therefore, the pad 46 may be perpendicular to the orientation of the pad 45 as the branch circuit board 443 is bent. It should be noted that the board surface of the branch circuit board 443 may not be perpendicular to the board surface of the main circuit board 441 after the branch circuit board 443 is bent, which may be determined according to the arrangement between the peripheral side wall 411 and the bottom end wall 412.

In some embodiments, another side of the flexible circuit board 44 may be disposed with a rigid support plate 4*a* and a microphone rigid support plate 4*b* for supporting the pad 45. The microphone rigid support plate 4*b* may include a rigid support plate 4*b*1 for supporting the first microphone 432*a* and a rigid support plate 4*b*2 for supporting the pad 46 and the second microphone 432*b* together.

In some embodiments, the rigid support plate 4*a*, the rigid support plate 4*b*1, and the rigid support plate 4*b*2 may be mainly used to support the corresponding pads and the microphone 432, and thus may need to have strengths. The materials of the three may be the same or different. The specific material may be polyimide (PI), or other materials that may provide the strengths, such as polycarbonate, polyvinyl chloride, etc. In addition, the thicknesses of the three rigid support plates may be set according to the strengths of the rigid support plates and actual strengths required by the pad 45, the pad 46, the first microphone 432a, and the second microphone 432b, and be not specifically limited herein.

The first microphone 432a and the second microphone 432b may correspond to two microphone components 4c, respectively. In some embodiments, the structures of the two microphone components 4c may be the same. A sound inlet 413 may be disposed on the core housing 41. Further, the speaker may be further disposed with an annular blocking wall 414 integrally formed on the inner surface of the core housing 41 at the core housing 41, and disposed at the periphery of the sound inlet 413, thereby defining an accommodation space 415 connected to the sound inlet 413.

Referring to FIG. 2, FIG. 3, and FIG. 30, in some embodiments, the microphone component 4c may further include a waterproof membrane component 4c1.

As used herein, the waterproof membrane component 4c1 may be disposed inside the accommodation space 415 and cover the sound inlet 413. The microphone rigid support plate 4b may be disposed inside the accommodation space 415 and located at one side of the waterproof membrane component 4c1 away from the sound inlet 413. Therefore, the waterproof membrane component 4c1 may be pressed on the inner surface of the core housing 41. In some embodiments, the microphone rigid support plate 4b may be disposed with a sound inlet 4b3 corresponding to the sound inlet 413. In some embodiments, the microphone 432 may be disposed on one side of the microphone rigid support plate 4b away from the waterproof membrane component 4c1 and cover the sound inlet 4b3.

As used herein, the waterproof membrane component 4c1 may have functions of waterproofing and transmitting the sound, and closely attached to the inner surface of the core housing 41 to prevent a liquid outside the core housing 41 entering the core housing 41 via the sound inlet 413 and affect the performance of the microphone 432.

The axial directions of the sound inlet 4b3 and the sound inlet 413 may overlap, or intersect at an angle according to actual requirements of the microphone 432, etc.

The microphone rigid support plate 4b may be disposed between the waterproof membrane component 4c1 and the microphone 432. On the one hand, the waterproof membrane component 4c1 may be pressed so that the waterproof membrane component 4c1 may be closely attached to the inner surface of the core housing 41. On the other hand, the microphone rigid support plate 4b may have a strength, thereby playing the role of supporting the microphone 432.

In some embodiments, the material of the microphone rigid support plate 4b may be polyimide (PI), or other materials capable of providing the strength, such as polycarbonate, polyvinyl chloride, or the like. In addition, the thickness of the microphone rigid support plate 4b may be set according to the strength of the microphone rigid support plate 4b and the actual strength required by the microphone 432, and be not specifically limited herein.

Figure 31:
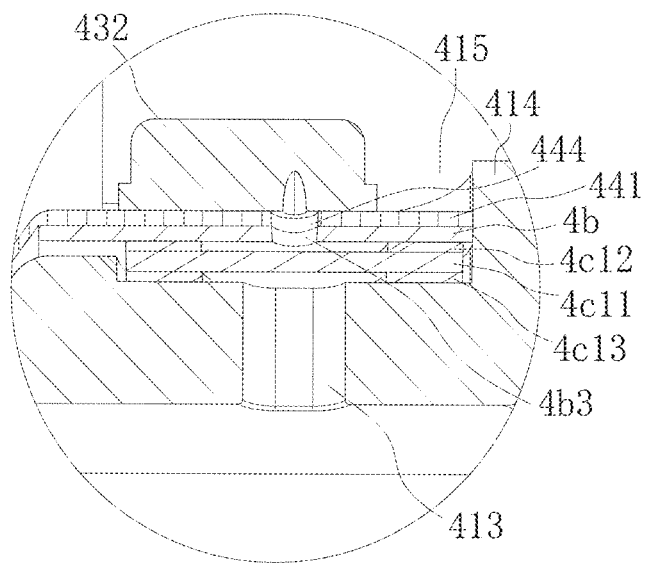
FIG. 31 is a partial enlarged view illustrating part C in FIG. 26 according to some embodiments of the present disclosure.

FIG. 31 is a partially enlarged view illustrating part C in FIG. 30 according to some embodiments of the present disclosure. As shown in FIG. 31, in some embodiments, the waterproof membrane component 4c1 may include a waterproof membrane body 4c11 and an annular rubber gasket 4c12. The annular rubber gasket 4c12 may be disposed at one side of the waterproof membrane body 4c11 towards the microphone rigid support plate 4b, and further disposed on the periphery of the sound inlet 413 and the sound inlet 4b3.

As used herein, the microphone rigid support plate 4b may be pressed against the annular rubber gasket 4c12.

Therefore, the waterproof membrane component 4c1 and the microphone rigid support plate 4b may be adhered and fixed together.

In some embodiments, the annular rubber gasket 4c12 may be arranged to form a sealed chamber communicating with the microphone 432 and only through the sound inlet 4b3 between the waterproof membrane body 4c11 and the rigid support plate. That is, there may be no gap in a connection between the waterproof membrane component 4c1 and the microphone rigid support plate 4b. Therefore, a space around the annular rubber gasket 4c12 between the waterproof membrane body 4c11 and the microphone rigid support plate 4b may be isolated from the sound inlet 4b3.

In some embodiments, the waterproof membrane body 4c11 may be a waterproof and sound-transmitting membrane and be equivalent to a human eardrum. When an external sound enters via the sound inlet 413, the waterproof membrane body 4c11 may vibrate, thereby changing an air pressure in the sealed chamber and generating a sound in the microphone 432.

Further, since the waterproof membrane body 4c11 may change the air pressure in the sealed chamber during the vibration, the air pressure may need to be controlled within an appropriate range. If it is too large or too small, it may affect the sound quality. In the embodiment, a distance between the waterproof membrane body 4c11 and the rigid support plate may be 0.1-0.2 mm, specifically 0.1 mm, 0.15 mm, 0.2 mm, etc. Therefore, the change of the air pressure in the sealed chamber during the vibration of the waterproof film body 4c11 may be within the appropriate range, thereby improving the sound quality.

In some embodiments, the waterproof membrane component 4c1 may further include an annular rubber gasket 4c13 disposed on the waterproof membrane body 4c11 towards the inner surface side of the core housing 41 and overlapping the annular rubber gasket 4c12.

In this way, the waterproof membrane component 4c1 may be closely attached to the inner surface of the core housing 41 at the periphery of the sound inlet 413, thereby reducing the loss of the sound entered via the sound inlet 413, and improving a conversion rate of converting the sound into the vibration of the waterproof membrane body 4c11.

In some embodiments, the annular rubber gasket 4c12 and the annular rubber gasket 4c13 may be a double-sided tape, a sealant, etc., respectively.

In some embodiments, the sealant may be further coated on the peripheries of the annular blocking wall 414 and the microphone 432 to further improve the sealing, thereby improving the conversion rate of the sound and the sound quality.

In some embodiments, the flexible circuit board 44 may be disposed between the rigid support plate and the microphone 432. A sound inlet 444 may be disposed at a position corresponding to the sound inlet 4b3 of the microphone rigid support plate 4b. Therefore, the vibration of the waterproof membrane body 4c11 generated by the external sound may pass through the sound inlet 444, thereby further affecting the microphone 432.

Referring to FIG. 3, in some embodiments, the flexible circuit board 44 may further extend away from the microphone 432, so as to be connected to other functional components or wires to implement corresponding functions. Correspondingly, the microphone rigid support plate 4b may also extend out a distance with the flexible circuit board in a direction away from the microphone 432.

Correspondingly, the annular blocking wall 414 may be disposed with a gap matching the shape of the flexible circuit board to allow the flexible circuit board to extend from the accommodation space 415. In addition, the gap may be further filled with the sealant to further improve the sealing.

It should be noted that the above description of the microphone waterproof is only a specific example, and should not be considered as the only feasible implementation. Obviously, for those skilled in the art, after understanding the basic principles of microphone waterproofing, it is possible to make various modifications and changes in the form and details of the specific method and step of implementing the microphone waterproof without departing from this principle, but these modifications and changes are still within the scope described above. For example, the count of the sound inlets 413 may be set as one or multiple. All such modifications are within the protection scope of the present disclosure.

Figure 32:
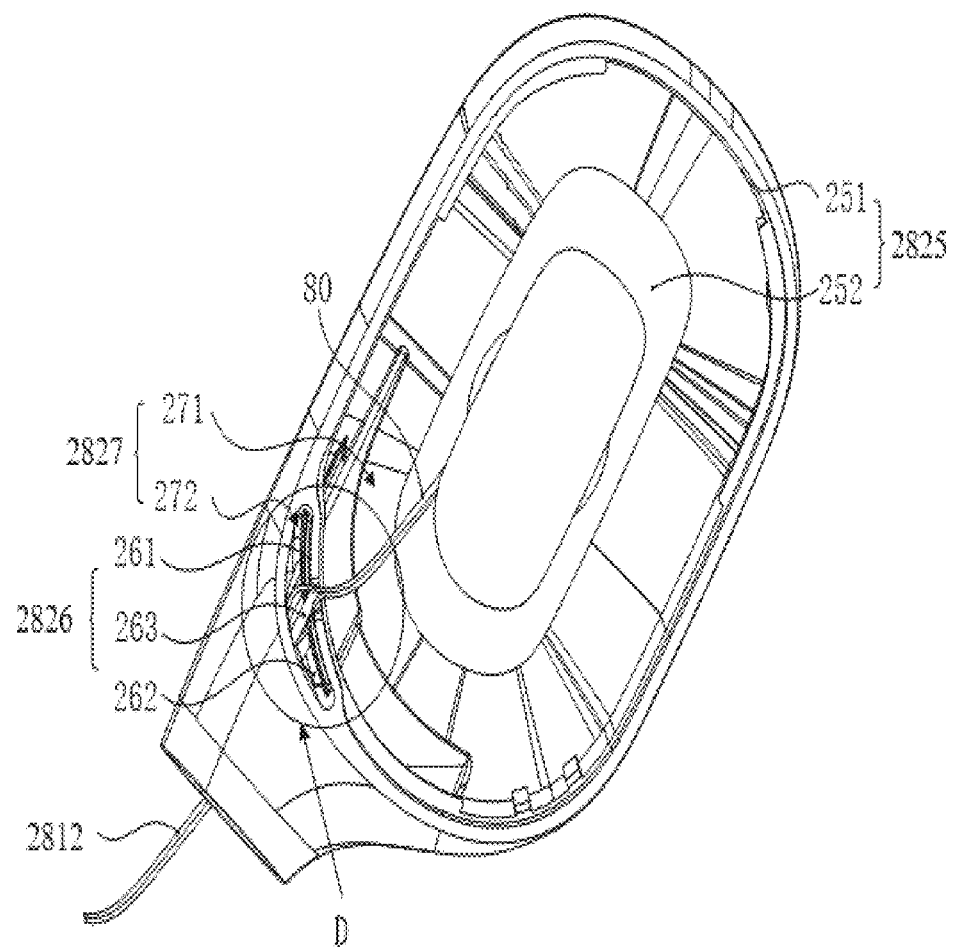
FIG. 32 is a partial structural diagram illustrating a core housing of a speaker of a pair of glasses according to some embodiments of the present disclosure.
Figure 33:
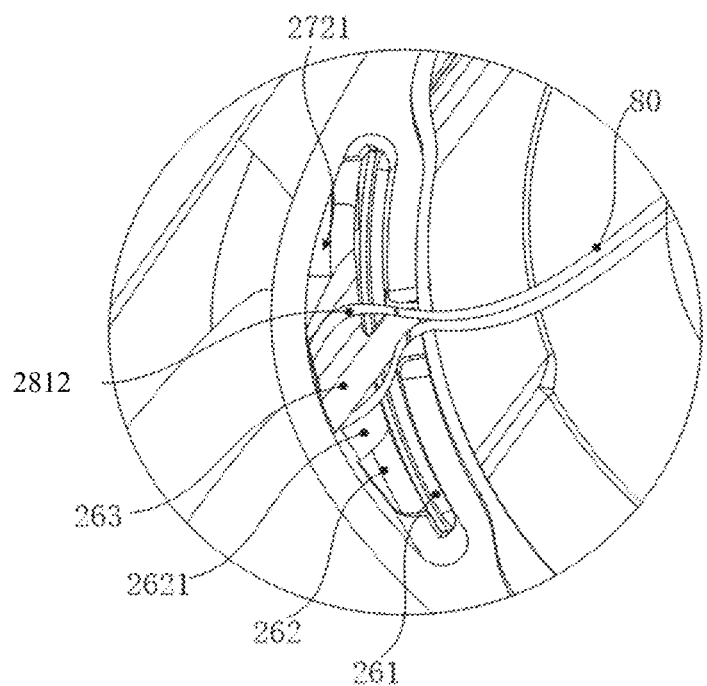
FIG. 33 is a partial enlarged view illustrating part D in FIG. 32 according to some embodiments of the present disclosure.
Figure 34:
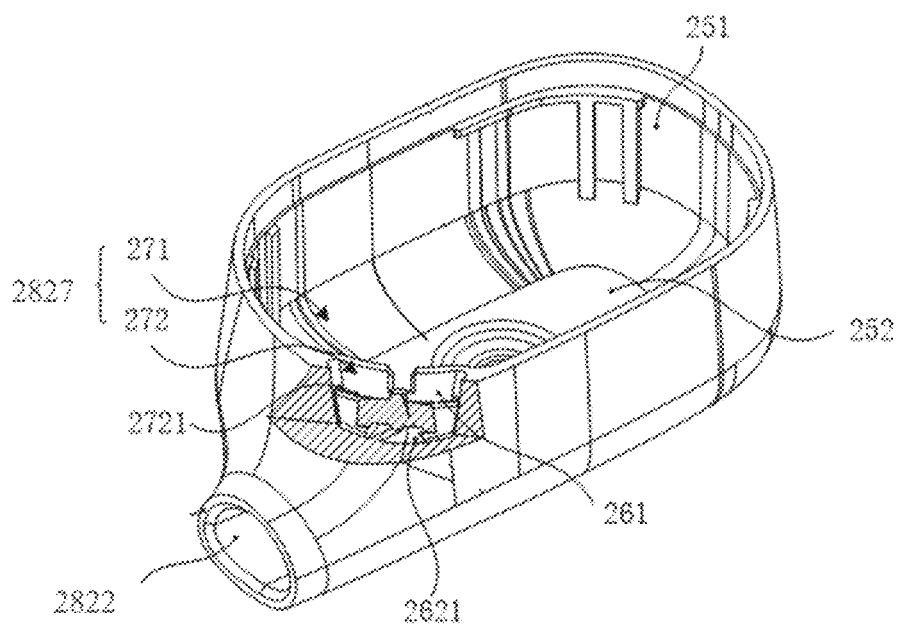
FIG. 34 is a partial sectional view illustrating a core housing of a speaker of a pair of glasses according to some embodiments of the present disclosure.

FIG. 32 is a partial structural diagram illustrating a core housing of the speaker according to some embodiments of the present disclosure. FIG. 33 is a partial enlarged view illustrating D part in FIG. 32 according to some embodiments of the present disclosure. FIG. 34 is a partial sectional view illustrating a core housing of the speaker according to some embodiments of the present disclosure.

Referring to FIG. 32, FIG. 33, and FIG. 34, the core housing may include a main housing 2825 (i.e., the core housing 108 in FIG. 1) and a baffle component 2826. As used herein, the baffle component 2826 may be located inside the main housing 2825 and connected to the main housing 2825, thereby dividing an inner space 2827 of the main housing 2825 into a first accommodation space 271 and a second accommodation space 272 near a connection hole 2822. In some embodiments, the main housing 2825 may include a peripheral side wall 251 and a bottom end wall 252 connected to one end surface of the peripheral side wall 251. The peripheral side wall 251 and the bottom end wall 252 may together form the inner space 2827 of the main housing 2825.

In some embodiments, the baffle component 2826 may be located at one side of the main housing 2825 near the connection hole 2822 and include a side baffle 261 and a bottom baffle 262. As used herein, the side baffle 261 may be disposed in a direction perpendicular to the bottom end wall 252. Both ends of the side baffle 261 may be connected to the peripheral side wall 251, so as to space the inner space 2827 of the main housing 2825. The bottom baffle 262 may be parallel to or close to the bottom end wall 252 at intervals, and further connected to the peripheral side wall 251 and the side baffle 261, respectively. Therefore, the inner space 2827 formed by the main housing 2825 may be divided into two to form the first accommodation space 271 and the second accommodation space 272. The first accommodation space 271 may be surrounded by the side baffle 261, the bottom baffle 262, the peripheral side wall 251 away from the connection hole 2822, and the bottom end wall 252. The second accommodation space 272 may be surrounded by the bottom baffle 262, the side baffle 261, and the peripheral side wall 251 near the connection hole 2822. As used herein, the second accommodation space 272 may be less than the first accommodation space 271. In some embodiments, the baffle component 2826 may also divide the inner space 2827 of the main housing 2825 by other setting manners, and be not specifically limited herein.

In some embodiments, the baffle component 2826 may further include an inner baffle 263. The inner baffle 263 may further divide the second accommodation space 272 into two sub-accommodation spaces 2721. Specifically, the inner baffle 263 may be disposed perpendicular to the bottom end wall 252 of the main housing 2825, respectively connected to the side baffle 261 and the peripheral side wall 251, and further extend to a wiring hole 2621. Thus, while the second accommodation space 272 may be divided into the two sub-accommodation spaces 2721, the wiring hole 2621 may be further divided into two, and the two wiring holes 2621 may be communicated with the corresponding sub-accommodation spaces 2721.

In some embodiments, the second accommodation space 272 may be further filled with the sealant. In this way, a lead wire 2812 and a lead wire 80 accommodated inside the second accommodation space 272 may be further fixed, so as to further reduce the adverse effect on the sound quality caused by the vibration of the lead wires and improve the sound quality of the speaker while protecting a welding point between the lead 2812 and the lead 80. In addition, the second accommodation space 272 may be sealed to implement the waterproof and dustproof purposes.

It should be noted that the above description of the speaker is only a specific example and should not be considered as the only feasible implementation solution. Obviously, for those skilled in the art, after understanding the basic principles of the speaker, it is possible to make various modifications and changes in the form and details of the specific method and step of implementing the speaker without departing from these principles, but these modifications and changes are still within the scope described above. For example, the second accommodation space 272 may also be larger than the first accommodation space 271. Alternatively, the second accommodation space 272 may be equal to the first accommodation space 271. All such modifications are within the protection scope of the present disclosure.

In some embodiments, the speaker described above may transmit the sound to the user through bone conduction and/or air conduction. When the air conduction is used to transmit the sound, the speaker may include one or more sound sources. The sound source may be located at a specific position of the user's head, for example, the top of the head, the forehead, a cheek, a temple, an auricle, the back of an auricle, etc., without blocking or covering an ear canal. For the purposes of description, FIG. 35 shows a schematic diagram of transmitting the sound through the air conduction according to some embodiments of the present disclosure.

Figure 35:
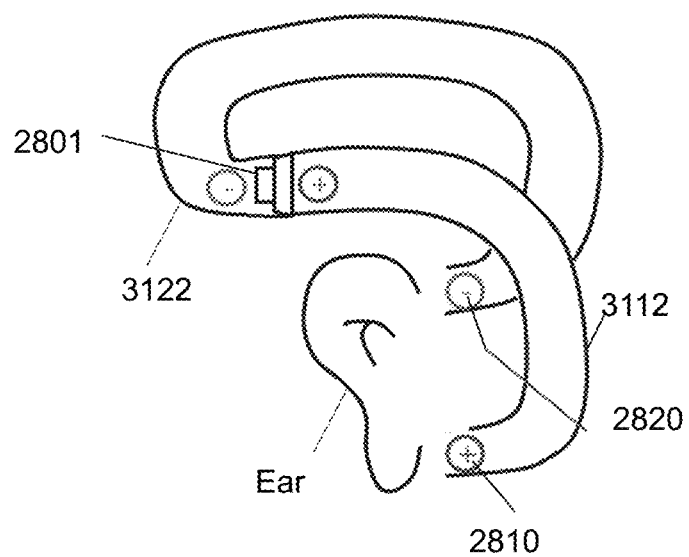
FIG. 35 is a schematic diagram of transmitting sound through air conduction according to some embodiments of the present disclosure.

As shown in FIG. 35, a sound source 2810 and a sound source 2820 may generate sound waves with opposite phases ("+" and "−" in the figure may indicate the opposite phases). For brevity, the sound sources mentioned herein may refer to sound output holes of the speaker that may output sounds. For example, the sound source 2810 and the sound source 2820 may be two sound output holes respectively located at specific positions of the speaker (e.g., the core housing 41 or the glasses temple 15).

In some embodiments, the sound source 2810 and the sound source 2820 may be generated by a same vibration device 2801. The vibration device 2801 may include a diaphragm (not shown in the figure). When the diaphragm is driven to vibrate by an electric signal, the front side of the diaphragm may drive the air to vibrate. The sound source 2810 may form at the sound output hole through a sound guiding channel 3112. The back of the diaphragm may drive air to vibrate, and the sound source 2820 may be formed at the sound output hole through a sound guiding channel 3122. The sound guiding channel may refer to a sound transmission route from the diaphragm to the corresponding sound output hole. In some embodiments, the sound guiding channel may be a route surrounded by a specific structure (e.g., the core housing 41, or the glasses temple 12) of a speaker. It should to be known that in some alternative embodiments, the sound source 2810 and the sound source 2820 may also be generated by different vibrating diaphragms of different vibration devices, respectively.

Among the sounds generated by the sound source 2810 and the sound source 2820, one portion may be transmitted to the ear of the user to form the sound heard by the user. Another portion may be transmitted to the environment to form a leaked sound. Considering that the sound source 2810 and the sound source 2820 are relatively close to the ears of the user, for convenience of description, the sound transmitted to the ears of the user may be referred to as a near-field sound. The leaked sound transmitted to the environment may be referred to as a far-field sound. In some embodiments, the near-field/far-field sounds of different frequencies generated by the speaker may be related to a distance between the sound source 2810 and the sound source 2820. Generally speaking, the near-field sound generated by the speaker may increase as the distance between the two sound sources increases, while the generated far-field sound (the leaked sound) may increase by increasing the frequency.

For the sounds of different frequencies, the distance between the sound source 2810 and the sound source 2820 may be designed, respectively, so that a low-frequency near-field sound (e.g., a sound with a frequency of less than 800 Hz) generated by the speaker may be as large as possible and a high-frequency far-field sound (e.g., a sound with a frequency greater than 2000 Hz) may be as small as possible. In order to implement the above purposes, the speaker may include two or more sets of dual sound sources. Each set of the dual sound sources may include two sound sources similar to the sound source 2810 and the sound source 2820, and generate sounds with specific frequencies, respectively. Specifically, a first set of the dual sound sources may be used to generate low frequency sounds. A second set of the dual sound sources may be used to generate high frequency sounds. In order to obtain more low-frequency near-field sounds, the distance between the two sound sources in the first set of the dual sound sources may be set to a larger value. Since the low-frequency signal has a longer wavelength, the larger distance between the two sound sources may not cause a large phase difference in the far-field, and not form excessive leaked sound in the far-field. In order to make the high-frequency far-field sound smaller, the distance between the two sound sources in the second set of the dual sound sources may be set to a smaller value. Since the high-frequency signal has a shorter wavelength, the smaller distance between the two sound sources may avoid the generation of the large phase difference in the far-field, and thus the generation of the excessive leaked sounds may be avoided. The distance between the second set of the dual sound sources may be less than the distance between the first set of the dual sound sources.

The beneficial effects of the present disclosure may include but be not limited to the following. (1) The glasses rim and glasses temple may be connected via the shaft assembly, thereby protecting the connection wire in the glasses, and extending the life of the connection wire. (2) The flexible circuit board may simplify the wiring manner in the speaker. (3) The second accommodation space may be filled with the sealant to fix the wires disposed therein, which may reduce the influence of the wire vibration on the sound quality, thereby improving the sound quality of the speaker device. In addition, the sealant filled in the second accommodation space may protect the welding point between the wires. The sealing of the second accommodation space may have the waterproof and dustproof functions. (4) The waterproof membrane module with waterproof and sound transmission function may be pressed and covered on the first sound inlet through the rigid support plate. The waterproof membrane module may be closely attached to the inner surface of the core housing to prevent liquid outside the core housing entering the inside of the core housing from the first sound inlet, thereby improving the waterproof performance of the microphone. (5) The effect of the microphone element to collect the sound of the main sound source may be improved. It should be noted that different embodiments may have different beneficial effects. In different embodiments, possible beneficial effects may be any one or a combination of the above, and may be any other beneficial effects.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

What is claimed is:

1. A pair of glasses, wherein the pair of glasses includes:
   a glasses rim;
   a glasses temple, the glasses temple accommodating a control circuit or a battery;
   a shaft assembly, the shaft assembly being configured to connect the glasses rim and the glasses temple, so that the glasses rim and the glasses temple are able to relatively rotate around the shaft assembly, and the shaft assembly being disposed with a shaft wiring channel along an axial direction;
   a connection wire, the connection wire passing through the shaft wiring channel and extending to the glasses rim and the glasses temple, respectively;
   a speaker, the speaker comprising an earphone core, the speaker being connected to the glasses temple, the control circuit or the battery in the glasses temple driving the earphone core to vibrate to generate a sound through the connection wire; and
   at least two microphones, the at least two microphones being disposed in the glasses temple or the speaker, the at least two microphones being located at positions with different distances from a mouth of a user, the at least two microphones include a first microphone element and a second microphone element, the first microphone element and the second microphone element are arranged wherein the first microphone element points towards the mouth of the user and the second microphone element points towards the first microphone element such that the mouth, the first microphone element, and the second microphone element are in line with one another.

2. The pair of glasses of claim 1, wherein
   the shaft assembly includes a first shaft;
   two ends of the first shaft are connected to the glasses rim and the glasses temple, respectively;
   the shaft wiring channel is disposed along an axial direction of the first shaft;

the shaft wiring channel communicates with the outside through a wiring port disposed on at least one end surface of the first shaft; and the connection wire extends to the glasses rim or the glasses temple through the wiring port.

3. The pair of glasses of claim 2, wherein the shaft wiring channel communicates with the outside through a first wiring port and a second wiring port, the first wiring port and the second wiring port being disposed on two end surfaces of the first shaft, respectively; and the connection wire extends to the glasses rim and the glasses temple through the first wiring port and the second wiring port, respectively.

4. The pair of glasses of claim 2, wherein the shaft wiring channel communicates with the outside through a first wiring port disposed on an end surface of the first shaft and a second wiring port disposed on a side wall of the first shaft; and the connection wire extends to the glasses rim and the glasses temple through the first wiring port and the second wiring port, respectively.

5. The pair of glasses of claim 1, wherein the speaker further comprises:

an auxiliary function module configured to receive an auxiliary signal and execute an auxiliary function;

a flexible circuit board configured to electrically connect to an audio signal wire and an auxiliary signal wire of the control circuit, and electrically connect the audio signal wire and the auxiliary signal wire with the earphone core and the auxiliary function module via the flexible circuit board, respectively; and a core housing configured to accommodate the earphone core, the auxiliary function module, and the flexible circuit board.

6. The pair of glasses of claim 5, wherein the flexible circuit board at least comprises a plurality of first pads and a plurality of second pads;

at least one of the first pads is electrically connected to the audio signal wire, the at least one first pad is electrically connected to at least one of the second pads via a first flexible lead on the flexible circuit board, and the at least one second pad is electrically connected to the earphone core via an external wire; and at least another one of the first pads is electrically connected to the auxiliary signal wire, and the at least another one of the first pads is electrically connected to the auxiliary function module via a second flexible lead on the flexible circuit board.

7. The pair of glasses of claim 6, wherein the flexible circuit board at least includes a main circuit board and a first branch circuit board;

the first branch circuit board is connected to the main circuit board, away from the main circuit board, and extends along one end of the main circuit board;

the auxiliary function module includes at least a first auxiliary function module and a second auxiliary function module;

the first auxiliary function module is disposed on the main circuit board; and the second auxiliary function module is disposed on the first branch circuit board.

8. The pair of glasses of claim 7, wherein the first pads are disposed on the main circuit board, and the at least one second pad is disposed on the first branch circuit board.

9. The pair of glasses of claim 7, wherein the flexible circuit board further includes a second branch circuit board, the second branch circuit board is connected to the main circuit board, away from the main circuit board, extends along the other end of the main circuit board, and is spaced apart from the first branch circuit board; and the auxiliary function module further includes a third auxiliary function module, and the third auxiliary function module is disposed on the second branch circuit board.

10. The pair of glasses of claim 6, wherein the earphone core includes:

a magnetic circuit component configured to provide a magnetic field;

a vibration component, the vibration component comprising a coil and an inner lead, wherein the coil is located in the magnetic field, the inner lead is electrically connected to the coil, the coil receives an audio current via the inner lead and converts the audio current into a mechanical vibration signal under an action of the magnetic field, one end of the external wire transmitting the audio current to the coil is electrically connected to a second pad, and the other end of the external wire is electrically connected to the inner lead.

11. The pair of glasses of claim 1, wherein the glasses temple further includes:

an accommodation body, the accommodation body includes a chamber having at least one opening;

a cover disposed on the opening to seal the chamber; wherein the cover includes a bracket and a cover layer integrally forming on a surface of the bracket by injection molding, the bracket is physically connected to the accommodation body, and the cover layer is used to seal the chamber after the bracket is connected to the accommodation body.

12. The pair of glasses of claim 11, wherein a shape of a side of the bracket towards the accommodation body matches the opening to cover the opening, and the cover layer covers an outer surface of the bracket away from the accommodation body.

13. The pair of glasses of claim 12, wherein the bracket includes an inserting portion and a covering portion, the covering portion is disposed on the opening, and the inserting portion is disposed on a side of the covering portion and extends into the chamber along an inner wall of the chamber to fix the covering portion on the opening.

14. The pair of glasses of claim 12, wherein the chamber of the accommodation body is disposed with a circuit component including a switch;

the bracket is configured with a switch hole corresponding to the switch and the cover layer covers the switch hole;

a pressing portion is disposed at a position corresponding to the switch hole and the pressing portion extends toward an inside of the chamber through the switch hole; and when the corresponding position of the cover layer is pressed, the pressing portion presses the switch of the circuit component, thereby triggering the circuit component to perform a preset function.

15. The pair of glasses of claim 11, wherein the chamber of the accommodation body includes a first circuit board and a second circuit board inclined to each other, the first microphone element is disposed on a side wall of the first circuit board facing the accommodation body, and the second microphone element is disposed on a side wall of the second circuit board facing the accommodation body, wherein a side wall of the accommodation body opposite to the first microphone element includes a first sound guiding hole, the first sound guiding hole being configured to guide sound to the first microphone element; and a side wall of the accommodation body opposite to the second microphone element includes a second sound guiding hole, the second sound guiding hole being configured to guide sound to the second microphone element.

16. The pair of glasses of claim 15, wherein the first circuit board faces the cover, and the first microphone element is disposed on a side of the first circuit board facing the cover.

17. The pair of glasses of claim 16, wherein the first sound guiding hole is disposed on the cover.

18. The pair of glasses of claim 17, wherein the first circuit board faces the cover in parallel or obliquely, and the first sound guiding hole is perpendicular or inclined to a surface of the cover.

19. The pair of glasses of claim 15, wherein the second circuit board faces the accommodation body, and the second microphone element is disposed on a side of the second circuit board facing the accommodation body.

20. The pair of glasses of claim 19, wherein the second sound guiding hole is disposed on a side wall of the accommodation body opposite to the cover or the first sound guiding hole.

\* \* \* \* \*